(12) United States Patent
Koyama et al.

(10) Patent No.: US 6,195,876 B1
(45) Date of Patent: Mar. 6, 2001

(54) ELECTRONIC COMPONENT PLACING APPARATUS

(75) Inventors: Kazushige Koyama; Kikuji Fukai; Kiyoshi Murase; Masaru Aoki; Taro Yasuda; Koji Saito, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/262,745

(22) Filed: Mar. 5, 1999

(30) Foreign Application Priority Data

Mar. 5, 1998 (JP) .............................................. H10-053865

(51) Int. Cl.[7] .................... B23P 19/00; B23B 1/00
(52) U.S. Cl. .................. 29/740; 29/809; 29/40; 29/33 J; 414/222.09
(58) Field of Search .............................. 29/740, 743, 759, 29/809, 40, 33 J; 414/222.09, 223.01

(56) References Cited

U.S. PATENT DOCUMENTS 5,516,251 * 5/1996 Ichikawa .............................. 414/331
5,649,356 * 7/1997 Gieskes .................................. 29/833
5,796,616 * 8/1998 Hamuro et al. ........................ 29/740

FOREIGN PATENT DOCUMENTS 5-304392    11/1993  (JP) .

* cited by examiner

Primary Examiner—Lee Young
Assistant Examiner—A. Dexter Tugbang
(74) Attorney, Agent, or Firm—Lowe Hauptman Gilman & Berner, LLP

(57) ABSTRACT

In an electronic component placing apparatus, four magazines are mounted on a head, and yet electronic components are housed in each magazine. In this apparatus, by an operation of selectively inserting a suction nozzle into four insertion openings in the magazines, it is possible to load a desired electronic component on a substrate, and this component loading can be repeatedly performed until the housed components are exhausted.

13 Claims, 36 Drawing Sheets

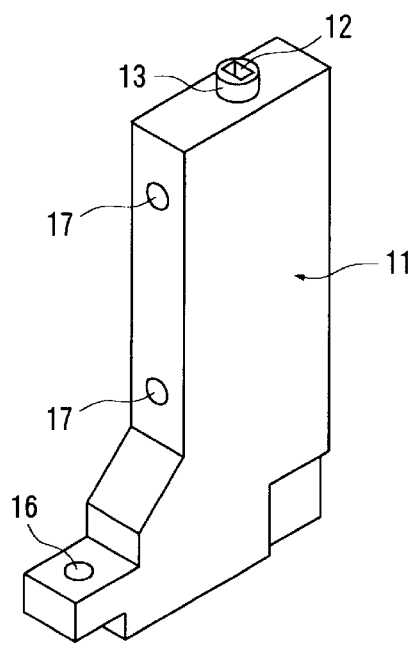
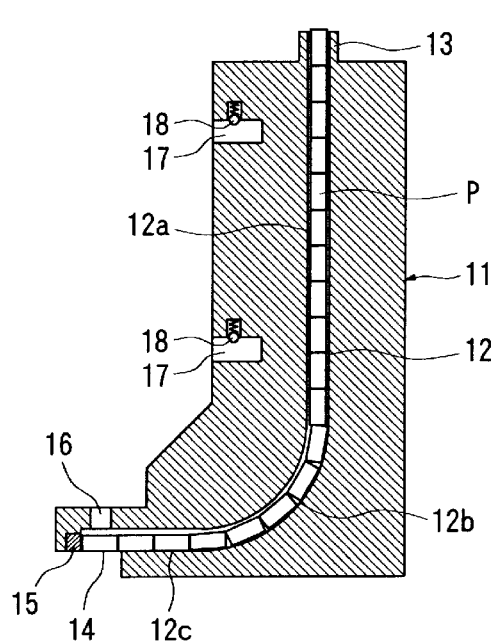
Fig. 3 (A)  Fig. 3 (B)
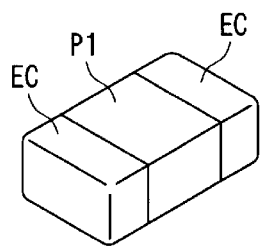
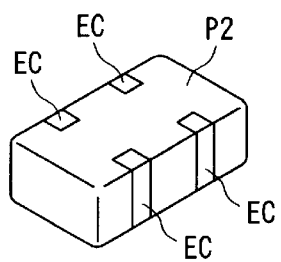
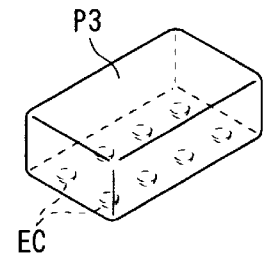
Fig. 4 (A)  Fig. 4 (B)  Fig. 4 (C)

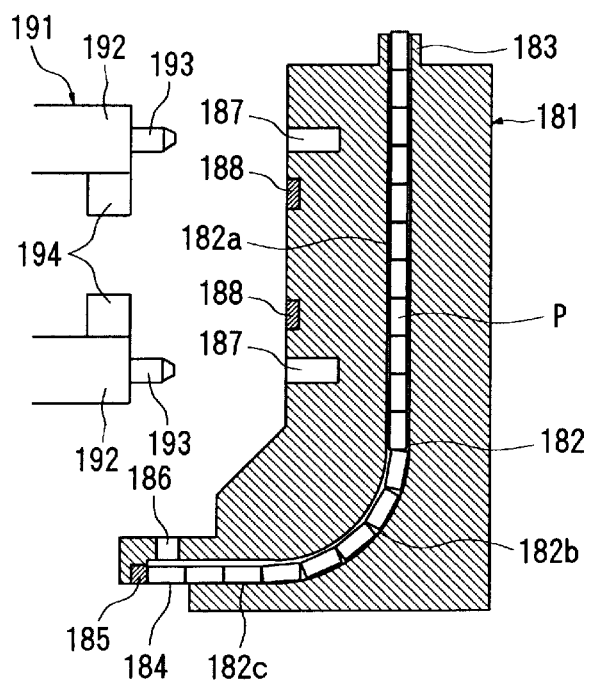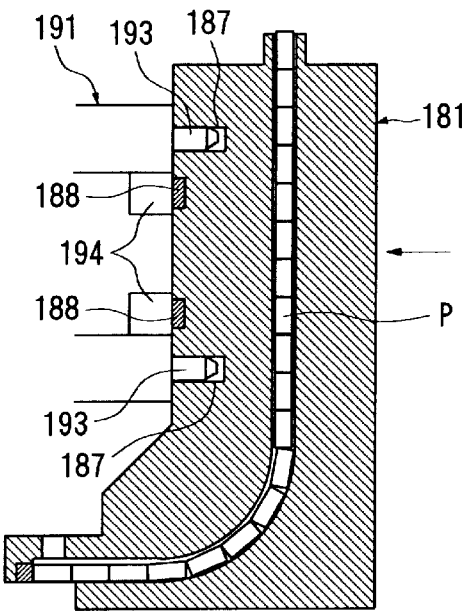
Fig. 20 (A)     Fig. 20 (B)

ELECTRONIC COMPONENT PLACING APPARATUS

BACKGROUND OF THE INVENTION

1. Field of the Invention

The present invention relates to an electronic component placing apparatus for placing electronic components on a target object such as a substrate or component packaging tape.

2. Description of the Related Art

In Japanese Patent Application Laid-Open No. Hei 5-304392, there is disclosed an apparatus for loading electronic components on a substrate. This apparatus comprises a component supplying unit constituted by arranging a plurality of component cassettes in a line, and an index table having a plurality of suction nozzles on the outer periphery.

When loading electronic components on a substrate on a XY table, the component supplying unit is first moved so that a predetermined component cassette comes at a component taking-out position. Next, the suction nozzle, which is at a component taking-out position on the index table, is lowered, and the electronic component is taken out by sucking the electronic component from the component cassette. Then, the index table is rotated in a predetermined direction to move the suction nozzle which sucks the electronic component to a component loading position. Then, the XY table is moved in order to move a component loading point of the substrate to the component loading position. Then, the suction nozzle, which is located at the component loading position, is lowered, and the electronic component sucked by the suction nozzle is loaded on the substrate.

In the foregoing apparatus, time required to load one electronic component on the substrate becomes a sum of time for moving the component supplying unit so that a predetermined component cassette comes at the component taking-out position, time for taking out the electronic component from this component cassette, time for moving the electronic component taken out to the component loading position, and time for loading the electronic component moved to the component loading position on the substrate. Also, since a plurality of electronic components are loaded on one substrate, time required for loading predetermined numbers and types of electronic components on the substrate becomes a number obtained by multiplying the foregoing sum of time by the number of the components loaded.

In recent years, along with the miniaturization of electronic components, the number of components loaded on one substrate tends to increase, and the productivity improvements by high-speed loading are desired. In the foregoing apparatus, however, there is a limit in the mechanism on shortening the respective time required for loading one electronic component on a substrate, and therefore, it is difficult to satisfactorily meet the foregoing request.

SUMMARY OF THE INVENTION

An object of the present invention is to provide an electronic component loading apparatus capable of executing an operation of placing electronic components on a target object such as a substrate at high speed.

In order to achieve this object, an electronic component placing apparatus according to the present invention comprises a magazine having a housing passage for housing a plurality of electronic components in a lined-up state so as to be able to move by its own weight, a discharge port for discharging a lead electronic component within the housing passage, and an insertion opening into which a discharging tool for discharging the lead electronic component is inserted; a head which the magazines are detachably mounted; and at least one discharging tool which can be inserted into the insertion opening of the magazine mounted on the head, and an actuator for moving the discharging tool; the discharging tool being selectively inserted into the insertion openings of the magazines mounted on the head to thereby push out the electronic component from the discharge port of the magazine for loading it on an object.

According to this apparatus of the present invention, by an operation of inserting the discharging tool into the insertion opening of the magazine, the electronic component can be pushed out from the magazine discharge port to place the electronic component pushed out on the target object. Since a plurality of magazines are mounted to the head, by the operation of selectively inserting the discharging tool into the magazine insertion openings, it is possible to place a desired electronic component on the object, and to repeatedly perform this component arranging until the housed components are exhausted. Thus, in the operation of placing electronic components on the object, for example, an operation of loading predetermined numbers and types of electronic components on a substrate and the like, the productivity can be remarkably improved by performing the operations at high speed.

The foregoing and other objects, features and advantages of the present invention will be apparent from the following description and the accompanying drawings.

BRIEF DESCRIPTION OF THE DRAWINGS

FIG. 3(A) is a perspective view showing a magazine according to the first embodiment, FIG. 3(B) is a longitudinal sectional view showing a magazine according to the first embodiment;

FIGS. 4(A) to 4(C) are perspective views for electronic components showing shapes and types of electronic components usable in the first embodiment;

FIG. 20(A) is a longitudinal sectional view showing a modification of the magazine and the head according to the first embodiment, FIG. 20(B) is an explanatory view for their operations;

DESCRIPTION OF THE PREFERRED EMBODIMENTS

Figure 1:
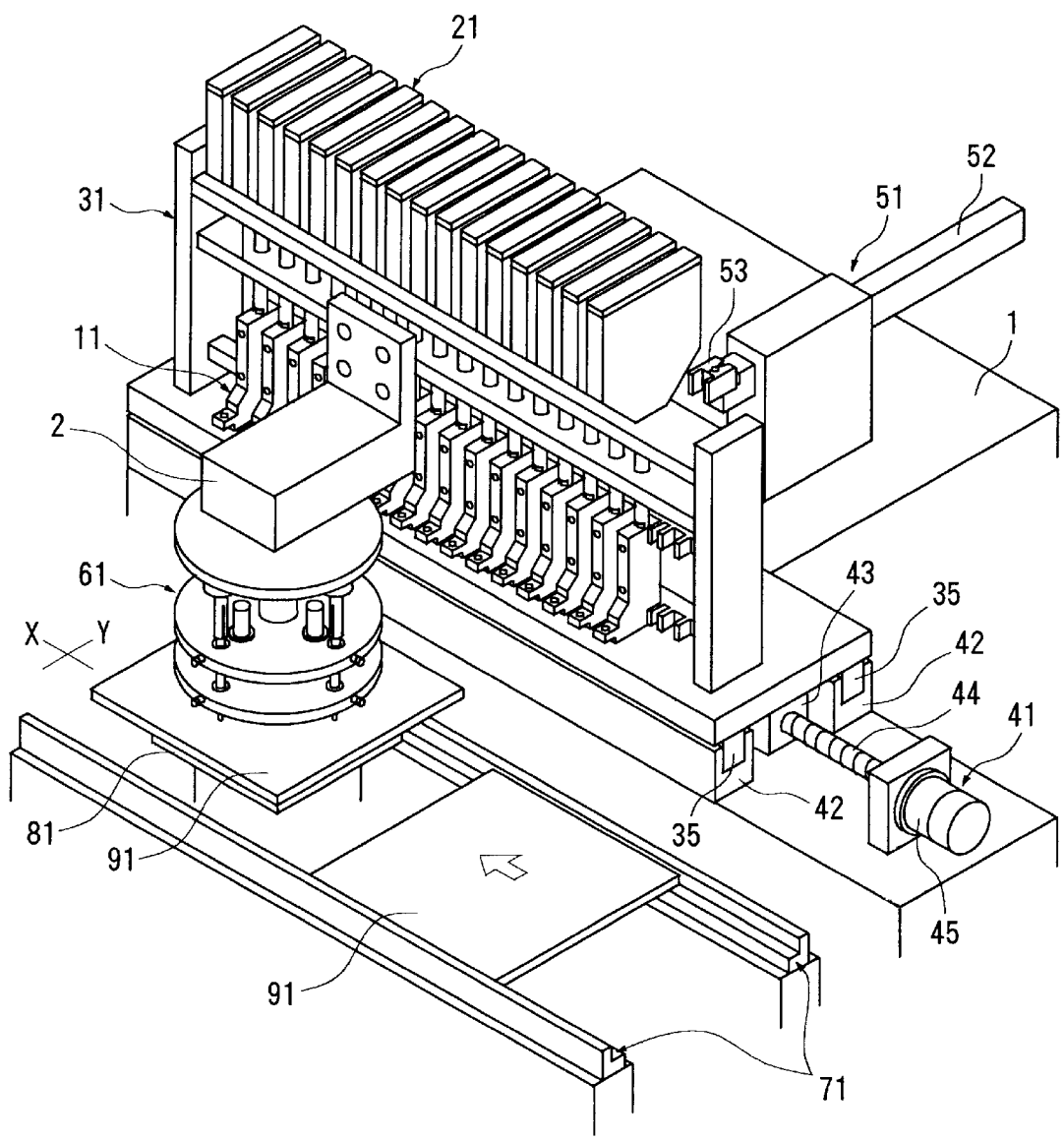
FIG. 1 is an overall perspective view showing a first embodiment according to the present invention.

FIGS. 1 to 14 show a first embodiment of an electronic component placing apparatus according to the present invention. In FIGS. 1 to 14, a reference numeral 1 denotes a base, 2 denotes a head supporting portion, 11 denotes a magazine, 21 denotes a storage unit, 31 denotes a rack, 41 denotes a rack moving mechanism, 51 denotes a magazine mounting mechanism, 61 denotes a head, 71 denotes conveying rails, 81 denotes a table, and 91 denotes a substrate.

The magazine 11 has, as shown in FIGS. 3(A) and 3(B), a housing passage 12 of a shape, in which a vertical passage 12a, a curved passage 12b and a horizontal passage 12c have been made continuous, therein. In this housing passage 12, a plurality of the same type of electronic components P having a shape of a square pillar are housed in a longitudinally lined-up state. The concrete types and shapes of these electronic components P will be described in detail later. The shape of the cross-section of the housing passage 12 is a rectangle slightly larger than the shape of the end face of the housed component P, and the housed component P is capable of moving downward longitudinally by its own weight in the housing passage 12. The top end of the housing passage 12 is opened on the top surface of the magazine 11, and at the opening, there is provided a cylindrical portion 13 which is detachably connected to a chute tube 26 to be described later. Also, on the undersurface of the housing passage 12 at the tip end portion (tip end portion of the horizontal passage 12c), there is formed a discharge port 14, through which the electronic component P at the head within the housing passage 12 can be discharged in a horizontally-oriented state. Further, on the front wall of the housing passage 12 at the tip end portion, a magnet 15 consisting of rare earth permanent magnet is embedded so that either N-pole or S-pole is in contact with the end face of the lead component P. In other words, the lead electronic component P within the housing passage 12 is attracted by this magnet 15, and is prevented from naturally falling from the discharge port 14. By the way, the lead component P can be sucked and held in the same manner even if vacuum port is provided in place of the magnet 15. Furthermore, on the top wall of the housing passage 12 at the tip end portion, an insertion opening 16, into which a suction nozzle 69 to be described later is inserted, is provided to face the center of the top face of the lead component P each other. On the front face of the magazine 11, there are provided two mounting holes 17 for mounting pins 65 to be described later at a spacing vertically, inside of each of which there is provided a spring-biased ball 18 which engages with a ring-shaped concave portion 65a of the mounting pin 65. By the way, the entire magazine 11 or the side portion of the housing passage is preferably formed by transparent or semi-transparent material so that the storage state of the electronic components P can be confirmed from the outside.

Figure 2:
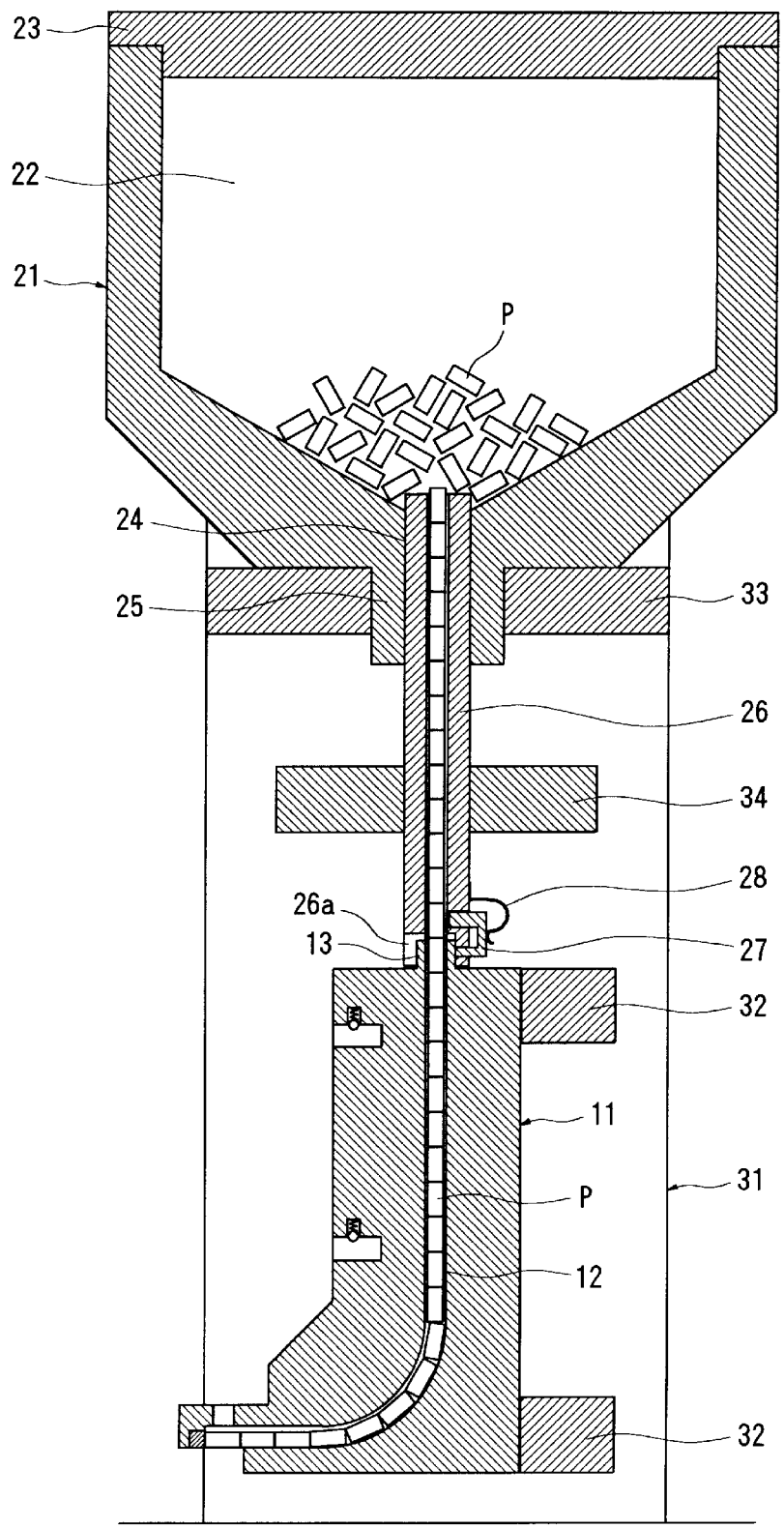
FIG. 2 is a longitudinal sectional view showing a magazine, a storage unit and a rack according to the first embodiment.

The storage unit 21 has a storage chamber 22 equipped with an inclined bottom within as shown in FIG. 2, and the top face aperture of the storage chamber 22 is covered with a lid 23 so that it can be freely opened or closed. In this storage chamber 22, there are stored a multiplicity of the same type of electronic components P having a shape of square pillar in a bulk state. The concrete types and shapes of these electronic components P will be described in detail later. Also, a through-hole 24 is formed in the lower portion of the storage unit 21, and at the undersurface aperture of the through-hole 24, there is provided a cylindrical portion 25 which is detachably fitted into a storage unit holder 33 to be described later. A chute tube 26 is inserted into the through-hole 24, and the top end of the chute tube 26 slightly protrudes upwardly from that of the through-hole 24, or substantially coincides with the top end of the through-hole 24. In order to smoothly take stored components P into the chute tube 26, the top end edge of the inside hole of the chute tube 26 is appropriately rounded or chamfered. The shape of the cross-section of the inside hole of the chute tube 26 is a rectangle slightly larger than the shape of the end face of the stored component P, and coincides with the shape of the cross-section of the housing passage 12 in the foregoing magazine 11. The stored components P within the storage chamber 22 are subjected to vibration or the like when the rack 31 laterally moves, and are taken one piece at a time longitudinally into the top end aperture of the chute tube 26 to move downward by its own weight. Also, the outside shape of the chute tube 26 is larger than that of the cylindrical portion 13 in the foregoing magazine 11, and at the lower end portion of the chute tube 26, there is formed a notch 26a to allow the cylindrical portion 13 to be inserted. Furthermore, at the lower end portion of the chute tube 26, a U-shaped stopper 27, which is retracted by the cylindrical portion 13 inserted into the notch 26a, is movably provided in an inwardly-biased state by a leaf spring 28. This stopper 27 plays a role to prevent the component from falling from the chute tube 26 in a state in which the cylindrical portion 13 of the magazine 11 has disengaged from the notch 26a of the chute tube 26. By the way, the entire storage unit 21 or the side portion of the storage chamber is preferably formed by transparent or semi-transparent material so that the storage state of the electronic components P can be confirmed from the outside.

The rack 31 is disposed on the base 1. As shown in FIGS. 1 and 2, on this rack 31, the following are provided at a spacing vertically: two upper and lower magazine holders 32 for detachably holding a plurality of magazines 11 in a sideways-arranged state; storage unit holders 33 for detachably holding a plurality of storage units 21 in a sideways-arranged state; and chute tube holders 34 for supporting the chute tube 26 inserted into each storage unit 33. Also, on the base of the rack 31, there are in parallel provided slide guides 35 such as rollers, which movably engage with guide rails 42 to be described later.

In the plurality of storage units 21 provided on top of the rack 31, there are stored different types of electronic components P having a shape of square pillar respectively. Of course, the same type of electronic components P may be stored in two or more storage units 21. The foregoing electronic components P have a shape of a square pillar with a predetermined width, thickness and length respectively as shown in FIGS. 4(A) to 4(C). The electronic component P1 shown in FIG. 4(A) is a chip component such as a resistor, a capacitor and an inductor, having external electrodes EC at the lengthwise both ends. The electronic component P2 shown in FIG. 4(B) is a composite component such as a LC filter and a network, having external electrodes EC at crosswise both ends. The electronic component P3 shown in FIG. 4(C) is an integrated circuit component such as a semiconductor element, having bump-shaped external electrodes EC on the lower surface. Since these electronic components P1 to P3 have all external electrodes EC or inner conductors, it is possible to attract by the magnet 15 of the foregoing magazine 11. Although the electronic components P1 to P3 shown in FIGS. 4(A) to 4(C) have all dimensional relation of length>width>thickness, it is possible to handle electronic components having dimensional relation of length>width=thickness, and to handle electronic components having a shape of circular column if the shapes of cross-sections of the housing passage 12 and the inside hole of the chute tube 26 are changed.

Figure 5:
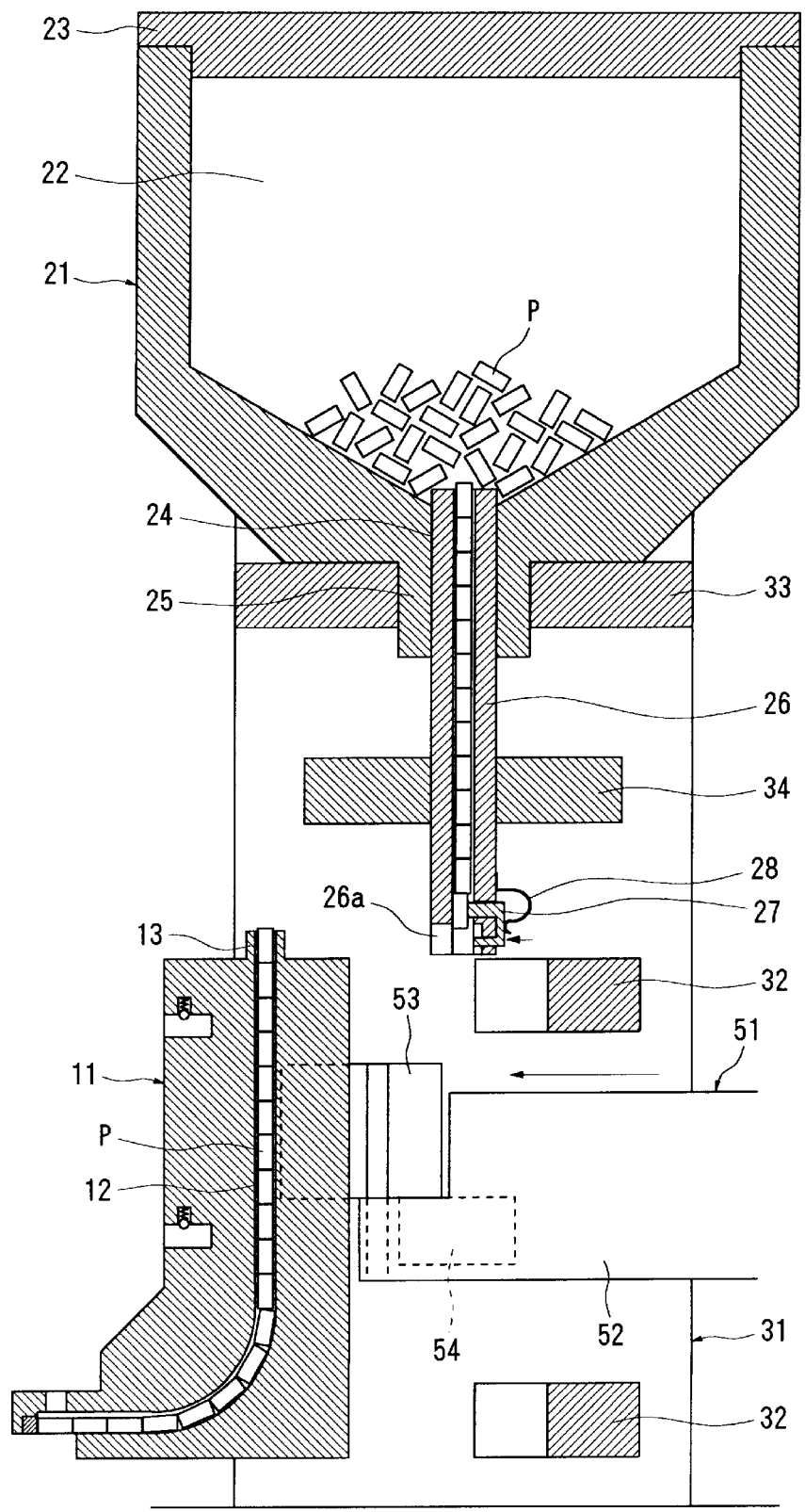
FIG. 5 is a side view showing an aspect in which a magazine is extracted from a rack in the first embodiment.

As can be seen from FIG. 1, the plurality of magazines 11 and the plurality of storage units 21 have an one-to-one correspondence therebetween, and electronic components P are replenished from the storage units 21 to the housing passage 12 in the magazine 11 in a state in which the magazine 11 is mounted to the rack 31. More specifically, in a state in which the cylindrical portion 13 of the magazine 11 has been inserted in the notch 26a of the chute tube 26 as shown in FIG. 2, electronic components P located in the inside hole of the chute tube 26 can be fed into the housing passage 12 because the inside hole of the chute tube 26 and the top end aperture of the housing passage 12 are continuous to each other. On the other hand, in a state in which the magazine 11 was extracted from the rack 31 and the cylindrical portion 13 has disengaged from the notch 26a of the chute tube 26 as shown in FIG. 5, the components are prevented from falling from the chute tube 26 by means of the stopper 27 which moves inwardly by the biasing force of the leaf spring 28. FIG. 1 shows the rack 31 which has 16 storage units 21 and to which the same number of magazines 11 can be mounted, but the numbers of the magazines 11 and the storage units 21 may exceed 17 pieces respectively and may be smaller than it.

A rack moving mechanism 41 is arranged under the foregoing rack 31 on the base 1. As shown in FIG. 1, this rack moving mechanism 41 is provided with two straight-line guide rails 42 with which the slide guides 35 of the foregoing rack 31 movably engage; a nut 43 fixed to the base of the foregoing rack 31; a ball thread 44 with which the nut 43 is threadably engaged; and a motor 45 for rotationally driving the ball thread 44 in a forward or reverse direction. In other words, the ball thread 44 is rotationally driven in a forward or reverse direction by the motor 45, whereby the foregoing rack 31 linearly moves along the guide rails 42 in the direction in which the magazines 11 are lined up.

Figure 6:
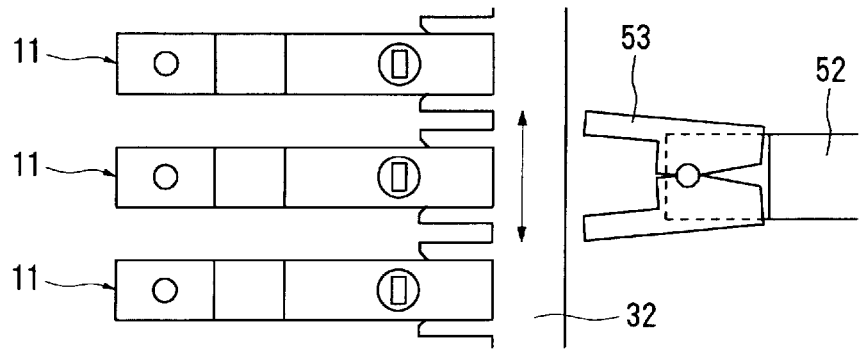
FIG. 6 is a plan view showing an aspect in which the magazine is extracted from the rack in the first embodiment.

The magazine mounting mechanism 51 is arranged behind the foregoing rack 31 on the base 1. As shown in FIGS. 1 and 6, this magazine mounting mechanism 51 is provided with a rod 52 capable of advancing and retracting by an actuator (not shown) such as a cylinder and a motor, and a chuck 53 provided at the tip end of the rod 52. The chuck 53 is of a two-pawl type, and is opened or closed by an actuator 54 such as a cylinder and a motor. As shown in FIG. 6, the shape of the chuck 53 is consistent with the back surface side of the magazine 11, and the back surface side portion of the magazine 11 can be grasped by a close operation.

Figure 9:
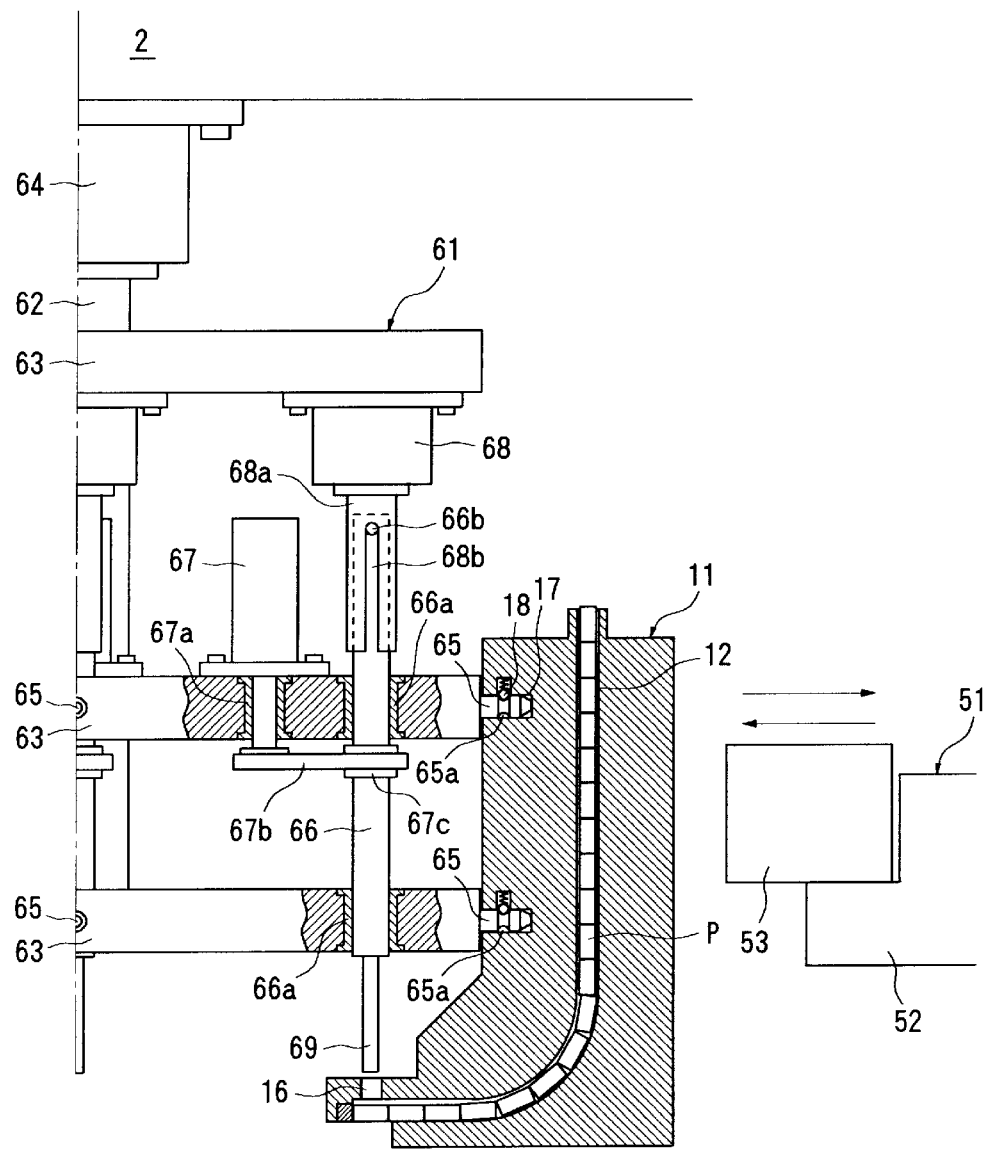
FIG. 9 is a side view showing an aspect in which the magazine is mounted to a head in the first embodiment.
Figure 10:
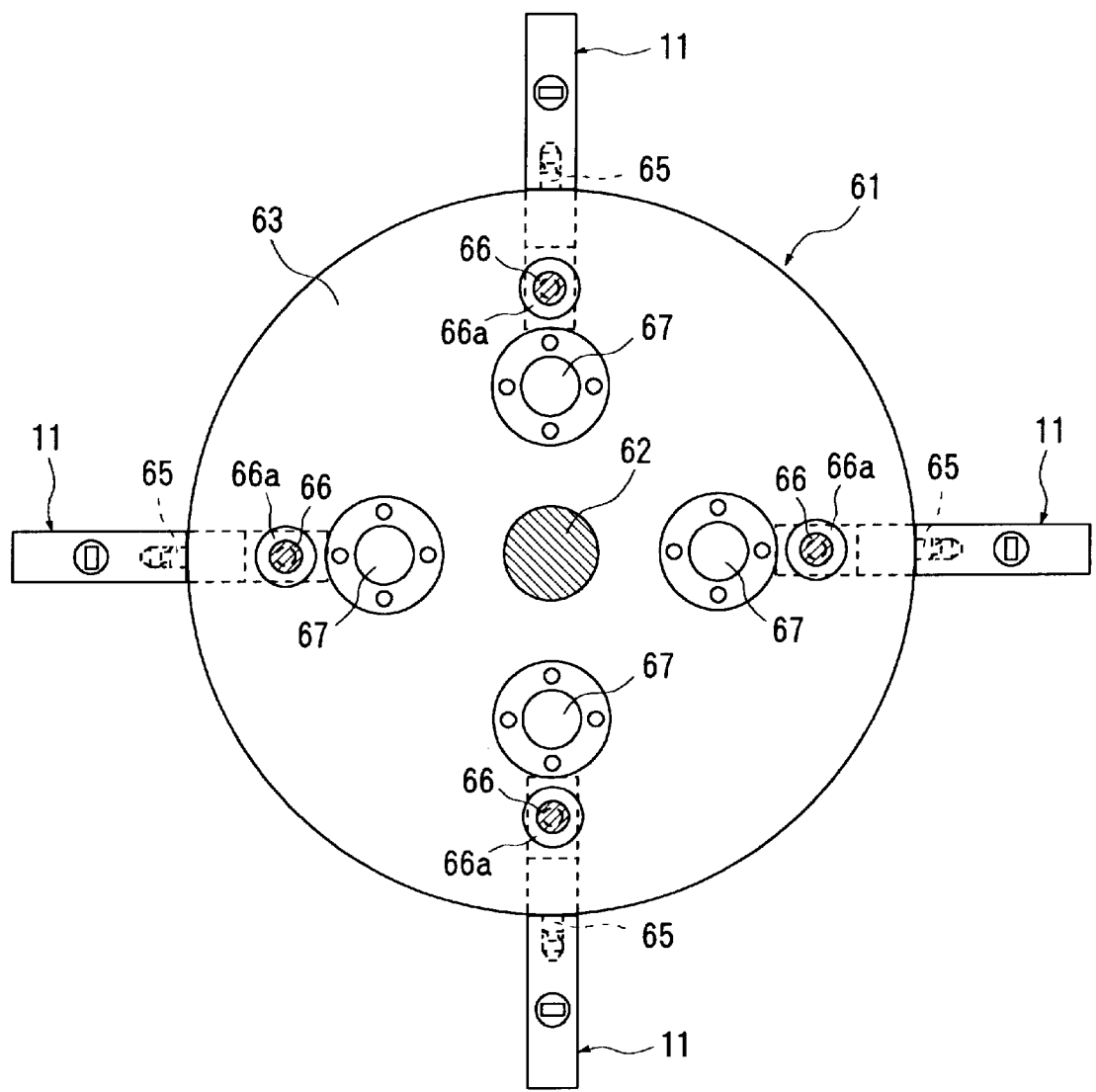
FIG. 10 is a plan view showing an aspect in which four magazines are mounted to the head in the first embodiment.

The head 61 is arranged on the head supporting portion 2. As shown in FIGS. 9 and 10, this head 61 comprises a shaft 62; three disks 63 fixed to the shaft 62 at a spacing vertically; a motor 64 fixed to the head supporting portion 2, for rotationally driving the shaft 62 in a forward or reverse direction; magazine mounting pins 65 provided at intervals of 90° on the peripheral surfaces of the central and lower disks 63; rods 66 vertically movably provided at intervals of 90° on the central and lower disks 63; cylinders 67 provided on the central disk 63, for linearly driving each rod 66 in an up-and-down direction; a motor 68 provided on the upper disk 63, for rotationally driving each rod 66 in a forward or reverse direction; and a suction nozzle 69 provided for the lower end of each rod 66. In this connection, the head supporting portion 2 for supporting the head 61 is fixed to a strut (not shown) vertically installed on the base 1.

Each mounting pin 65 has an acute shape, and has a ring-shaped concave portion 65a, with which a ball 18 provided for a mounting hole 17 in the magazine 11 engages. Also, in order to smoothly moves each rod 66 vertically, a bearing 66a such as bushing is interposed in an inserting portion in the central and lower disk 63. In addition, in order to smoothly moves a rod of the cylinder 67 vertically, a bearing 67a such as bushing is interposed in an inserting portion in the central disk 63. The rod of the cylinder 67 and the foregoing rod 66 are connected to each other through an arm 67b, and a connecting portion 67c incorporates such a bearing member (not shown) as not to hinder the rod 66 from rotating. Furthermore, the motor 68 and the rod 66 are connected to each other through a guide barrel 68a which guides the rod 66 to vertically move. This guide barrel 68a is formed with a longitudinal slit 68b, and a guide pin 66b of the rod 66 is vertically movably engaged with the slit 68b. Furthermore, piping (not shown) from an air circuit equipped with a vacuum pump and the like for applying negative pressure to the nozzle tip end is connected to the suction/exhaust port for the suction nozzle 69. Also, piping (not shown) from the similar air circuit is connected to the suction/exhaust port for the cylinder 67.

Figure 11:
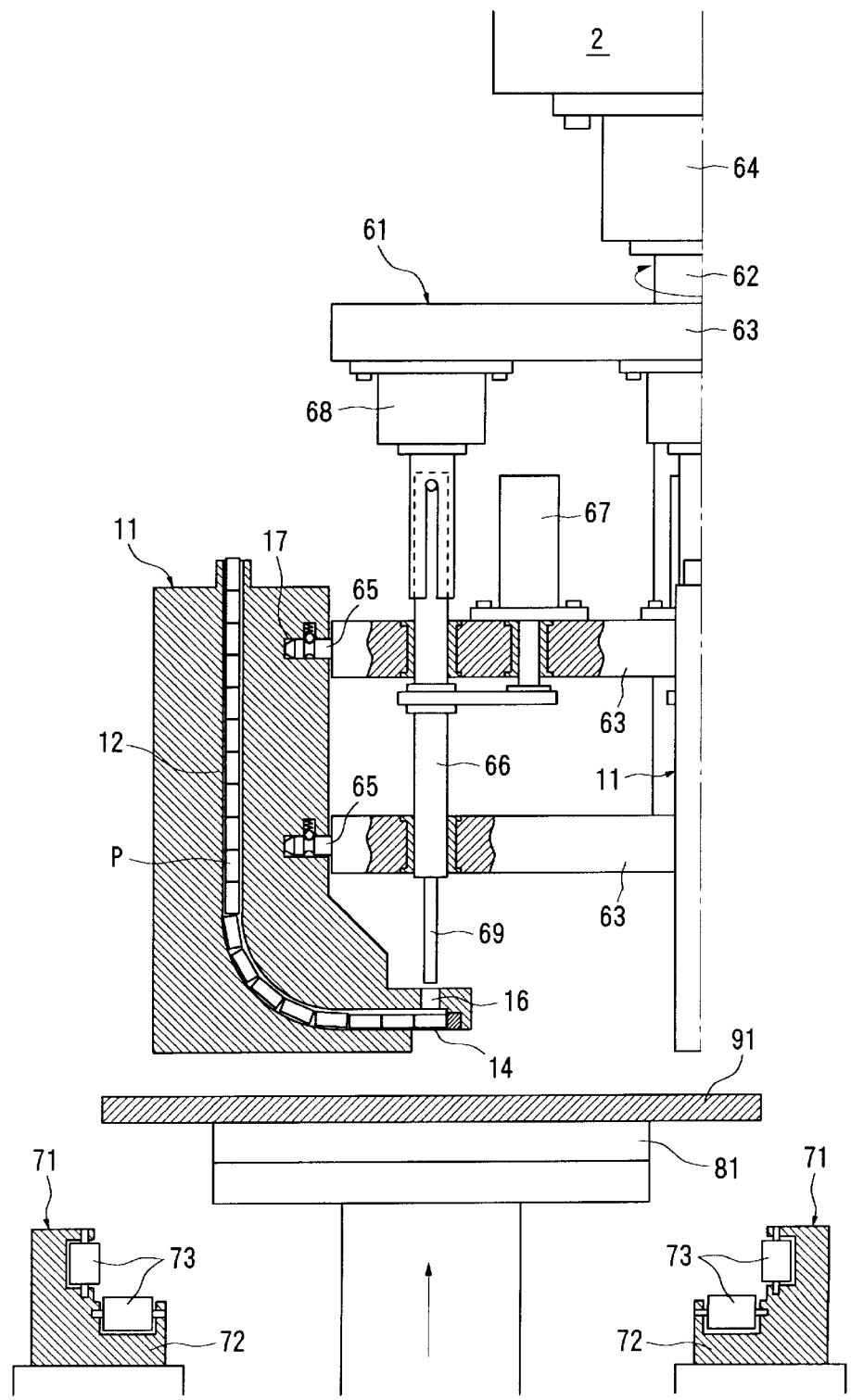
FIG. 11 is a side view showing an aspect in which an electronic component is loaded on a substrate in the first embodiment.

Conveying rails 71 are arranged at a position adjacent to the base 1. As shown in FIGS. 1 and 11, the conveying rails 71 are in parallel to the moving direction of the rack 31, and convey a substrate 91 on which to be loaded, in parallel to the direction in which the magazines are lined up. This conveying rail 71 comprises a L-shaped rail body 72, and a plurality of rollers 73 arranged at equal intervals in the direction of the length on the base and on the side of the inner side of the rail body 72. The plurality of rollers 73 provided along the rail body 72 can be rotated by a motor (not shown), and the substrate 91 placed on the rollers 73 is conveyed by this rotating force.

The table 81 is arranged in the vicinity of the foregoing head 61 between the foregoing conveying rails 71. As shown in FIGS. 1 and 11, this table 81 is capable of moving up and down and moving in the XY direction (See FIG. 1). On the top surface of the table 81, there are provided a multiplicity of vacuum ports (not shown) so that the substrate 91 can be held by applying negative pressure to the vacuum ports using a vacuum pump or the like.

The operation of the apparatus of the foregoing first embodiment will be described.

Figure 7:
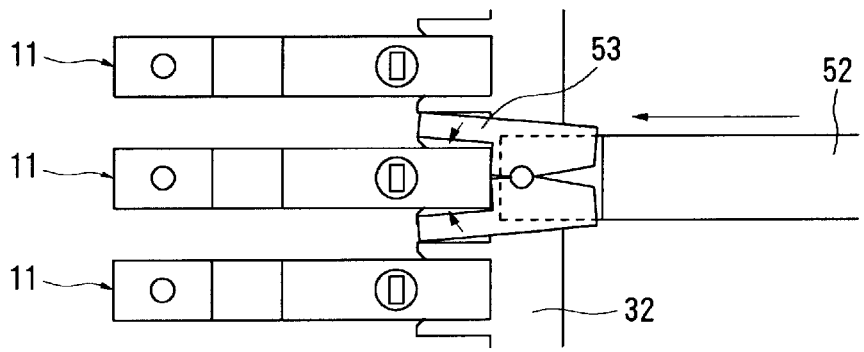
FIG. 7 is a plan view showing an aspect in which the magazine is extracted from the rack in the first embodiment.
Figure 8:
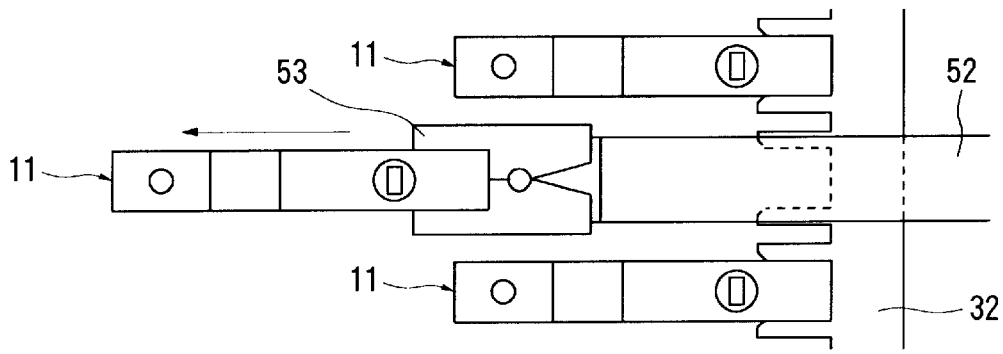
FIG. 8 is a plan view showing an aspect in which the magazine is extracted from the rack in the first embodiment.

In a state in which any magazine 11 is not mounted to the head 61, the rack 31 is first moved by the rack moving mechanism 41 as shown in FIG. 6 to allow a magazine 11 to be first mounted to accurately face the chuck 53 of the magazine mounting mechanism 51. Then, as shown in FIGS. 7 and 8, the rod 52 of the magazine mounting mechanism 51 is advanced toward the head 61, and when the chuck 53, which is in an open state, abuts upon the back surface of the magazine 11, the chuck 53 is closed to grasp the back surface side of the magazine 11. Further, the rod 52 is advanced to extract the magazine 11 from the magazine holder 32.

When the magazine 11 is extracted from the magazine holder 32, the cylindrical portion 13 of the magazine 11 disengages from the notch 26a of the chute tube 26 as shown in FIG. 5, whereby the stopper 27 moves inwardly by the urging force of the leaf spring 28, thus preventing the components from falling from the chute tube 26.

When the rod 52 of the magazine mounting mechanism 51 is further advanced, two mounting pins 65 of the head 61 are fitted into two mounting holes 17 in the magazine 11 at the same time as shown in FIG. 9. The mounting of the magazine 11 into the head 61 is completed when the spring-biased ball 18 engages with the ring-shaped concave portion 65a of the mounting pin 65. The center of the insertion opening 16 of the magazine 11 mounted to the head 61 coincides with that of the suction nozzle 69 of the head 61 corresponding to the magazine 11 as viewed from above. After the completion of the mounting, the chuck 53 of the magazine mounting mechanism 51 is opened to retract the rod 52, and the chuck 53 is caused to return to the initial position.

After the first magazine 11 is mounted, the head 61 is rotated 90° in a clockwise direction or in a counter-clockwise direction as viewed from above by the motor 64. At the same time, the rack 31 is moved by the rack moving mechanism 41 to allow a second magazine 11 to be mounted to accurately face the chuck 53 of the magazine mounting mechanism 51. Then, the rod 52 of the magazine mounting mechanism 51 is advanced to grasp the back surface side of the magazine 11 with the chuck 53. The rod 52 is further advanced to extract the magazine 11 from the magazine holder 32, and two mounting pins 65 of the head 61 are fitted into the two mounting holes 17 of the magazine 11 extracted for mounting. After the completion of the mounting, the chuck 53 of the magazine mounting mechanism 51 is opened to retract the rod 52, and the chuck 53 is caused to return to the initial position. By repeating the foregoing operation, the third and fourth magazines 11 will also be mounted to the head 61 in order (See FIG. 10).

In a process of mounting the magazine 11 to the head 61, the substrate 91 is conveyed to an operating position, where the component is loaded, by the conveying rails 71. When the substrate 91 is carried in the operating position, the table 81 moves up by a predetermined stroke, and the substrate 91 on the conveying rails 71 is lifted upwardly by the table 81 to leave the conveying rails 71 as shown in FIG. 11. The substrate 91, which moves up together with the table 81, is held to the table 81 by negative pressure acting on the vacuum ports.

In a state in which four magazines 11 are mounted to the head 61, four types of electronic components P at maximum can be selectively loaded on the substrate 91. Of course, if five or more magazines 11 are radially mounted on the head 61, a wide variety of electronic components P can be selectively loaded on the substrate 91 extending the range of component selections.

When loading the electronic components P on the substrate 91, the head 61 is rotated so that a magazine 11 housing the electronic components P to be loaded faces the substrate 91 as shown in FIG. 11. Subsequently, the table 81 is moved in the XY direction so that the discharge port 14 of this magazine 11 accurately faces a component loading point on the substrate 91.

Figure 12:
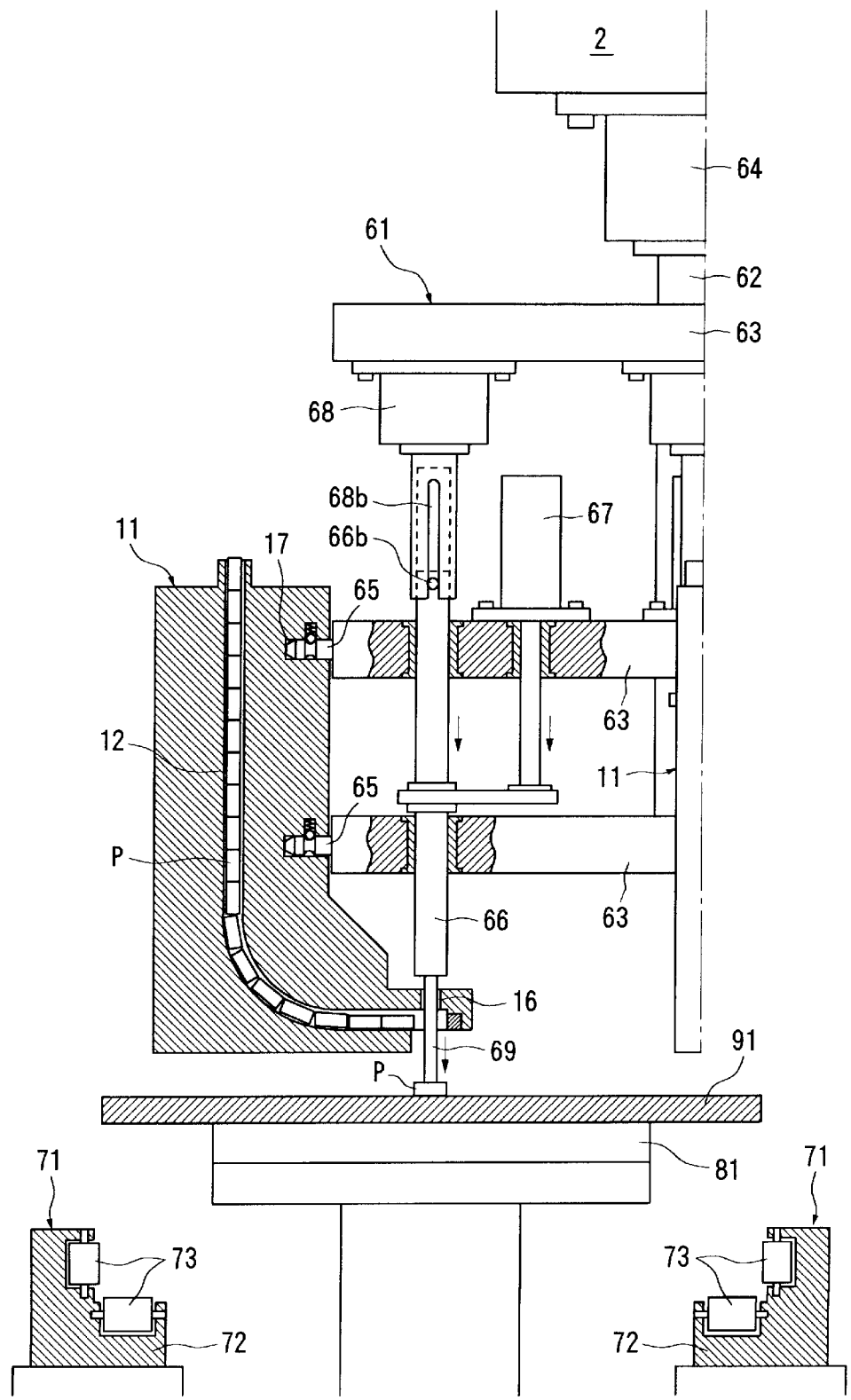
FIG. 12 is side view showing an aspect in which the electronic component is loaded on the substrate in the first embodiment.

As shown in FIG. 12, the rod 66 is caused to lower by the cylinder 67, and the suction nozzle 69 is inserted into the insertion opening 16 in the magazine 11 while negative pressure is being applied to the suction nozzle 69.

Thus, the lead electronic component P attracted and held by the magnet 15 is sucked by the suction nozzle 69, moves downward together with the suction nozzle 69 in such a sucked state against the magnetic force of the magnet 15, and one electronic component P is pushed out from the discharge port 14 in a horizontally oriented state. The electronic component P pushed out from the discharge port 14 of the magazine 11 further lowers together with the suction nozzle 69 still in the sucked state to the substrate 91.

Since the component loading point of the substrate 91, for example, the land and the like are coated with viscous cementing material such as cream solder in advance, the electronic component P, which has reached the substrate 91, adheres to the substrate 91 through this viscous cementing material. The spacing between the suction nozzle 69 and the insertion opening 14 in the magazine 11 and the spacing between the discharge port 14 of the magazine 11 and the substrate 91 can be set in advance and therefore, if the downstroke of the suction nozzle 69 is determined in advance on the basis of these spacings, there is no possibility that the electronic component P loaded on the substrate 91 is pressed against the substrate 91 by pressure more than necessary.

Figure 13:
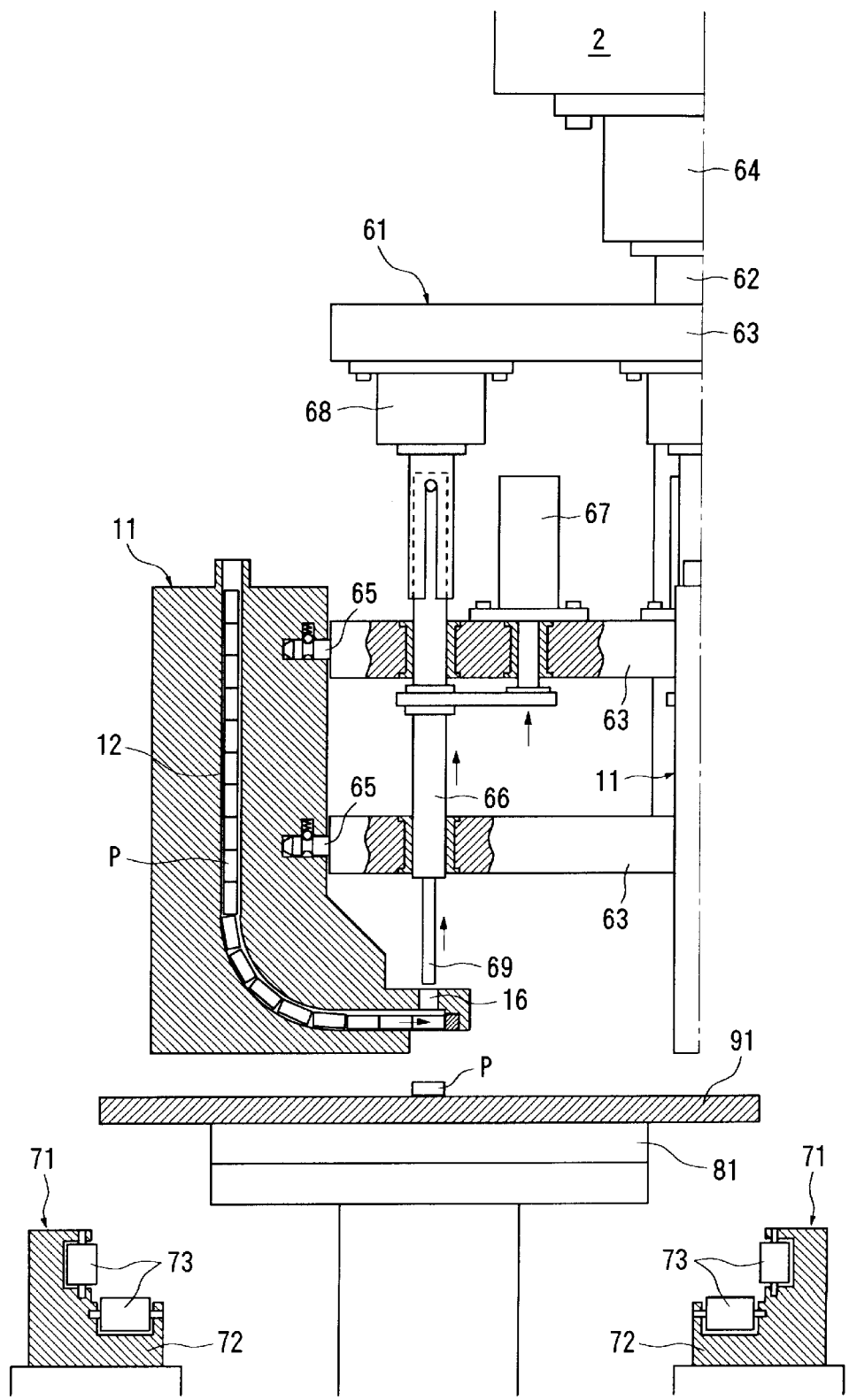
FIG. 13 is a side view showing an aspect in which the electronic component is loaded on the substrate in the first embodiment.

After the completion of the loading, as shown in FIG. 13, the negative pressure action of the suction nozzle 69 is released or is switched to a positive pressure action, and thereafter, the rod 66 is raised by the cylinder 67 to return the rod 66 and the suction nozzle 69 to the initial position. When the suction nozzle 69 is extracted from the insertion opening 16 in the magazine 11, the housed component P within the housing passage 12 moves downward by its own weight, and a next lead electronic component P is attracted and held by the magnet 15, and is in a standby state for being discharged again.

Figure 14:
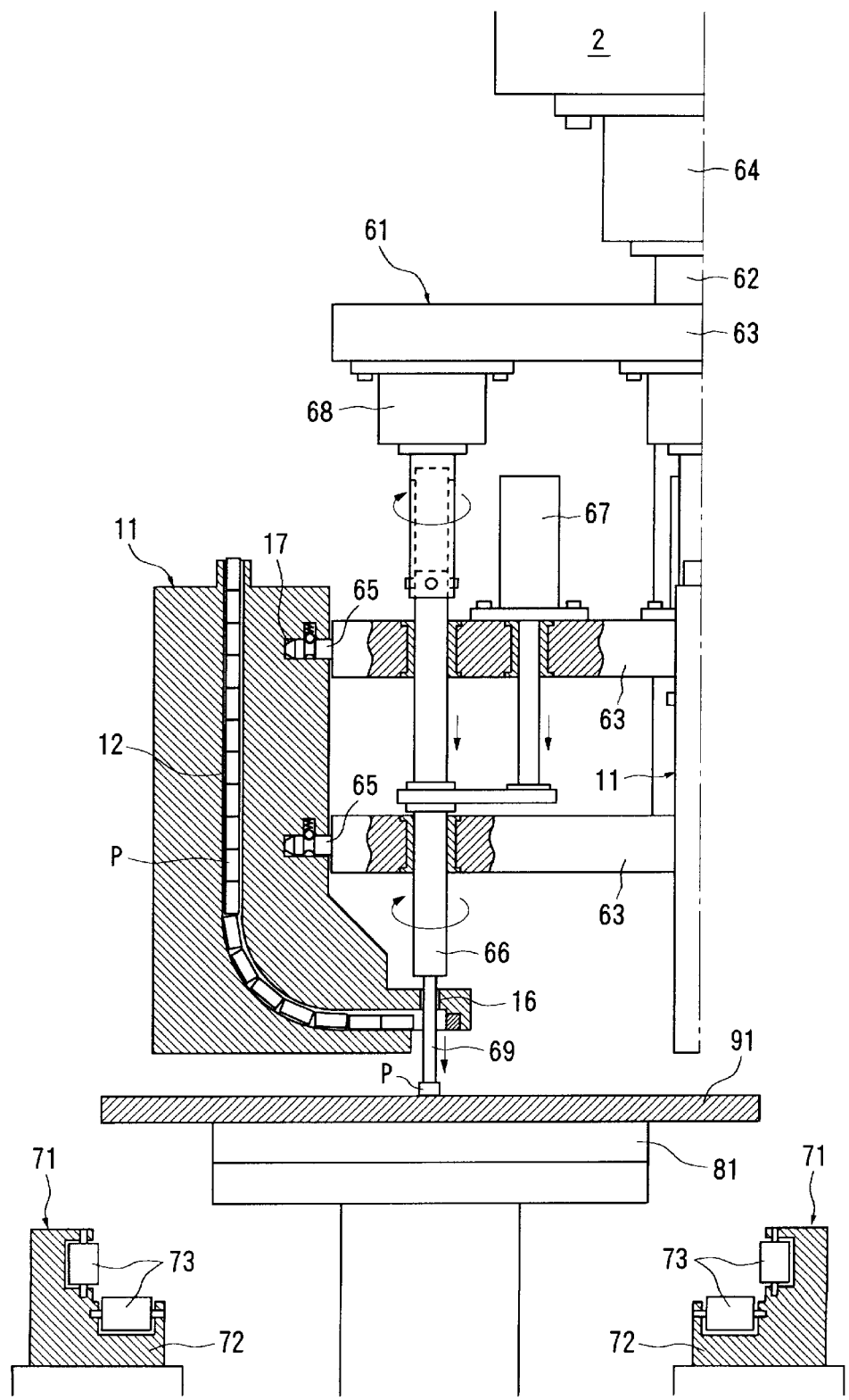
FIG. 14 is a side view showing an aspect in which the electronic component is loaded on the substrate in the first embodiment.

When it is necessary to change the orientation of the electronic component P in mounting it on the substrate 91, at a point of time whereat the electronic component P has been pushed out downward from the discharge port 14 of the magazine 11 by the suction nozzle 69 as shown in FIG. 14, the electronic component P can be mounted on the substrate 91 after the rod 66 and the suction nozzle 69 are rotated by a predetermined angle by the motor 68. FIG. 14 shows an aspect in which mounting is performed after the orientation of the electronic component P is changed 90°, and the rotating angle of the suction nozzle 69 is adjusted by the motor 68, whereby the mounting orientation of the electronic component P can be adjusted to any arbitrary angle other than 90°.

When mounting an electronic component P housed in another magazine 11 other than the foregoing one on the substrate 91 successively, the head 61 is rotated, as in the case of the foregoing, so that the magazine 11 housing the electronic component P to be loaded faces the substrate 91, and the table 81 is moved in the XY direction so that the discharge port 14 in the magazine 11 accurately faces the component loading point on the substrate 91. The rod 66 is caused to lower by the cylinder 67, and the suction nozzle 69 can be inserted into the insertion opening 16 in the magazine 11 while negative pressure is being applied to the suction nozzle 69 to push out the lead electronic component P from the discharge port 14.

A plurality of electronic components P are housed in the respective housing passages 12 for four magazines 11 mounted to the head 61, and therefore, the same magazine can be repeatedly used until the housed components P are exhausted to place the components on the substrate 91.

If such a need arises as to place an electronic component P, on the substrate 91, other than electronic components housed in four magazines 11 mounted to the head 61, the head 61 is rotated so that a magazine 11 to be replaced faces the rack 31, and at the same time, the rack 31 is moved by the rack moving mechanism 41 so that this magazine 11 accurately faces the holding position thereof. After the magazine 11 of the head 61 accurately faces the holding position of the rack 31 corresponding to this magazine 11, the rod 52 of the magazine mounting mechanism 51 is advanced, and when the chuck 53, which is in an open state, abuts upon the back surface of the magazine 11, the chuck 53 is closed to grasp the back surface side of the magazine 11.

Then, the rod 52 of the magazine mounting mechanism 51 is retracted to remove the magazine 11 to be replaced from the head 61, and the rod 52 is further retracted to insert the magazine 11 into the magazine holder 32 for holding. Thereafter, the chuck 53 of the magazine mounting mechanism 51 is opened to retract the rod 52, and the chuck 53 is caused to return to the initial position.

Next, the rack 31 is moved by the rack moving mechanism 41 to cause a new magazine 11 to be mounted to accurately face the chuck 53 of the magazine mounting mechanism 51, and the rod 52 of the magazine mounting mechanism 51 is advanced to grasp the back surface side of the magazine 11 with the chuck 53. The rod 52 is further advanced to extract the magazine 11 from the magazine holder 32, and two mounting pins 65 of the head 61 are fitted into the two mounting holes 17 in the magazine 11 thus extracted for mounting. This magazine replacement can be performed even during component mounting.

When predetermined numbers and types of electronic components P are loaded on the substrate 91 as described above, the table 81 lowers, the negative pressure action of the vacuum ports is released or is switched to a positive pressure action, the substrate 91 rides on the conveying rails 71, and the table 81 leaves the substrate 91. The substrate 91 with components loaded thereon is fed forward by the conveying rails 71, and the new substrate 91 is conveyed to the operating position, where the component is loaded, by the conveying rails 71. Thereafter, the same component loading as the foregoing is repeated.

As described above, according to the apparatus of the first embodiment, a plurality of magazines 11 are mounted to the head 61, and yet, a plurality of electronic components P are housed in each magazine 11. Therefore, by the operation of selectively inserting the suction nozzle 69 into insertion openings 16 of the magazines 11, it is possible to load a desired electronic component P on the substrate 91, and to repeatedly perform this component mounting until the housed components P are discharged.

It does not take much time to load one electronic component P on the substrate, and yet the magazine can be selected within a short time by the head rotation. Therefore, a period of time required to load a predetermined number and type of electronic components P on the substrate 91 can be greatly shortened, thus making it possible to improve the productivity by speeding up the operation.

In the drawings, the maximum number of the magazines 11 mountable to the head 61 is four, but a wide variety of electronic components P will be able to be selectively loaded on the substrate 91 if five or more magazines 11 are arranged so as to be able to be mounted to the head 61. In other words, even if a wide variety of electronic components P are loaded on the substrate 91, the components can be loaded on the substrate 91 at high speed using only the magazines 11 mounted to the head 61.

Furthermore, since the magazine 11 mounted to the head 61 can be arbitrarily replaced with another magazine 11 held by the rack 31, component loading on the substrate 91 can be exactly performed even if a wide variety of electronic components P are loaded on the substrate 91, and even if the type of the substrate 91 is changed.

Moreover, the foregoing magazine replacement can be performed during component loading, and yet it is not necessary to suspend the component loading in order to replace the magazine, and therefore, the operation efficiency is not deteriorated by the magazine replacement.

Moreover, since the motor 68 for rotating the suction nozzle 69 is provided for each suction nozzle 69, the orientation of the electronic component P to be loaded on the substrate 91 can be arbitrarily adjusted.

Moreover, since storage units 21 for replenishing electronic components P to each of the magazines 11 are provided on the rack 31, component replenishment to the magazine 11 can be easily performed at the timing at which the magazine 11 is returned to the rack 31, and the same magazine 11 can be repeatedly mounted for use without causing component shortages.

Moreover, since the suction nozzle 69 and cylinders 67 for vertically moving them are provided for the head 61 correspondingly to the number of the magazines mounted, the structure of the magazines 11 themselves can be simplified.

Moreover, since the substrate 91 carried in at the operating position by the conveying rails 71 is supported by the table 81 and the electronic components P are arranged to be placed on this substrate 91, component loading on each substrate 91 can be performed in order in a process of continuously conveying a plurality of substrates 91 by the conveying rails 71.

Moreover, since a table movable in the XY direction is used as a table 81 for supporting the substrate 91, the component loading position can be appropriately aligned by moving the table 81 in the two-dimensional direction.

FIGS. 15 to 20 show partial modifications of the apparatus according to the first embodiment.

Figure 15:
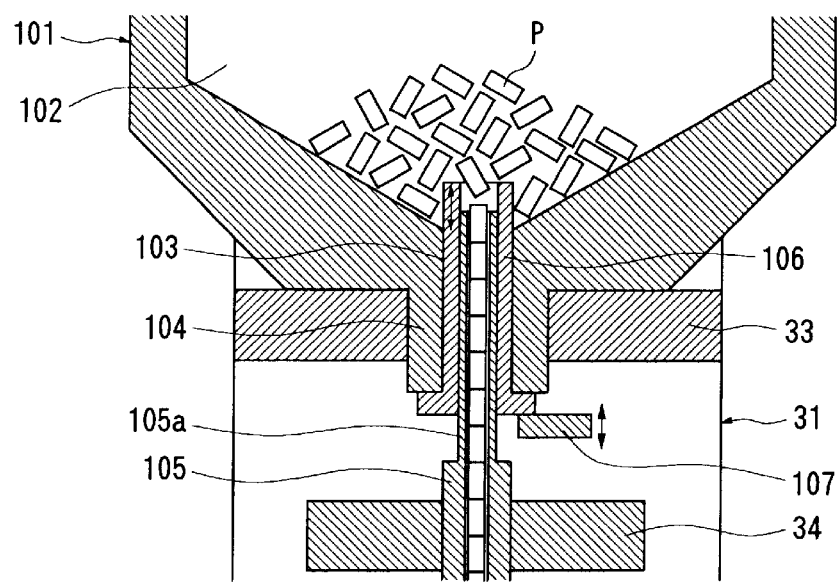
FIG. 15 is a longitudinal sectional view showing a modification of a storage unit according to the first embodiment.
Figure 16:
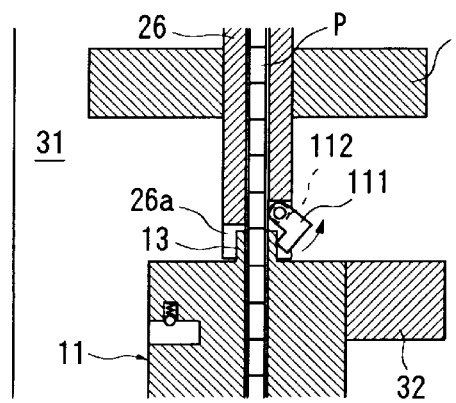
FIG. 16(A) is a longitudinal sectional view showing a modification of a stopper according to the first embodiment.
FIG. 16(B) is an explanatory view for this operation.
Figure 16:
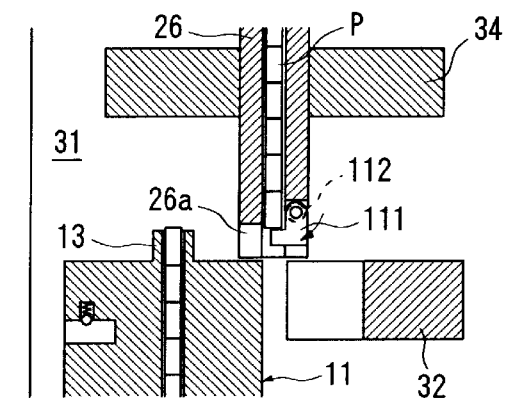
Figure 17:
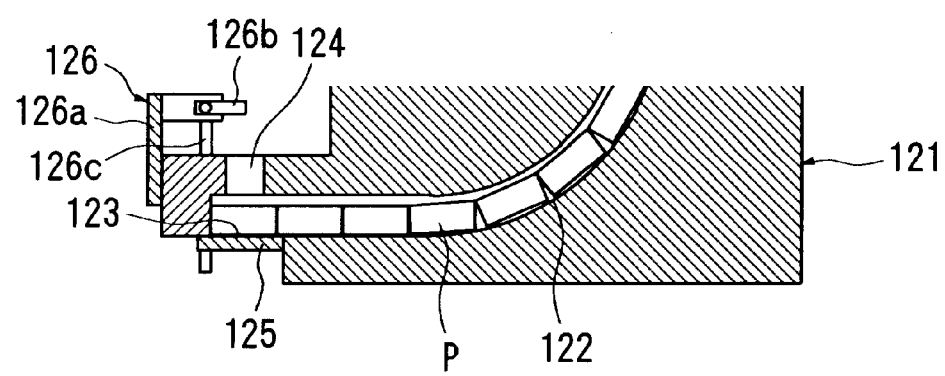
FIG. 17(A) is a longitudinal sectional view showing a modification of a magazine according to the first embodiment.
FIG. 17(B) is an explanatory view for this operation.
Figure 17:
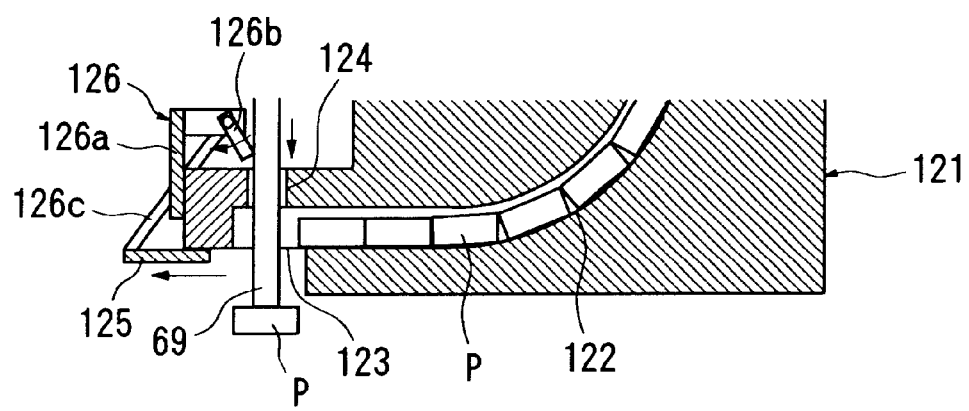
Figure 18:
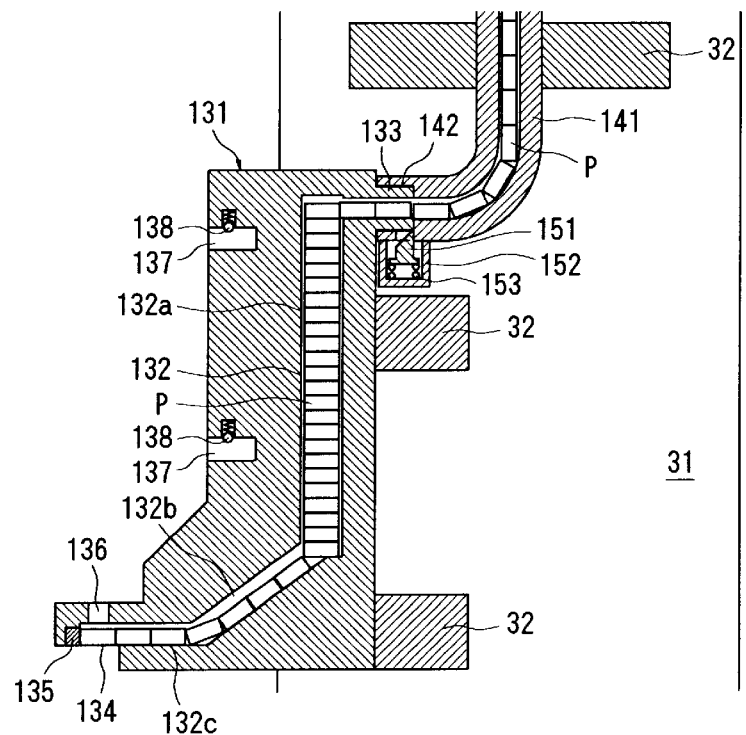
FIG. 18(A) is a longitudinal sectional view showing a modification of a magazine, a chute tube and a stopper according to the first embodiment.
FIG. 18(B) is an explanatory view for their operations.
Figure 18:
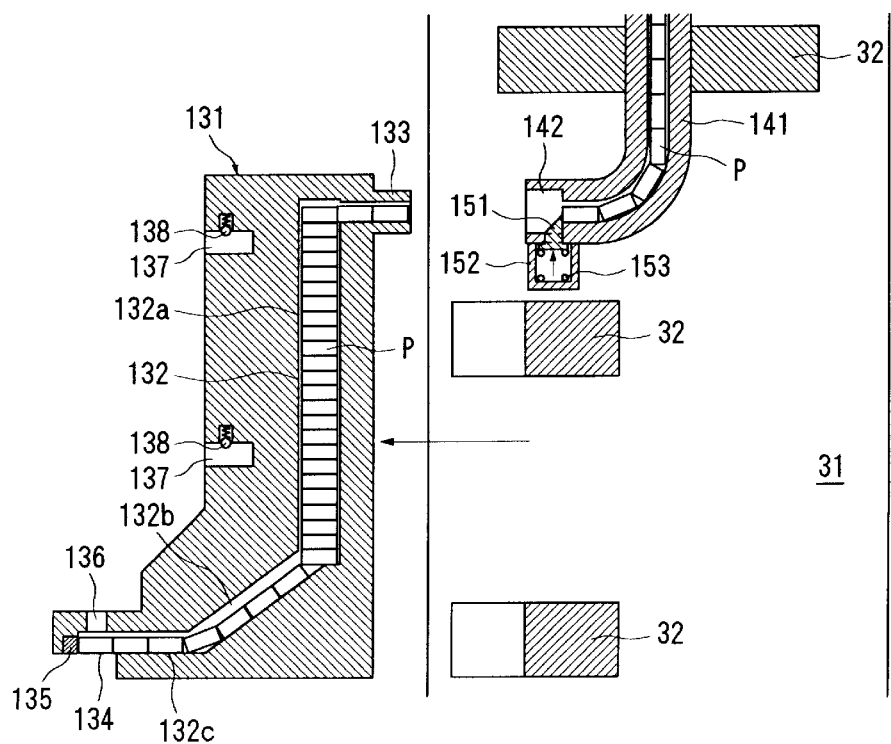
Figure 19:
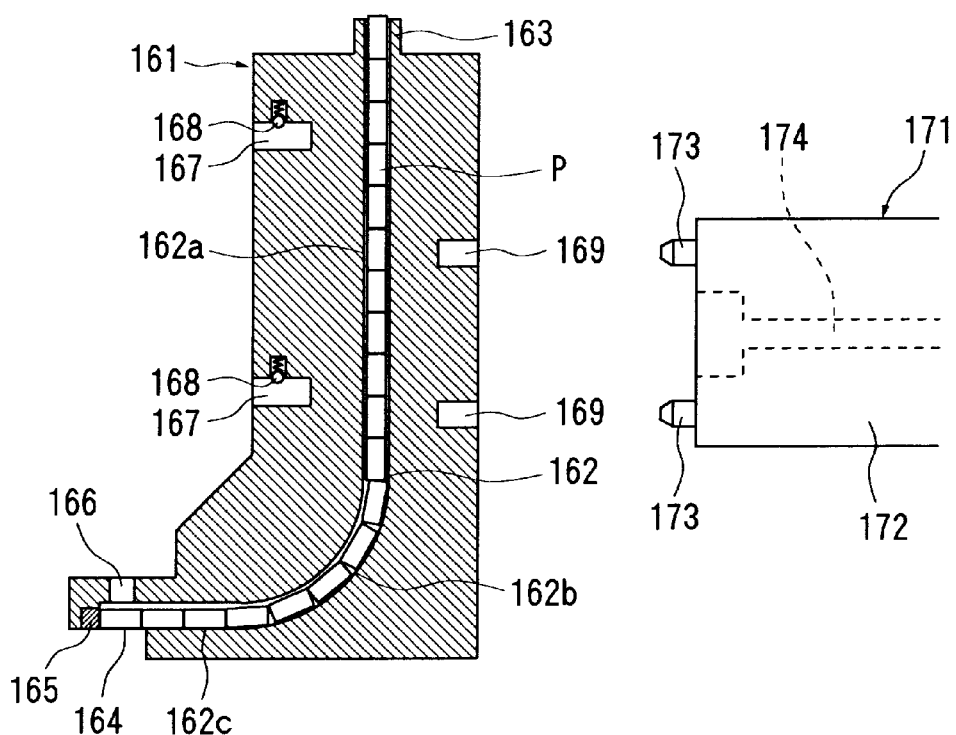
FIG. 19(A) is a longitudinal sectional view showing a modification of the magazine, and a magazine mounting mechanism according to the first embodiment.
FIG. 19(B) is an explanatory view for their operations.
Figure 19:
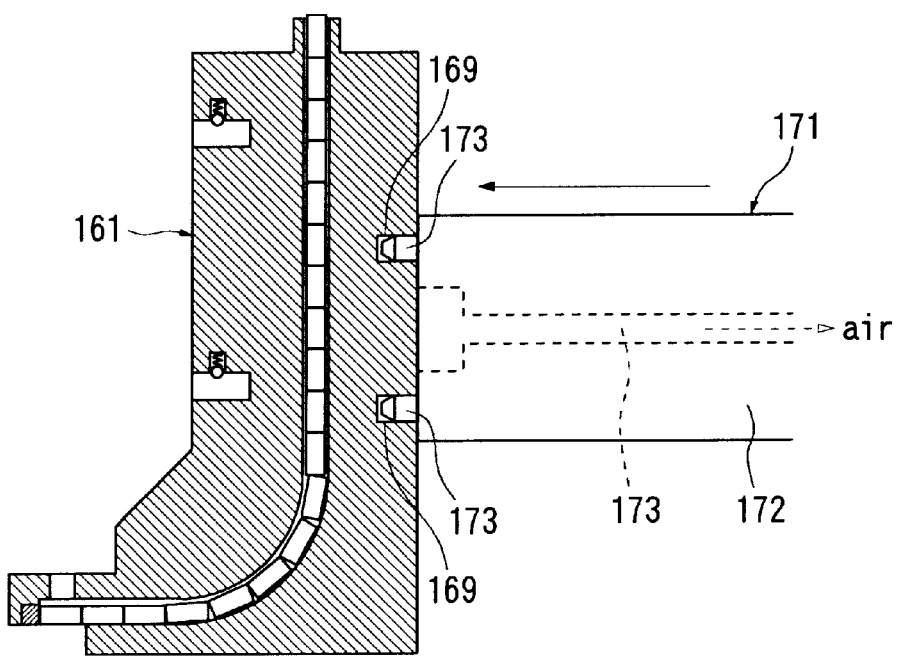
Figure 21:
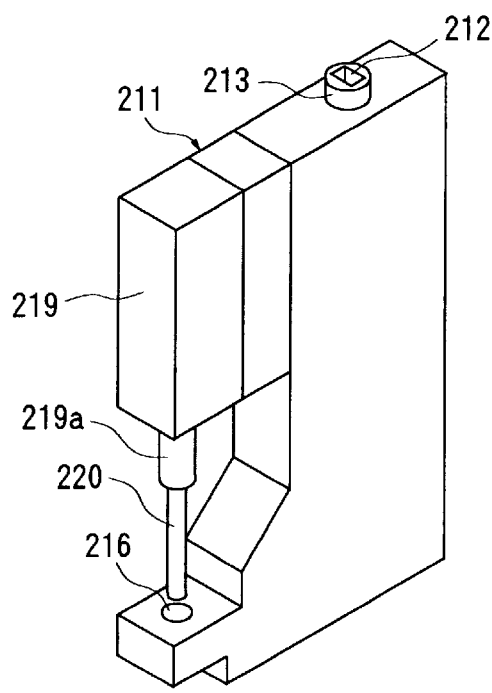
FIG. 21(A) is a perspective view showing a magazine according to a second embodiment of the present invention.
FIG. 21(B) is a longitudinal sectional view showing a magazine according to a second embodiment thereof.
Figure 21:
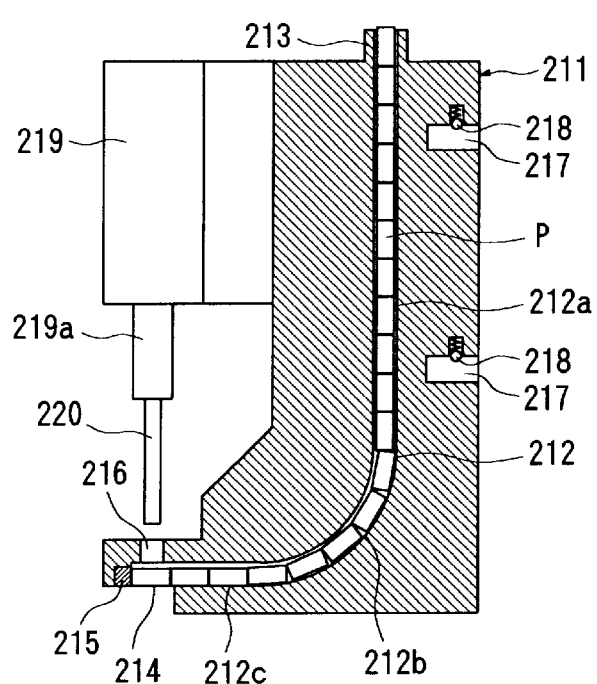

FIG. 15 shows a modification of the foregoing storage unit 21, the storage unit 101 has a storage chamber 102 equipped with an inclined bottom within, and the top aperture of the storage chamber 102 is covered with a lid (not shown) so that it can be freely opened or closed. In this storage chamber 102, there are stored a multiplicity of the same type of electronic components P having a shape of square pillar in a bulk state. Also, a through-hole 103 is provided in the lower portion of the storage unit 101, and at the undersurface aperture of the through-hole 103, there is provided a cylindrical portion 104 which is detachably fitted into the storage unit holder 33. A small diameter portion 105a formed in the upper portion of the chute tube 105 is inserted into the through-hole 103, and the top end of the small diameter portion slightly protrudes upwardly from that of the through-hole 103, or substantially coincides with the top end thereof. The shape of the cross-section of the inside hole of the chute tube 105 is a rectangle slightly larger than the shape of end face of the stored component P, and the outside shape of the small diameter portion 105a is smaller than the inside shape of the through-hole 103. Also, in a ring-shaped clearance formed between the through-hole 103 and the small diameter portion 105a, there is vertically movably arranged a movable pipe 106 having a predetermined length. In order to smoothly take stored components P into the movable pipe 106, the top end edge of the inside hole of the movable pipe 106 is appropriately rounded or chamfered. This movable pipe 106 is driven by a driving piece 107, which is vertically moved by an actuator such as a solenoid, and is vertically moved so that the top end thereof passes through the top end of the small diameter portion 105a. In this respect, the foregoing actuator may be arranged for each storage unit, and the driving pieces 107 for all the storage units 101 may be driven by one actuator at the same time.

According to this storage unit 101, the stored components P can be agitated by vertically moving the movable pipe 106, and this agitation enables the operation of taking the electronic components P within the storage chamber 102 into the top end aperture in the chute tube 105 to be furthered.

FIGS. 16(A) and 16(B) show a modification of the foregoing stopper 27, this stopper 111 is shaped like a L-character, and is pivotally mounted to the lower end portion of the chute tube 26. The stopper 111 is biased inwardly by a coiled spring 112 so that it is pressed by the cylindrical portion 13 to move outwardly when the cylindrical portion 13 of the magazine 11 is inserted into a notch 26a as shown in FIG. 16(A). Also, when the cylindrical portion 13 of the magazine 11 disengages from the notch 26a as shown in FIG. 16(B), the stopper 111 pivots inwardly by the biasing force of the coiled spring 112 to prevent components from falling from the chute tube 26.

FIGS. 17(A) and 17(B) show a modification of the foregoing magazine 11, and this magazine 121 has a housing passage 122 of a shape, in which a vertical passage, a curved passage and a horizontal passage have been made continuous, therein. In this housing passage 122, a plurality of the same type of electronic components P having a shape of a square pillar are housed in a longitudinally lined-up state. The shape of the cross-section of the housing passage 122 is a rectangle slightly larger than the shape of the end face of the housed component P, and the housed component P is capable of moving downward longitudinally by its own weight in the housing passage 122. The top end of the housing passage 122 is opened on the top surface of the magazine 121, and at the opening, there is provided a cylindrical portion (not shown) which is detachably connected to the chute tube 26. Also, on the undersurface of the tip end portion (front end portion of the horizontal passage) of the housing passage 122, there is formed a discharge port 123, through which an electronic component P at the head within the housing passage 122 can be discharged in a state in which it is laid horizontally. Furthermore, on the top wall of the housing passage 122 at the tip end portion, an insertion opening 124, into which suction nozzle 69 are inserted, is provided to face the center of the top face of the lead component P each other. Moreover, on the discharge port 123, there is back-and-forth movably provided a shutter 125 which covers the discharge port 123 so as to be able to freely open or close. More specifically, the lead electronic component P within the housing passage 122 abuts upon the front wall of the housing passage 122 at the tip end portion, and its undersurface is supported by the shutter 125 to prevent the natural drop from the discharge port 123. Reference numeral 126 designates a shutter opening/closing mechanism, which comprises a bracket 126a fixed to the front end of the magazine 121, a control lever 126b pivotally supported by the bracket 126a so that it overlaps the insertion opening 124 as viewed from above, and a compromise lever 126c connected to the control lever 126b. The compromise lever 126c and the shutter 125 are engaged by inserting a pin (not shown) of the shutter 125 into a slot (not shown) in the compromise lever 126c. As shown in FIG. 17(B), when the control lever 126b is pushed aside by the suction nozzle 69 which is lowering, the shutter 125 moves to the left in the figure through the compromise lever 126c, whereby the discharge port 123 is released to enable the component to be discharged.

FIGS. 18(A) and 18(B) show a modification of the foregoing magazine 11, the foregoing chute tube 26 and the foregoing stopper 27, and this magazine 131 has a housing passage 132 of a shape, in which a vertical passage 132a, an inclined passage 132b and a horizontal passage 132c have been made continuous, therein. In the vertical passage 132a of this housing passage 132, a plurality of the same type of electronic components P having a shape of a square pillar are housed in a state in which they are horizontally oriented and are vertically piled up, while in the inclined passage 132b and the horizontal passage 132c, the same electronic components P are housed in a longitudinally lined-up state. The shape of the cross-section of the vertical passage 132a is a rectangle slightly larger than the planar shape of the housed component P, and the housed component P located in the vertical passage 132a is capable of moving downward in a horizontally-oriented state by its own weight. The shape of the cross-section of the inclined passage 132b or the horizontal passage 132c is a rectangle slightly larger than the shape of the end face of the housed component P, and the housed component P located in the inclined passage 132b and the horizontal passage 132c is capable of moving downward longitudinally by its own weight. The top end of the housing passage 132 is opened on the back surface of the magazine 131, and at the opening, there is provided a cylindrical portion 133 which is detachably connected to a chute tube 141 to be described later. Also, on the undersurface of the housing passage 132 at the tip end portion (tip end portion of the horizontal passage 132c), there is formed a discharge port 134, through which an electronic component P at the head within the housing passage 132 can be discharged in a horizontally-oriented state. Further, on the front wall of the housing passage 132 at the tip end portion, a magnet 135 consisting of rare earth permanent magnet is embedded so that either N-pole or S-pole is in contact with the end face of the lead component P. In other words, the lead electronic component P within the housing passage 132 is attracted to this magnet 135, and is prevented from naturally falling from the discharge port 134. By the way, the lead component P can be sucked and held in the same manner even if vacuum ports are provided in place of the magnet 135. Furthermore, on the top wall of the housing passage 132 at the tip end portion, an insertion opening 136, into which the suction nozzle 69 is inserted, is provided. On the front face of the magazine 131, there are provided two mounting holes 137 for mounting pins 65 at a spacing vertically, inside of each of which there is provided a spring-biased ball 138 which engages with a ring-shaped concave portion 65a of the mounting pin 65. In this magazine 131, since the electronic components P can be housed in a vertically-piled-up state in a part of the housing passage 132, the number of components housed can be increased as compared with a case where housed longitudinally. By the way, this magazine 131 is also detachably held by the magazine holder 32 of the rack 31 as in the case of the foregoing magazine 11.

On the one hand, a chute tube 141 extends downward from the through-hole 24 in the storage unit 21, its lower end portion is curved, and the lower end aperture is oriented toward the magazine. The shape of the cross-section of the inside hole of this chute tube 26 is a rectangle slightly larger than the shape of the end face of the stored component P. The electronic components P stored in the storage chamber 22 are subjected to the vibration or the like when the rack 31 moves, and are taken into the top end aperture in the chute tube 141 one piece at a time longitudinally to move downward by its own weight. Also, at the lower end aperture of the chute tube 141, there is formed a concave portion 142 in which a cylindrical portion 133 of the foregoing magazine 131 detachably fits.

On the other hand, a stopper 151 has a triangular shape, and is provided at the lower end portion of the foregoing chute tube 141 so that it can be freely taken in and out. This stopper 151 is biased upwardly by a coiled spring 153 provided within a case 152, and plays a role to prevent the component from falling from the chute tube 141 in a state in which the cylindrical portion 133 of the magazine 131 has disengaged from the concave portion 142 in the chute tube 141. When the cylindrical portion 133 of the magazine 131 is inserted into the concave portion 142 in the chute tube 141 as shown in FIG. 18(A), the stopper 151 moves downward by the component force based on its own inclined surface. In this state, since the inside hole of the chute tube 141 and the top end aperture of the housing passage 132 are continuous to each other, the electronic component P located in the inside hole of the chute tube 141 can be fed into the housing passage 132. As shown in FIG. 18(B), the component is prevented from falling from the chute tube 26 by the stopper 151 which moves upwardly by the urging force of the coiled spring 153 in a state in which the cylindrical portion 133 has disengaged from the concave portion 142.

FIGS. 19(A) and 19(B) show a modification of the foregoing magazine 11 and the foregoing magazine mounting mechanism 51, and this magazine 161 has a housing passage 162 of a shape, in which a vertical passage 162a, a curved passage 162b and a horizontal passage 162c have been made continuous, therein. In this housing passage 162, a plurality of the same type of electronic components P having a shape of a square pillar are housed in a longitudinally lined-up state. The shape of the cross-section of the housing passage 162 is a rectangle slightly larger than the shape of the end face of the housed component P, and the housed component P is capable of moving downward longitudinally by its own weight in the housing passage 162. The top end of the housing passage 162 is opened on the top surface of the magazine 161, and at the opening, there is provided a cylindrical portion 163 which is detachably connected to the chute tube 26. Also, on the undersurface of the tip end portion (tip end portion of the horizontal passage 162c) of the housing passage 162, there is formed a discharge port 164, through which an electronic component P at the head within the housing passage 162 can be discharged in a horizontally-oriented state. Further, on the front wall of the housing passage 162 at the tip end portion, a magnet 165 consisting of rare earth permanent magnet is embedded so that either N-pole or S-pole is in contact with the end face of the lead component P. In other words, the lead electronic component P within the housing passage 162 is attracted by this magnet 165, and is prevented from naturally falling from the discharge port 164. By the way, the lead component P can be sucked and held in the same manner even if vacuum ports are provided in place of the magnet 165. Furthermore, on the top wall of the housing passage 162 at the tip end portion, an insertion opening 166, into which the suction nozzle 69 is inserted, is provided to face the center of the top face of the lead component P each other. On the front face of the magazine 161, there are provided two mounting holes 167 for mounting pins 65 at a spacing up and down, inside of each of which there is provided a spring-biased ball 168 which engages with the ring-shaped concave portion 65a of the mounting pin 65. Moreover, on the back surface of the magazine 161, there are provided two insertion holes 169 for engaging pins 173 to be described later at a spacing vertically.

On the other hand, the magazine mounting mechanism 171 is arranged behind the rack 31 on the base 1. This magazine mounting mechanism 171 is provided with a rod 172 capable of advancing and retracting by an actuator (not shown) such as a cylinder and a motor, two engaging pins 173 provided at the tip end of the rod 172 and a vacuum ports 174 formed within the rod 172. When the rod 172 is advanced in a state in which negative pressure is applied on the vacuum ports 174 by using a vacuum pump or the like, the back surface of the magazine 11 is sucked to the front end of the rod 172 the moment each engaging pin 173 is inserted into an insertion hole 169 on the back surface of the magazine 161 as shown in FIG. 19(B). When the rod 172 is further advanced in the same state, the magazine 161 can be extracted from the rack 31 to be mounted to the head 61 as in the foregoing case. Of course, the magazine 161 can be removed from the head 61.

FIGS. 20(A) and 20(B) show a modification of the foregoing magazine 11 and the foregoing head 61, and the magazine 181 has a housing passage 182 of a shape, in which a vertical passage 182a, a curved passage 182b and a horizontal passage 182c have been made continuous, therein. In this housing passage 182, a plurality of the same type of electronic components P having a shape of a square pillar are housed in a longitudinally lined-up state. The shape of the cross-section of the housing passage 182 is a rectangle slightly larger than the shape of the end face of the housed component P, and the housed component P is capable of moving downward longitudinally by its own weight in the housing passage 182. The top end of the housing passage 182 is opened on the top surface of the magazine 181, and at the opening, there is provided a cylindrical portion 183 which is detachably connected to the chute tube 26. Also, on the undersurface of the housing passage 182 at the tip end portion (tip end portion of the horizontal passage 182c), there is formed a discharge port 184, through which an electronic component P at the head within the housing passage 182 can be discharged in a horizontally-oriented state. Further, on the front wall of the housing passage 182 at the tip end portion, the magnet 15 consisting of rare earth permanent magnet is embedded so that either N-pole or S-pole is in contact with the end face of the lead component P. In other words, the lead electronic component P within the housing passage 182 is attracted by this magnet 185, and is prevented from naturally falling from the discharge port 184. By the way, the lead component P can be sucked and held in the same manner even if vacuum ports are provided in place of the magnet 185. Furthermore, on the top wall of the housing passage 182 at the tip end portion, an insertion opening 186, into which a suction nozzle 69 is inserted, is provided to face the center of the top face of the lead component P each other. On the front face of the magazine 11, there are provided two mounting holes 187 for mounting pins 65 to be described later at a spacing vertically, between which there is embedded an attracting plate 188 made of ferromagnetic material such as iron.

On the other hand, this head 191 comprises, as in the case of the foregoing head 61, a shaft (not shown); three disks 192 (upper disk is not shown) fixed to the shaft at a spacing vertically; a motor (not shown) fixed to the head supporting portion 2, for rotationally driving the shaft in a forward or reverse direction; magazine mounting pins 193 provided at intervals of 90° on the peripheral surfaces of the central and lower disks 192; rods (not shown) vertically movably provided at intervals of 90° on the central and lower disks 192; cylinders (not shown) provided on the central disk 63, for linearly driving each rod in an up-and-down direction; a motor (not shown) provided on the upper disk, for rotationally driving each rod in a forward or reverse direction; and a suction nozzle 69 (not shown) provided for the lower end of each rod. Also, on the central and lower disks 192, magnets 194, each consisting of rare earth permanent magnet for corresponding to the foregoing attracting plate 188 are provided at the same angular intervals as the mounting pins 193.

When the foregoing magazine 181 is advanced toward the head 191 using the magazine mounting mechanism 51, two mounting pins 193 of the head 191 are fitted into the two mounting holes 187 in the magazine 181 at the same time as shown in FIG. 20(B). At the same time, two attracting plates 188 of the magazine 181 are attracted by the two magnets 194 of the head 191 so that the magazine 181 is mounted to the head 191.

FIGS. 21 to 28 show a second embodiment of the electronic component placing apparatus according to the present invention. In FIGS. 21 to 28, a reference numeral 202 denotes a head supporting portion, 211 denotes a magazine, 221 denotes a storage unit, 231 denotes a rack, 241 denotes a magazine mounting mechanism, 251 denotes a head, 261 denotes conveying rails, 271 denotes a table, and 281 denotes a substrate. In this respect, the present second embodiment also comprises the same base and rack moving mechanism as in the first embodiment, but these are not shown in the drawings.

The magazine 211 has, as shown in FIGS. 21(A) and 21(B), a housing passage 212 of a shape, in which a vertical passage 212a, a curved passage 212b and a horizontal passage 212c have been made continuous, therein. In this housing passage 212, a plurality of the same type of electronic components P having a shape of a square pillar are housed in a longitudinally lined-up state. The concrete type and shape of these electronic components P are as described in the first embodiment. The shape of the cross-section of the housing passage 212 is a rectangle slightly larger than the shape of the end face of the housed component P, and the housed component P is capable of moving downward longitudinally by its own weight in the housing passage 212. The top end of the housing passage 212 is opened on the top surface of the magazine 211, and at the opening, there is provided a cylindrical portion 213 which is detachably connected to a chute tube 226 to be described later. Also, on the undersurface of the housing passage 212 at the tip end portion (tip end portion of the horizontal passage 212c), there is formed a discharge port 214, through which an electronic component P at the head within the housing passage 212 can be discharged in a horizontally-oriented state. Further, on the front wall of the housing passage 212 at the tip end portion, a magnet 215 consisting of rare earth permanent magnet is embedded so that either N-pole or S-pole is in contact with the end face of the lead component P. In other words, the lead electronic component P within the housing passage 212 is attracted by this magnet 215, and is prevented from naturally falling from the discharge port 214. By the way, the lead component P can be sucked and held in the same manner even if vacuum ports are provided in place of the magnet 215. Furthermore, on the top wall of the housing passage 212 at the tip end portion, an insertion opening 216, into which a suction nozzle 220 to be described later is inserted, is provided to face the center of the top face of the lead component P each other. On the back surface of the magazine 211, there are provided two mounting holes 217 for mounting pins 255 to be described later at a spacing vertically, inside of each of which there is provided a spring-biased ball 218 which engages with a ring-shaped concave portion 255a of the mounting pin 255. Also, on the front of the magazine 211, there is vertically provided a cylinder 219, and on the rod 219a of the cylinder 219, there is provided an suction nozzle 220 so that the center thereof and the insertion opening 216 coincide with each other as viewed from above. Although not shown, to suction/exhaust ports for the cylinder 219 and the suction nozzle 220, piping from an air circuit equipped with a vacuum pump and the like is connected when the magazine 211 is mounted to the head 251 to be described later. By the way, the entire magazine 211 or the side portion of the housing passage is preferably formed by transparent or semi-transparent material so that the storage state of the electronic components P can be confirmed from the outside.

Figure 22:
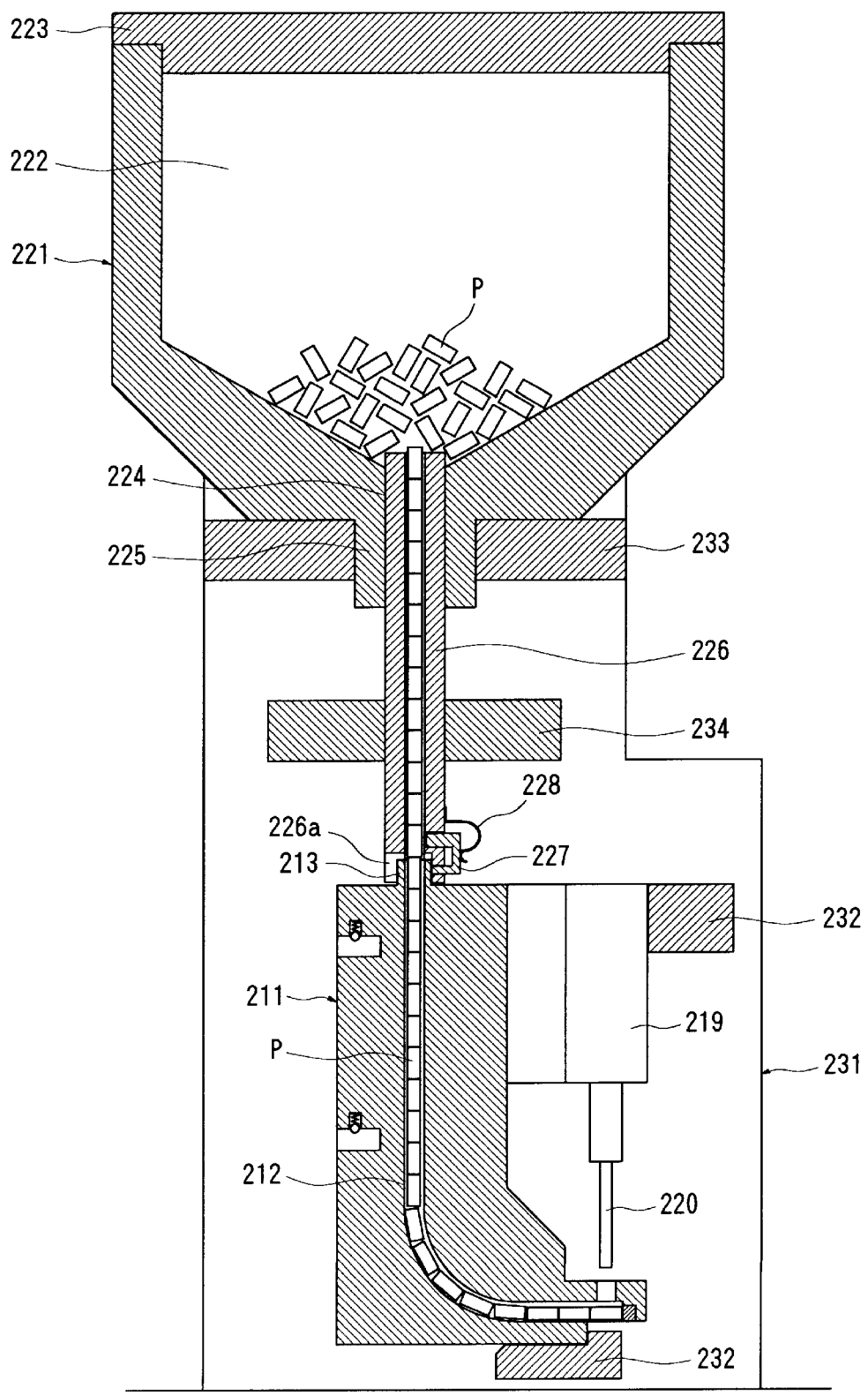
FIG. 22 is a longitudinal sectional view showing the magazine, a storage unit and a rack according to the second embodiment.

The storage unit 221 has a storage chamber 222 equipped with an inclined base within as shown in FIG. 22, and the top face aperture of the storage chamber 222 is covered with a lid 223 so that it can be freely opened or closed. In this storage chamber 222, there are stored a multiplicity of the same type of electronic components P having a shape of a square pillar in bulk. The concrete types and shapes of these electronic components P are as described in the first embodiment. Also, a through-hole 224 is formed in the lower portion of the storage unit 221, and at the undersurface aperture of the through-hole 224, there is provided a cylindrical portion 225 which is detachably fitted into a storage unit holder 233 to be described later. A chute tube 226 is inserted into the through-hole 224, and the top end thereof slightly protrudes upwardly from that of the through-hole 224, or substantially coincides with the top end of the through-hole 224. In order to smoothly take the stored components P into the chute tube 226, the top end edge of the inside hole of the chute tube 226 is appropriately rounded or chamfered. The shape of the cross-section of the inside hole of the chute tube 226 is a rectangle slightly larger than the shape of end face of the stored component P, and coincides with the shape of the cross-section of the housing passage 212 in the foregoing magazine 211. The stored components P within the storage chamber 222 are subjected to vibration or the like when the rack 231 laterally moves, and are taken one piece at a time longitudinally into the top end aperture of the chute tube 226 to move downward by its own weight. Also, the outside diameter of the chute tube 226 is larger than that of the cylindrical portion 213 in the foregoing magazine 211, and at the lower end portion of the chute tube 226, there is formed a notch 226a to allow the cylindrical portion 213 to be inserted. Furthermore, at the lower end portion of the chute tube 226, a U-shaped stopper 227, which is retracted by the cylindrical portion 213 inserted into the notch 226a, is movably provided in a state in which it is urged inwardly by a leaf spring 228. This stopper 227 plays a role to prevent the components from falling from the chute tube 226 in a state in which the cylindrical portion 213 of the magazine 211 has disengaged from the notch 226a of the chute tube 226. By the way, the entire storage 221 or the side portion of the storage chamber is preferably formed by transparent or semi-transparent material so that the storage state of the electronic components P can be confirmed from the outside.

The rack 231 is arranged on the base. As shown in FIG. 22, on this rack 231, the following are provided at a spacing vertically: two upper and lower magazine holders 232 for detachably holding a plurality of magazines 211 in a sideways-arranged state; a storage unit holder 233 for detachably holding a plurality of storage units 221 in a sideways-arranged state; and a chute tube holder 234 for supporting the chute tube 226 inserted into each storage unit 233. Also, although not shown, on the base of the rack 231, there are in parallel provided slide guides such as rollers, which movably engage with guide rails for the rack moving mechanism.

In the plurality of storage units 221 provided on top of the rack 231, there are stored different types of electronic components P having a shape of a square pillar respectively. Of course, the same type of electronic components P may be stored in two or more storage units 221. The concrete types and shapes of the electronic components P are as described in the first embodiment. In this respect, as in the case of the first embodiment, the number of the storage units 221 provided for the rack 231 and the number of the magazines 11 mountable to the rack 231 may be increased or decreased as required.

Figure 23:
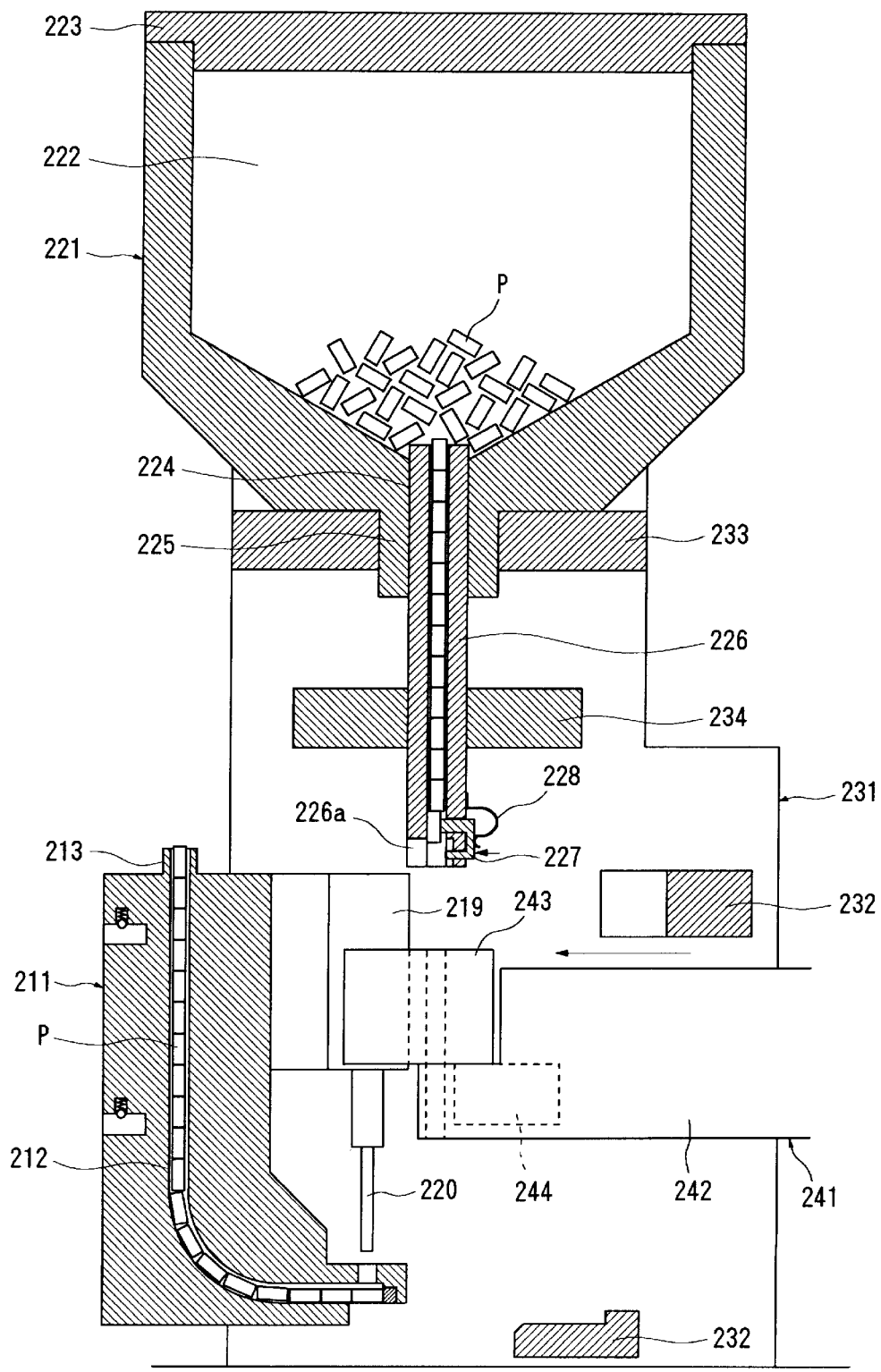
FIG. 23 is a plan view showing an aspect in which the magazine is extracted from the rack in the second embodiment.

The plurality of magazines 211 and the plurality of storage units 221 have an one-to-one correspondence therebetween, and electronic components P are replenished from the storage units 221 to the housing passage 212 in the magazine 211 in a state in which the magazine 211 is mounted to the rack 231. More specifically, in a state in which the cylindrical portion 213 of the magazine 211 has been inserted in the notch 226a of the chute tube 226 as shown in FIG. 22, electronic components P located in the inside hole of the chute tube 226 can be fed into the housing passage 212 because the inside hole of the chute tube 226 and the top end aperture of the housing passage 212 are continuous to each other. On the other hand, in a state in which the magazine 211 was extracted from the rack 231 and the cylindrical portion 213 has disengaged from the notch 226a of the chute tube 226 as shown in FIG. 23, the components are prevented from falling from the chute tube 226 by means of a stopper 227 which moves inwardly by the biasing force of the leaf spring 228.

A rack moving mechanism (not shown) is arranged under the foregoing rack 231 on the base as in the case of the first embodiment. This rack moving mechanism is provided with two straight-line guide rails with which the slide guides of the foregoing rack 231 movably engage; a nut fixed to the base of the foregoing rack 231; a ball thread threadably engaged with the nut; and a motor for rotationally driving the ball thread in a forward or reverse direction. In other words, the ball thread is rotationally driven in a forward or reverse direction by the motor, whereby the foregoing rack 231 linearly moves along the guide rails in the direction in which the magazines 211 are lined up.

Figure 24:
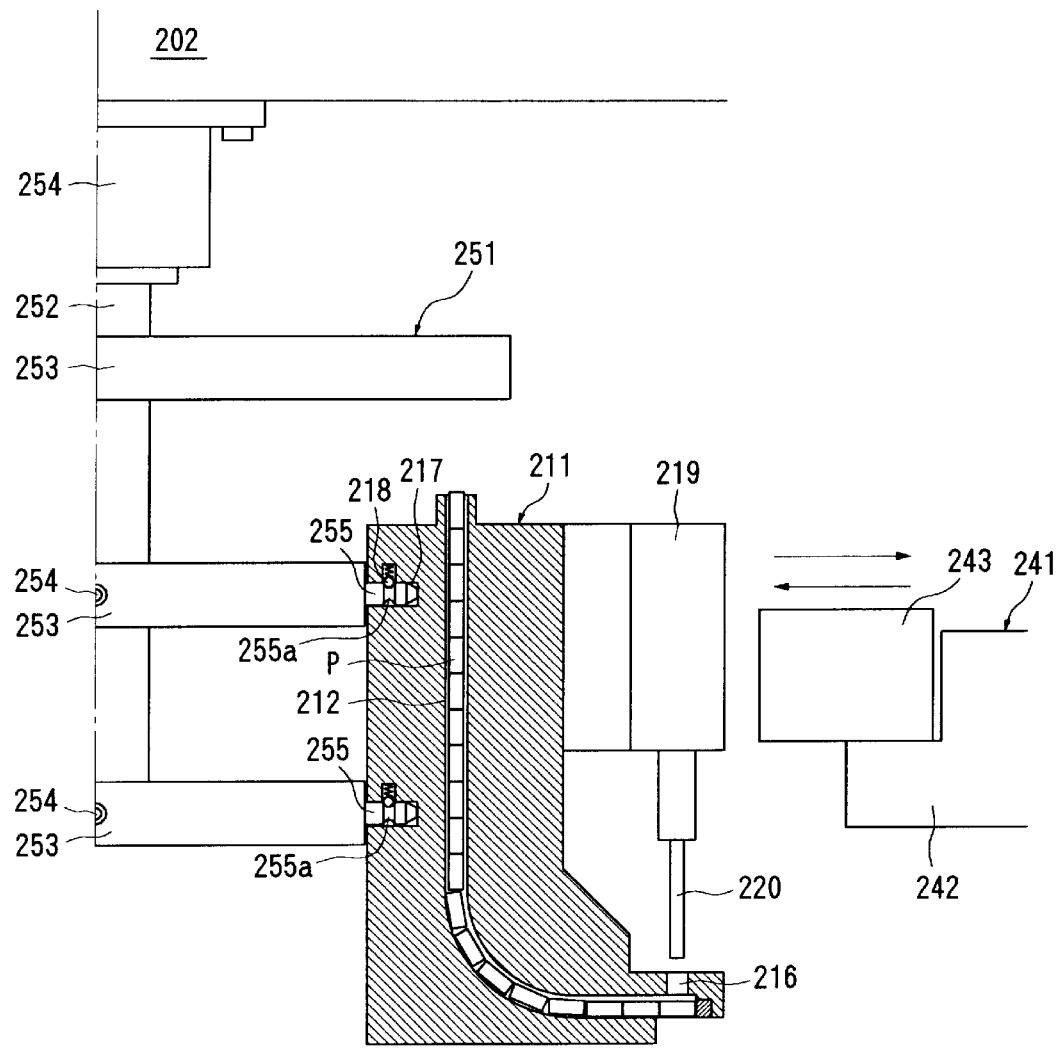
FIG. 24 is a side view showing an aspect in which the magazine is mounted to the head in the second embodiment.

The magazine mounting mechanism 241 is arranged behind the foregoing rack 231 on the base as in the case of the first embodiment. As shown in FIGS. 23 and 24, this magazine mounting mechanism 241 is provided with a rod 242 capable of advancing and retracting by an actuator (not shown) such as a cylinder and a motor, and a chuck 243 provided at the tip end of the rod 242. The chuck 243 is of a two-pawl type, and is open-close driven by an actuator 244 such as a cylinder and a motor. The shape of the chuck 243 is consistent with the back surface side (cylinder portion) of the magazine 211, and the back surface portion of the magazine 211 can be grasped by a close operation.

Figure 25:
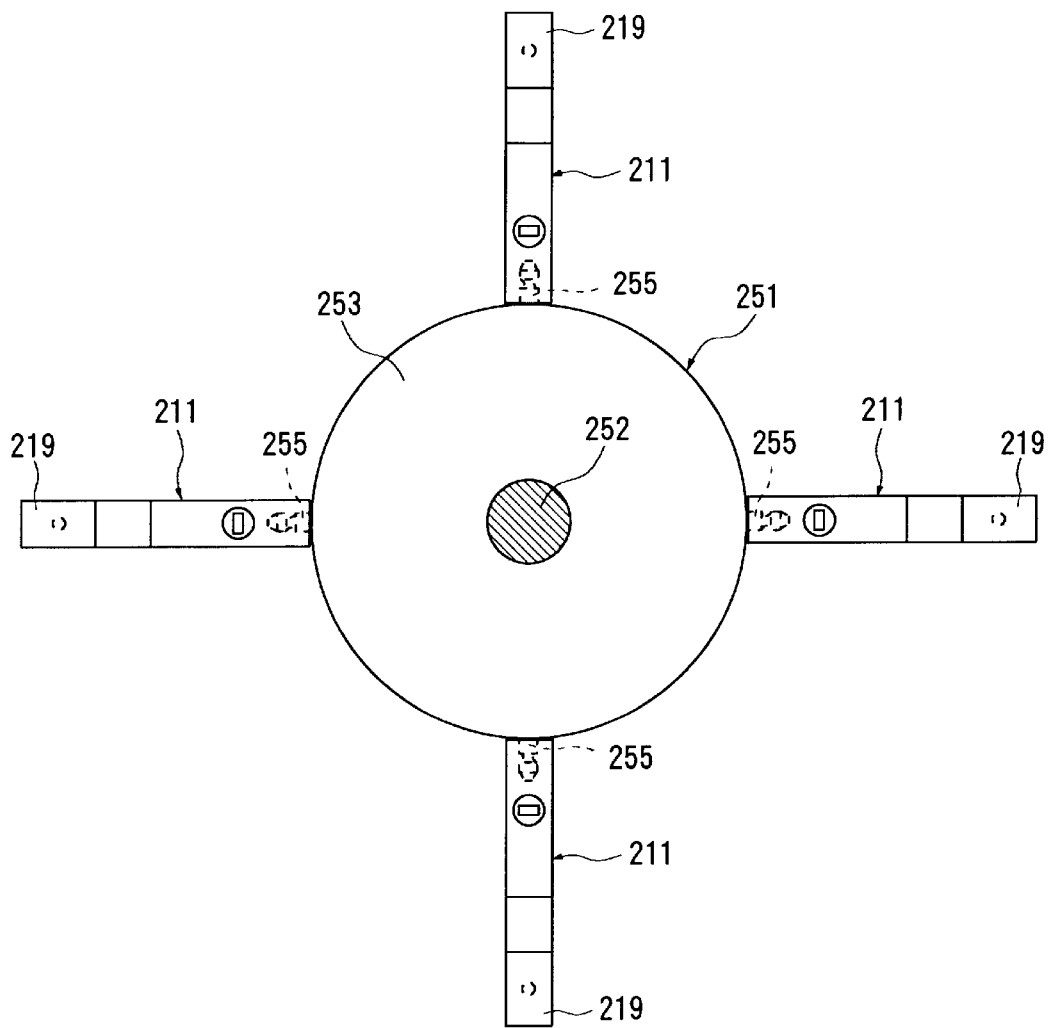
FIG. 25 is a plan view showing an aspect in which four magazines are mounted to the head in the second embodiment.

The head 251 is arranged on the head supporting portion 202. As shown in FIGS. 24 and 25, this head 251 comprises a shaft 252; three disks 253 fixed to the shaft 252 at a spacing vertically; a motor 254 fixed to the head supporting portion 202, for rotationally driving the shaft 252 in a forward or reverse direction; and magazine mounting pins 255 provided at intervals of 90° on the peripheral surfaces of the central and lower disks 253. Each mounting pin 255 has an acute shape, and has a ring-shaped concave portion 255a, with which a ball 218 provided for a mounting hole 217 in the magazine 211 engages. In this connection, the head supporting portion 202 for supporting the head 251 is fixed to a strut (not shown) vertically installed on the base.

Figure 26:
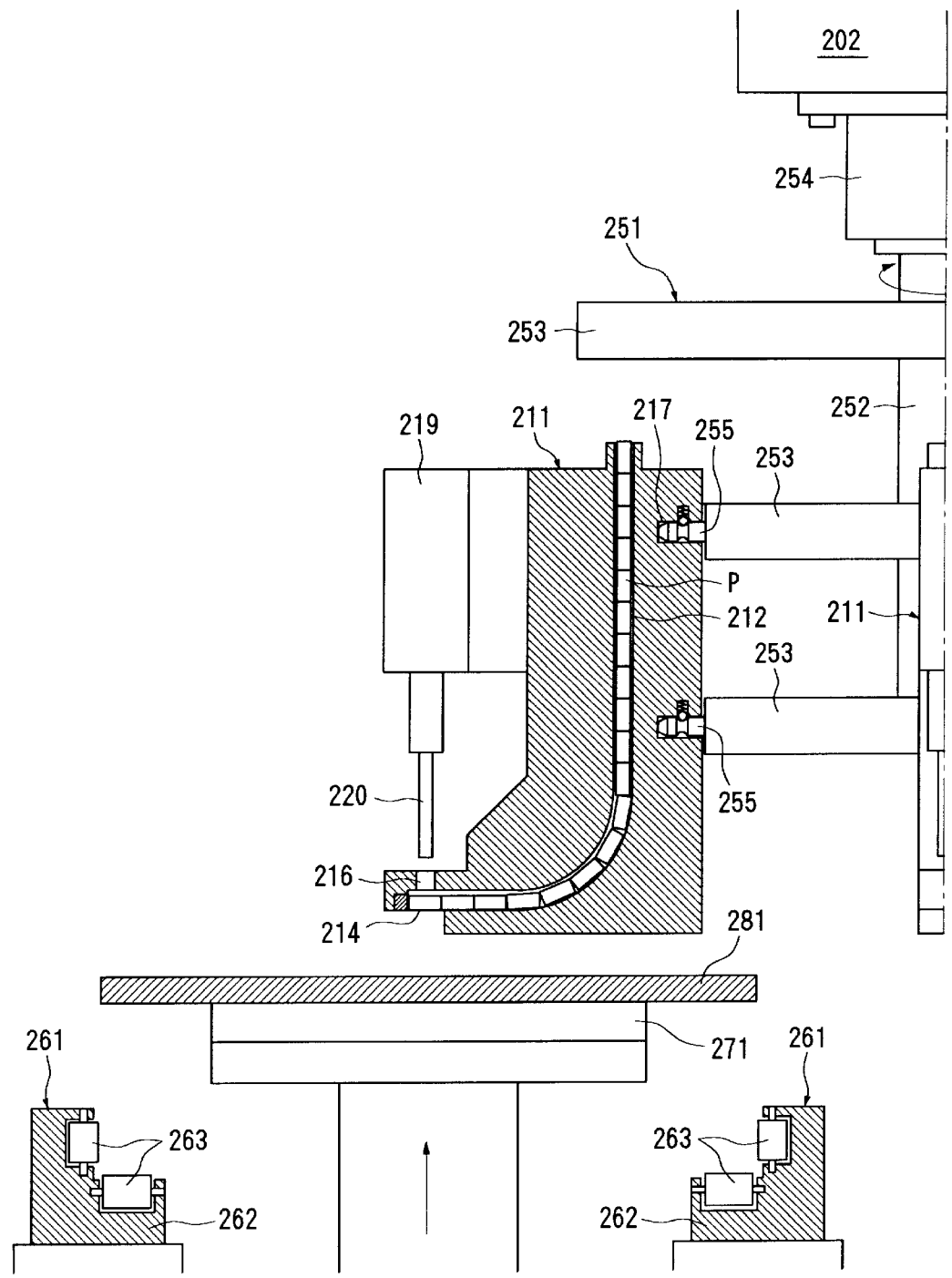
FIG. 26 is a side view showing an aspect in which the electronic component is loaded on the substrate in the second embodiment.

Conveying rails 261 are arranged at a position adjacent to the base. As shown in FIG. 26, the conveying rails 261 are in parallel to the moving direction of the rack 231, and convey a substrate 281 on which to be placed, in parallel to the direction in which the magazines are lined up. This conveying rail 261 comprises a L-shaped rail body 262, and a plurality of rollers 263 arranged at equal intervals longitudinally on the base and on the side of the inner side of the rail body 262. The plurality of rollers 263 provided along the rail body 262 can be rotated by a motor (not shown), and the substrate 281 placed on the rollers 263 is conveyed by this rotating force.

The table 271 is arranged in the vicinity of the foregoing head 251 between the foregoing conveying rails 261. As shown in FIG. 26, this table 271 is capable of moving up and down and moving in the XY direction (See FIG. 1). On the top surface of the table 271, there are provided a multiplicity of vacuum ports (not shown) so that the substrate 281 can be held by applying negative pressure to the vacuum ports using a vacuum pump or the like.

The operation of the apparatus of the foregoing second embodiment will be described.

In a state in which any magazine 211 is not mounted to the head 251, the rack 231 is first moved by the rack moving mechanism (not shown) to allow a first magazine 211 to be mounted to accurately face the chuck 243 of the magazine mounting mechanism 241. Then, as shown in FIG. 23, the rod 242 of the magazine mounting mechanism 241 is advanced toward the head 251, and when the chuck 243, which is in an open state, abuts upon the back surface of the magazine 211, the chuck 243 is closed to grasp the back surface side of the magazine 211. Further, the rod 242 is advanced to extract the magazine 211 from the magazine holder 232.

When the magazine 211 is extracted from the magazine holder 232, the cylindrical portion 213 of the magazine 211 disengages from the notch 226a of the chute tube 226 as shown in FIG. 23, whereby the stopper 227 moves inwardly by the biasing force of the leaf spring 228, thus preventing the components from falling from the chute tube 226.

When the rod 242 of the magazine mounting mechanism 241 is further advanced, two mounting pins 255 of the head 251 are fitted into two mounting holes 217 in the magazine 211 at the same time as shown in FIG. 24. The mounting of the magazine 211 into the head 251 is completed when the spring-biased ball 218 engages with the ring-shaped concave portion 255a of the mounting pin 255. After the completion of the mounting, the chuck 243 of the magazine mounting mechanism 241 is opened to retract the rod 242, and the chuck 243 is caused to return to the initial position.

After the first magazine 211 is mounted, the head 251 is rotated 90° in a clockwise direction or in a counter-clockwise direction as viewed from above by the motor 254. At the same time, the rack 231 is moved by the rack moving mechanism to allow a second magazine 211 to be mounted to accurately face the chuck 243 of the magazine mounting mechanism 241. Then, the rod 242 of the magazine mounting mechanism 241 is advanced to grasp the back surface side of the magazine 211 with the chuck 243. The rod 242 is further advanced to extract the magazine 211 from the magazine holder 232, and two mounting pins 255 of the head 251 are fitted into the two mounting holes 217 of the magazine 211 extracted for mounting. After the completion of the mounting, the chuck 243 of the magazine mounting mechanism 241 is opened to retract the rod 242, and the chuck 243 is caused to return to the initial position. By repeating the foregoing operation, the third and fourth magazines 211 will also be mounted to the head 251 in order (See FIG. 25).

In the process of mounting the magazine 211 to the head 251, the substrate 281 is conveyed to an operating position, where the component is placed, by the conveying rails 261. When the substrate 281 is carried in the operating position, the table 271 moves up by a predetermined stroke, and the substrate 281 on the conveying rails 261 is lifted upwardly by the table 271 to leave the conveying rails 261 as shown in FIG. 26. The substrate 281 moving up together with the table 271 is held to the table 271 by negative pressure acting on the vacuum ports.

In a state in which four magazines 211 are mounted to the head 251, four types of electronic components P at maximum can be selectively loaded on the substrate 281. Of course, if five or more magazines 211 are radially mounted on the head 251, a wide variety of electronic components P can be selectively loaded on the substrate 281 extending the range of component selections.

When loading the electronic components P on the substrate 281, the head 251 is rotated so that a magazine 211 housing an electronic component P to be loaded faces the substrate 281 as shown in FIG. 26. Subsequently, the table 271 is moved in the XY direction so that the discharge port 214 of this magazine 211 accurately faces a component loading point on the substrate 281.

Figure 27:
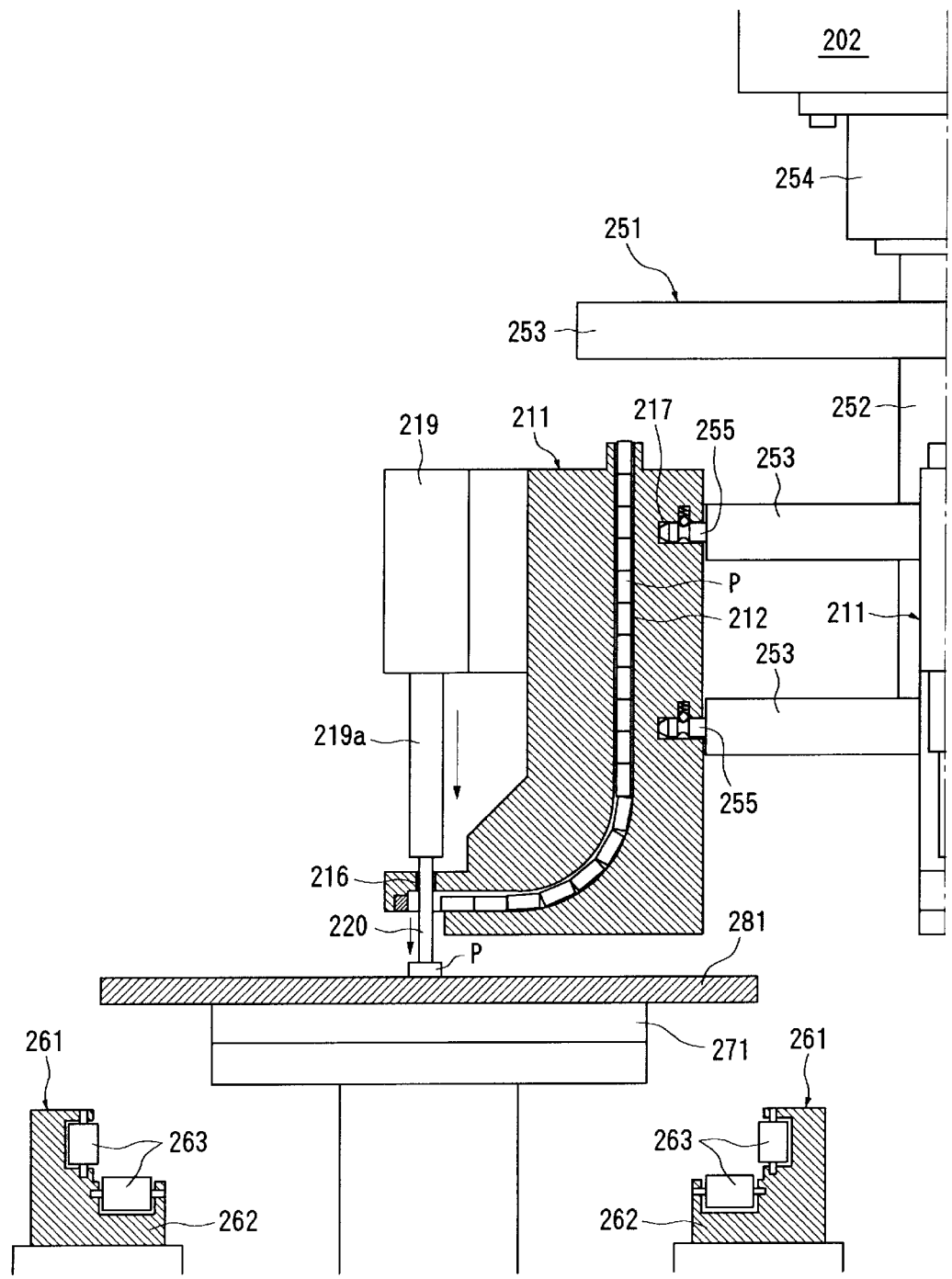
FIG. 27 is a side view showing an aspect in which the electronic component is loaded on the substrate in the second embodiment.

As shown in FIG. 27, the rod 219a is caused to lower by the cylinder 219, and the suction nozzle 220 is inserted into the insertion opening 216 in the magazine 211 while negative pressure is being applied to the suction nozzle 220.

Thus, the lead electronic component P attracted and held by the magnet 215 is sucked by the suction nozzle 220, moves downward together with the suction nozzle 220 in such a sucked state against the magnetic force of the magnet 215, and one electronic component P is pushed out from the discharge port 214 in a horizontally oriented state. The electronic component P pushed out from the discharge port 214 in the magazine 211 further lowers together with the suction nozzle 220 still in the sucked state to the substrate 281.

Since the component loading point on the substrate 281, for example, the land and the like are coated with viscous cementing material such as cream solder in advance in conformity with the external electrode of the electronic component P, the electronic component P, which has reached the substrate 281, adheres to the substrate 281 through this viscous cementing material. The spacing between the suction nozzle 220 and the insertion opening 214 in the magazine 211 and the spacing between the discharge port 214 in the magazine 211 and the substrate 281 can be set in advance and therefore, if the downstroke of the suction nozzle 220 is determined in advance on the basis of these spacings, there is no possibility that the electronic component P loaded on the substrate 281 is pressed against the substrate 281 by pressure more than necessary.

Figure 28:
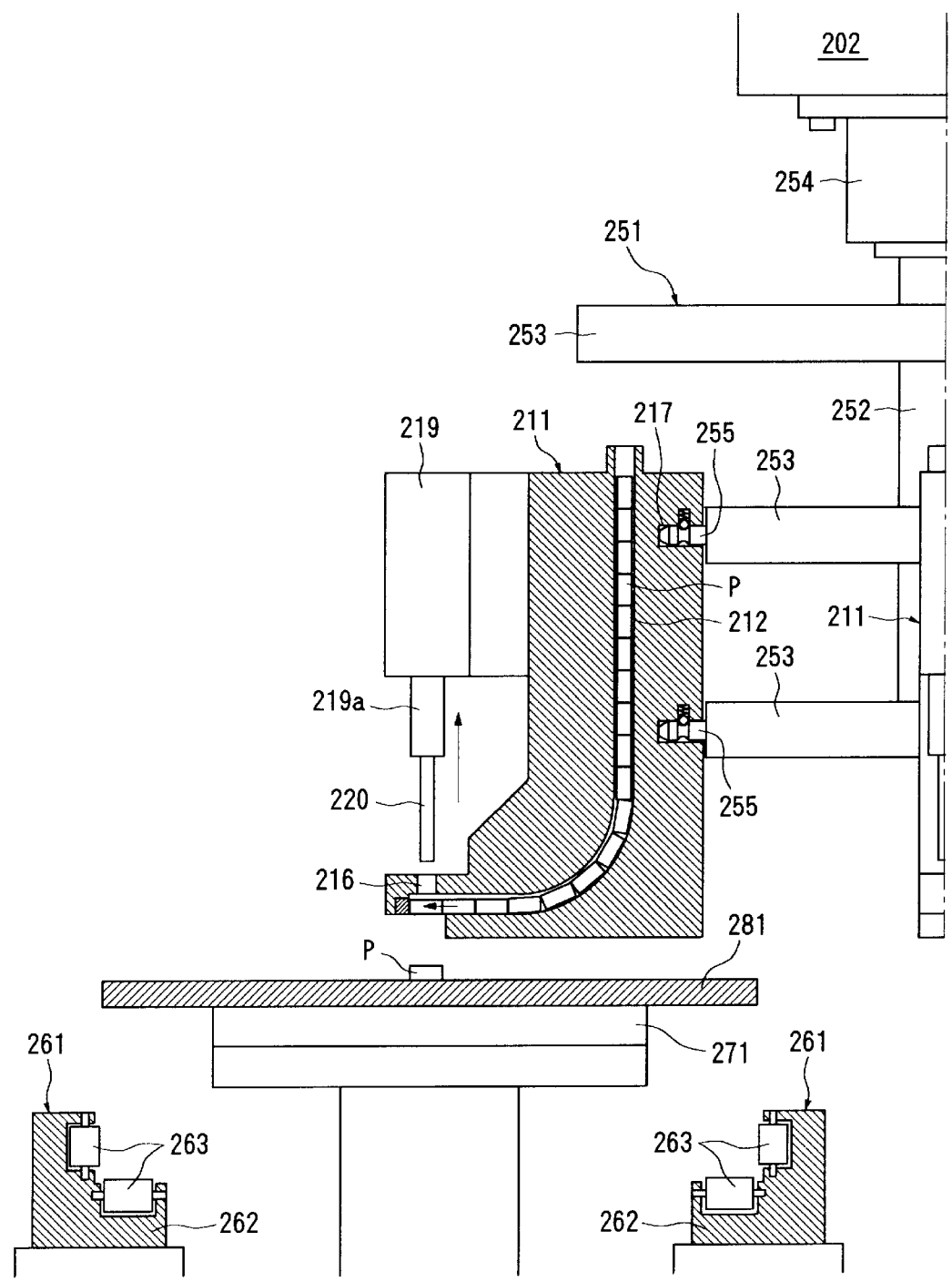
FIG. 28 is a side view showing an aspect in which the electronic component is loaded on the substrate in the second embodiment.

After the completion of the loading, as shown in FIG. 28, the negative pressure action of the suction nozzle 220 is released or is switched to a positive pressure action, and thereafter, the rod 219a is raised by the cylinder 219 to return the rod 219a and the suction nozzle 220 to the initial position. When the suction nozzle 220 is extracted from the insertion opening 216 in the magazine 211, the housed component P within the housing passage 212 moves downward by its own weight, and a next lead electronic component P is attracted and held by the magnet 215, being in a standby state for discharge again.

When mounting an electronic component P housed in another magazine 211 other than the foregoing one on the substrate 281 successively, the head 251 is rotated, as in the case of the foregoing, so that the magazine 211 housing an electronic component P to be loaded faces the substrate 281, and the table 271 is moved in the XY direction so that the discharge port 214 in the magazine 211 accurately faces the component loading point on the substrate 281. The rod 219a is caused to lower by the cylinder 219, and the suction nozzle 220 can be inserted into the insertion opening 216 in the magazine 211 while negative pressure is being applied to the suction nozzle 220 to push out the lead electronic component P from the discharge port 214.

A plurality of electronic components P are housed in the respective housing passages 212 for four magazines 211 mounted to the head 251, and therefore, the same magazine 211 can be repeatedly used until the housed components P are exhausted to load the components on the substrate 281.

If such a need arises as to load an electronic component P, on the substrate 281, other than electronic components housed in four magazines 211 mounted to the head 251, the head 251 is rotated so that a magazine 211 to be replaced faces the rack 231, and at the same time, the rack 231 is moved by the rack moving mechanism so that this magazine 211 accurately faces the holding position thereof. After the magazine 211 of the head 251 accurately faces the holding position of the rack 31 corresponding to this magazine 211, the rod 242 of the magazine mounting mechanism 241 is advanced, and when the chuck 243, which is in an open state, abuts upon the back surface of the magazine 11, the chuck 243 is closed to grasp the back surface side of the magazine 211.

Then, the rod 242 of the magazine mounting mechanism 241 is retracted to remove the magazine 211 to be replaced from the head 251, and the rod 242 is further retracted to insert a magazine 211 into the magazine holder 232 for holding. Thereafter, the chuck 243 of the magazine mounting mechanism 241 is opened to retract the rod 242, and the chuck 243 is caused to return to the initial position.

Next, the rack 231 is moved by the rack moving mechanism to cause the new magazine 211 to be mounted to accurately face the chuck 243 of the magazine mounting mechanism 241, and the rod 242 of the magazine mounting mechanism 241 is advanced to grasp the back surface side of the magazine 241 with the chuck 243. The rod 242 is further advanced to extract the magazine 211 from the magazine holder 232, and two mounting pins 255 of the head 251 are fitted into the two mounting holes 217 in the magazine 211 thus extracted for mounting. This magazine replacement can be performed even during component mounting.

When predetermined numbers and types of electronic components P are loaded on the substrate 281 as described above, the table 281 lowers, the negative pressure action of the vacuum ports is released or is switched to a positive pressure action, the substrate 281 rides on the conveying rails 261, and the table 271 leaves the substrate 281. The substrate 281 with components loaded thereon is fed forward by the conveying rails 261, and the new substrate 481 is conveyed to an operating position, where the component is loaded, by the conveying rails 261. Thereafter, the same component mounting as the foregoing is repeated.

As described above, according to the apparatus of the second embodiment, a plurality of magazines 211 are mounted to the head 251, and yet, a plurality of electronic components P are housed in each magazine 211. Therefore, by an operation of selectively inserting the suction nozzle 220 into insertion openings 216 in a plurality of magazines 211, it is possible to load a desired electronic component P on the substrate 281, and to repeatedly perform this component mounting until the housed components P are discharged.

It does not take much time to load one electronic component P on the substrate, and yet the magazine can be selected within a short period of time by the head rotation. Therefore, a period of time required to load predetermined numbers and types of electronic components P on the substrate 281 can be greatly shortened, thus making it possible to improve the productivity by speeding up the operation.

In the drawings, the maximum number of the magazines 211 mountable to the head 251 is four, but a wide variety of electronic components P will be able to be selectively loaded on the substrate 281 if five or more magazines 211 are arranged so as to be able to be mounted to the head 251. In other words, even if a wide variety of electronic components P are loaded on the substrate 281, the components can be loaded on the substrate 281 at high speed using only the magazines 211 mounted to the head 251.

Also, since the magazine 211 mounted to the head 251 can be arbitrarily replaced with another magazine 211 held by the rack 231, component loading on the substrate 281 can be exactly performed even if a wide variety of electronic components P are loaded on the substrate 281, and even if the type of the substrate 281 is changed.

Furthermore, the foregoing magazine replacement can be performed during component loading, and yet it is not necessary to suspend the component loading in order to replace the magazine, and therefore, the operation efficiency is not deteriorated by the magazine replacement.

Moreover, since storage units 221 for replenishing electronic components P to each of the magazines 211 are provided on the rack 231, component replenishment to the magazine 211 can be simply performed at timing at which the magazine 211 is returned to the rack 231, and the same magazine 211 can be repeatedly mounted for use without causing component shortages.

Moreover, since the suction nozzle 220 and cylinders 219 for vertically moving them are provided for each of the magazines 211, the structure of the head 251 itself can be simplified to reduce its weight.

Moreover, since the substrate 281 carried in at the operating position by the conveying rails 261 is supported by the table 271 and the electronic components P are arranged to be loaded on this substrate 281, component loading on each substrate 281 can be performed in order in a process of continuously conveying a plurality of substrates 281 by the conveying rails 261.

Moreover, since a table movable in the XY direction is used as a table 271 for supporting the substrate 281, the component loading position can be appropriately aligned by moving the table 271 in the two-dimensional direction.

Figure 29:
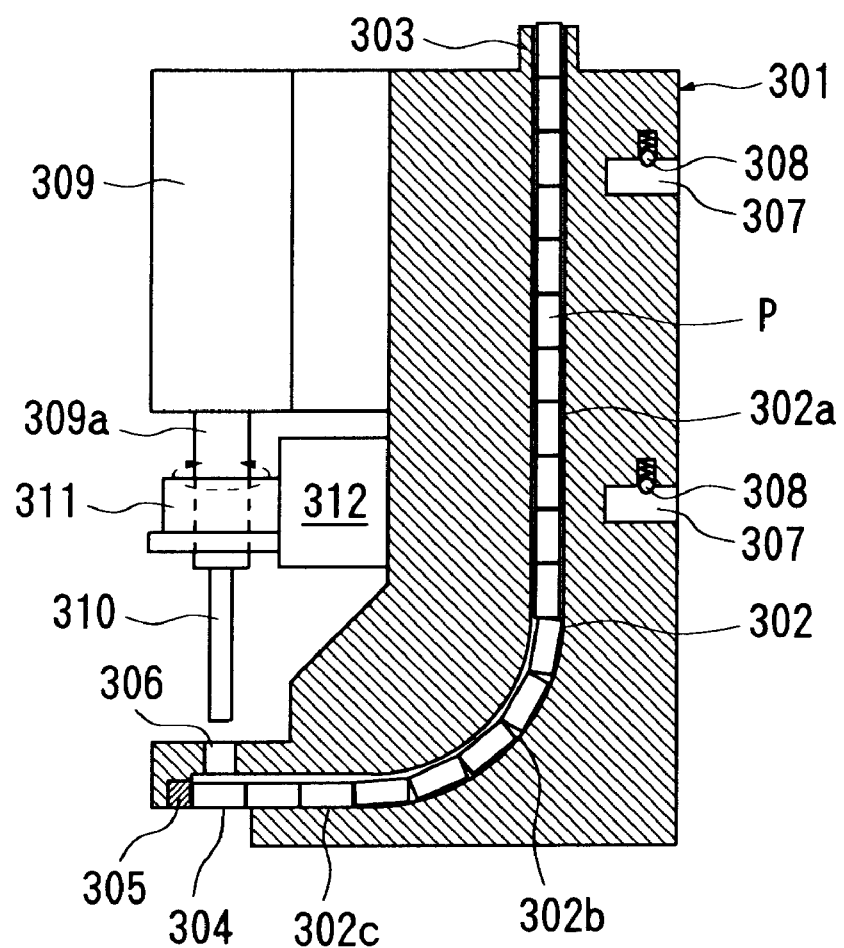
FIG. 29 is a longitudinal sectional view showing a modification of the magazine according to the second embodiment.
Figure 30:
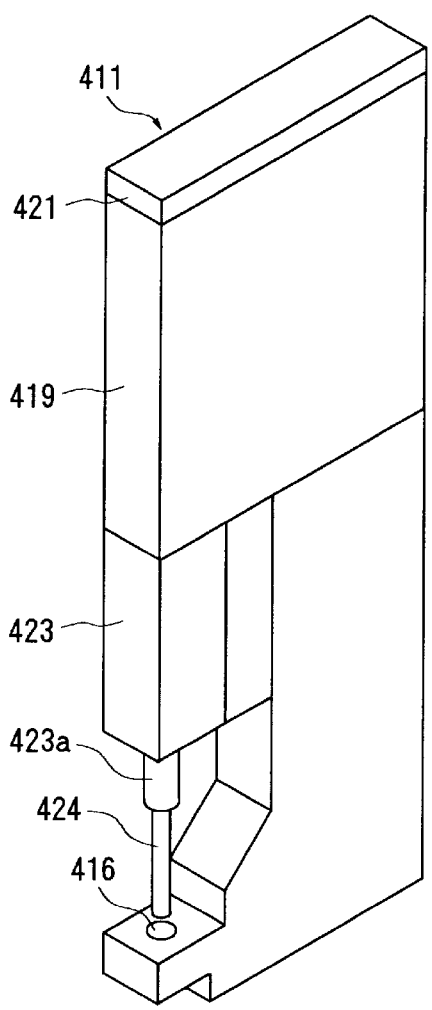
FIG. 30(A) is a perspective view showing a magazine according to a third embodiment of the present invention.
FIG. 30(B) is a longitudinal sectional view showing a magazine according to a third embodiment thereof.
Figure 30:
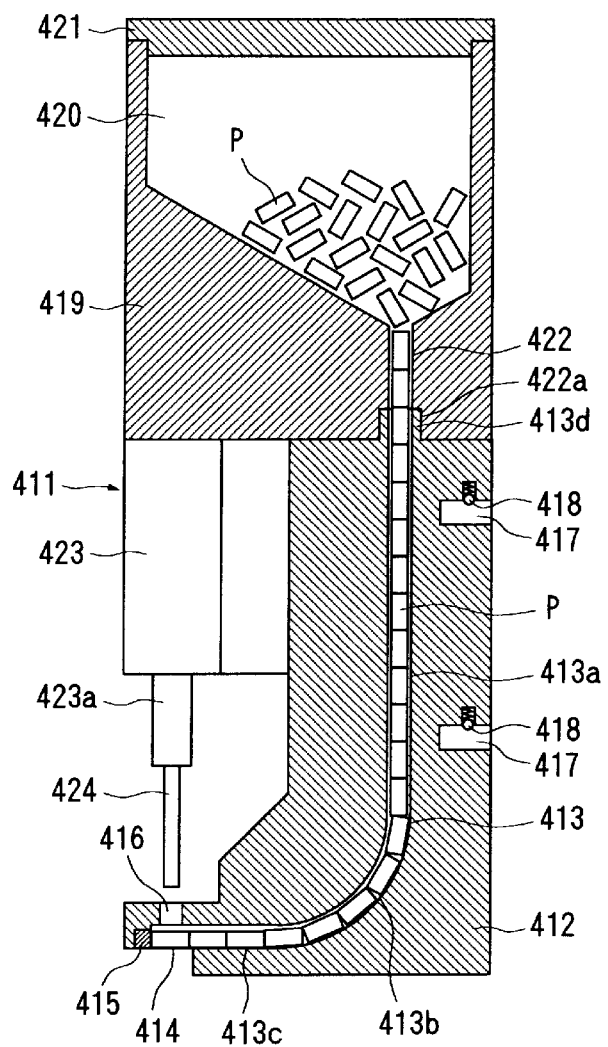

FIG. 29 shows a partial modification of the apparatus according to the second embodiment.

FIG. 29 shows a modification of the foregoing magazine 211, and this magazine 301 has a housing passage 302 of a shape, in which a vertical passage 302a, a curved passage 302b and a horizontal passage 302c have been made continuous, therein. In this housing passage 302, a plurality of the same type of electronic components P having a shape of a square pillar are housed in a longitudinally lined-up state. The shape of the cross-section of the housing passage 302 is a rectangle slightly larger than the shape of the end face of the housed component P, and the housed component P is capable of moving downward longitudinally by its own weight in the housing passage 302. The top end of the housing passage 302 is opened on the top surface of the magazine 301, and at the opening, there is provided a cylindrical portion 303 which is detachably connected to a chute tube 226. Also, on the undersurface of the housing passage 302 at the tip end portion (tip end portion of the horizontal passage 302c), there is formed a discharge port 304, through which an electronic component P at the head within the housing passage 302 can be discharged in a horizontally-oriented state. Further, on the front wall of the housing passage 302 at the tip end portion, a magnet 305 consisting of rare earth permanent magnet is embedded so that either N-pole or S-pole is in contact with the end face of the lead component P. In other words, the lead electronic component P within the housing passage 302 is attracted by this magnet 305, and is prevented from naturally falling from the discharge port 304. By the way, the lead component P can be sucked and held in the same manner even if vacuum ports are provided in place of the magnet 305. Furthermore, on the top wall of the housing passage 302 at the tip end portion, an insertion opening 306, into which a suction nozzle 310 to be described later is inserted, is provided to face the center of the top face of the lead component P each other. On the back surface of the magazine 301, there are provided two mounting holes 307 for mounting pins 255 at a spacing vertically, inside of each of which there is provided a spring-biased ball 308 which engages with a ring-shaped concave portion 255a of the mounting pin 255.

Also, on the front of the magazine 301, there is vertically provided a cylinder 309, and on the rod 309a of the cylinder 309, there is provided a suction nozzle 310 so that the center thereof and that of the insertion opening 306 coincide with each other as viewed from above. To the rod 309a of the cylinder 309, there is mounted a bearing member 311 which allows the rod 309a to vertically move, and which is rotatable together with the rod 309a. This bearing member 311 can be rotated in a forward or reverse direction by an actuator 312 such as a motor provided on the front of the magazine 301. More specifically, the rod 309a of the cylinder 309 moves up and down so that it passes through the bearing member 311, and the bearing member 311 is rotated by the actuator 312, whereby the rod 309a rotates together with the bearing member 311. Although not shown, to suction/exhaust ports for the cylinder 309 and the suction nozzle 310, piping from an air circuit equipped with a vacuum pump and the like is connected when the magazine 301 is mounted to the head 251. To the input/output terminal for the actuator 312, a connector from the power supply circuit is connected when the magazine 301 is mounted to the head 251.

When it is necessary to change the orientation of the electronic component P on mounting it on the substrate 281, at a point of time whereat the electronic component P has been pushed out downward from the discharge port 304 of the magazine 301 by the suction nozzle 310, the bearing member 311 is rotated by a predetermined angle by the actuator 312, whereby the rod 309a and the suction nozzle 310 are rotated by a predetermined angle, and thereafter the electronic component P can be loaded on the substrate 281. The mounting orientation of the electronic component P can be adjusted to any arbitrary angle by adjusting the rotation angle of the bearing member 310 using the actuator 312.

Of course, the modifications shown in FIGS. 15 to 20 can be appropriately applied to an apparatus according to the foregoing second embodiment. Also, since the cylinder 219 and the suction nozzle 220 are made integral with the magazine 211 in the second embodiment, no problem occurs in the operation even if the suction nozzle 220 is not completely extracted from the insertion opening 216 when the rod 219a has been raised.

FIGS. 30 to 37 show a third embodiment of the electronic component placing apparatus according to the present invention. In FIGS. 30 to 37, a reference numeral 402 denotes a head supporting portion, 411 denotes a storage unit integral type magazine, 431 denotes a rack, 441 denotes a magazine mounting mechanism, 451 denotes a head, 461 denotes conveying rails, 471 denotes a table, and 481 denotes a substrate. In this respect, the present third embodiment also comprises the same base and rack moving mechanism as in the first embodiment, but these are not shown in the drawings.

The magazine 411 has, as shown in FIGS. 30(A) and 30(B), structure in which a storage section 419 is coupled to a magazine section 412 thereon.

Within the magazine section 412, there is formed a housing passage 413 of a shape, in which a vertical passage 413a, a curved passage 413b and a horizontal passage 413c have been made continuous. In this housing passage 413, a plurality of the same type of electronic components P having a shape of a square pillar are housed in a longitudinally lined-up state. The concrete types and shapes of these electronic components P are as described in the first embodiment. The shape of the cross-section of the housing passage 413 is a rectangle slightly larger than the shape of the end face of the housed component P, and the housed component P is capable of moving downward longitudinally by its own weight in the housing passage 413. The top end of the housing passage 413 is opened on the top end of the magazine section 412, and at the opening, there is formed a cylindrical portion 413d which is fitted in a connected concave portion 422a in the storage section 419. Also, on the undersurface of the housing passage 413 at the tip end portion (tip end portion of the horizontal passage 413c), there is formed a discharge port 414, through which an electronic component P at the head within the housing passage 413 can be discharged in a horizontally-oriented state. Further, on the front wall of the housing passage 413 at the tip end portion, a magnet 415 consisting of rare earth permanent magnet is embedded so that either N-pole or S-pole is in contact with the end face of the lead component P. In other words, the lead electronic component P within the housing passage 413 is attracted by this magnet 415, and is prevented from naturally falling from the discharge port 414. By the way, the lead component P can be sucked and held in the same manner even if vacuum ports are provided in place of the magnet 415. Furthermore, on the top wall of the housing passage 413 at the tip end portion, an insertion opening 416, into which a suction nozzle 424 to be described later is inserted, is provided to face the center of the top face of the lead component P each other. On the back surface of the magazine section 412, there are provided two mounting holes 417 for mounting pins 455 to be described later at a spacing vertically, inside of each of which there is provided a spring-biased ball 418 which engages with a ring-shaped concave portion 455a of the mounting pin 455.

Within the storage section 419, there is formed a storage chamber 420 equipped with an inclined base, and the storage chamber 420 is covered with a lid 421 so that its top face aperture can be freely opened or closed. In this storage chamber 420, there are stored a multiplicity of the same type of electronic components P having a shape of a square pillar in bulk. The concrete types and shapes of these electronic components P are as described in the first embodiment. Also, a through-hole 422 is formed on the base of the storage chamber 420, and at the lower portion of the through-hole 422, there is formed a connected concave portion 422a, in which the cylindrical portion 413d of the magazine section 412 is fitted. The shape of the cross-section of the through-hole 422 is a rectangle slightly larger than that of the end face of the stored component P, and coincides with the shape of the cross-section of the housing passage 413. The stored components P within the storage chamber 420 are subjected to vibration or the like when the rack 431 laterally moves, and are taken one piece at a time longitudinally into the top end aperture of the through-hole 422 to move downward by its own weight in the through-hole 422 and the housing passage 413.

On the front of the magazine 411, a cylinder 423 is vertically provided, and on the rod 423a of the cylinder 423, there is provided a suction nozzle 424 so that the center thereof coincides with that of the insertion opening 416 as viewed from above.

By the way, the entire magazine 411 or the side portions of the storage chamber and the housing passage are preferably formed by transparent or semi-transparent material so that the storage state and the housing state of the electronic components P can be confirmed from the outside. Although not shown, to the suction/exhaust ports for the cylinder 423 and the suction nozzle 424, piping from an air circuit equipped with a vacuum pump and the like is connected when the magazine 411 is mounted to the head 451 to be described later.

Figure 31:
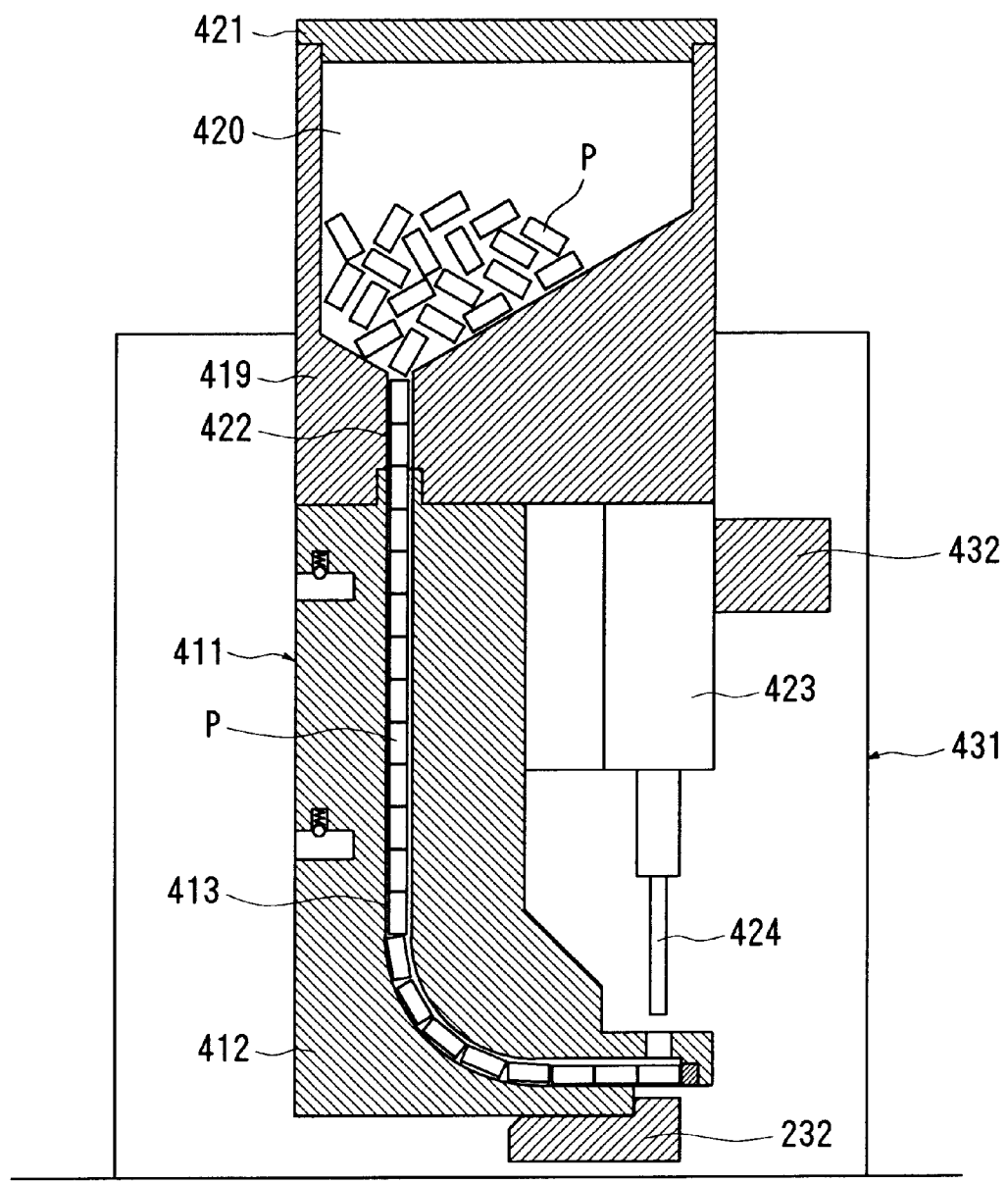
FIG. 31 is a longitudinal sectional view showing the magazine and a rack according to the third embodiment.

The rack 431 is arranged on the base. As shown in FIG. 31, on this rack 431, there are provided two upper and lower magazine holders 432 for detachably holding a plurality of magazines 411 in a sideways-arranged state. Also, although not shown, on the base of the rack 431, there are in parallel provided slide guides such as rollers, which movably engage with guide rails for the rack moving mechanism.

In a plurality of storage chambers 420 for magazines 411 provided on the rack 431, there are stored different types of electronic components P having a shape of a square pillar respectively. Of course, the same type of electronic components P may be stored in two or more magazines 411. The concrete types and shapes of the electronic components P are as described in the first embodiment.

In a magazine 411 according to the present third embodiment, the electronic components P are replenished from the storage chamber 420 to the housing passage 413 at all times because the magazine 411 has the structure in which the storage section 419 is coupled to the magazine section 412 on top thereof as described previously. In this respect, as in the case of the first embodiment, the number of the magazines 411 provided on the rack 431 may be increased or decreased as required.

A rack moving mechanism (not shown) is, as in the case of the first embodiment, arranged under the foregoing rack 431 on the base. This rack moving mechanism is provided with two straight-line guide rails with which the slide guides of the foregoing rack 431 movably engage; a nut fixed to the base of the foregoing rack 431; a ball thread with which the nut is threadably engaged; and a motor for rotationally driving the ball thread in a forward or reverse direction. In other words, the ball thread is rotationally driven in a forward or reverse direction by the motor, whereby the foregoing rack 431 linearly moves along the guide rails in the direction in which the magazines 411 are lined up.

Figure 32:
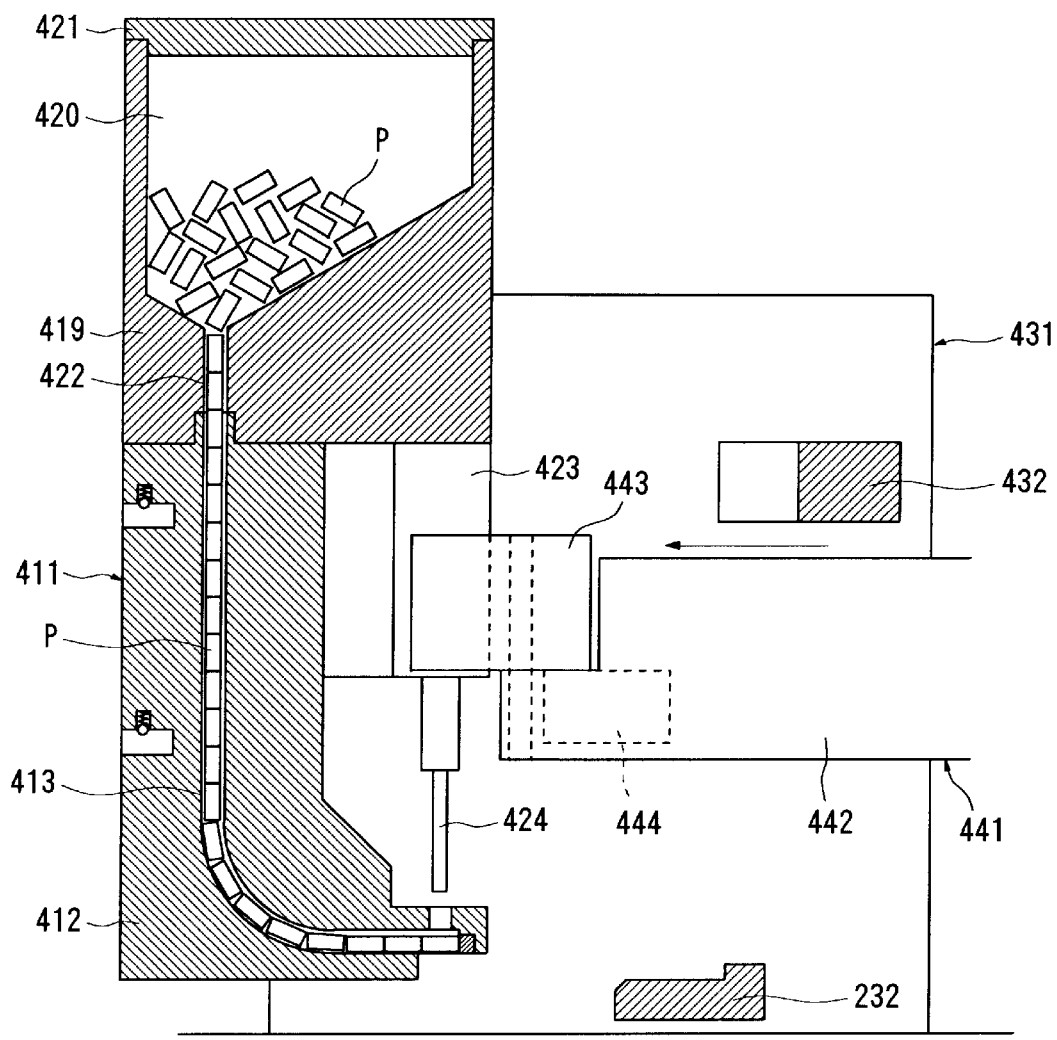
FIG. 32 is a plan view showing an aspect in which the magazine is extracted from the rack in the third embodiment.
Figure 33:
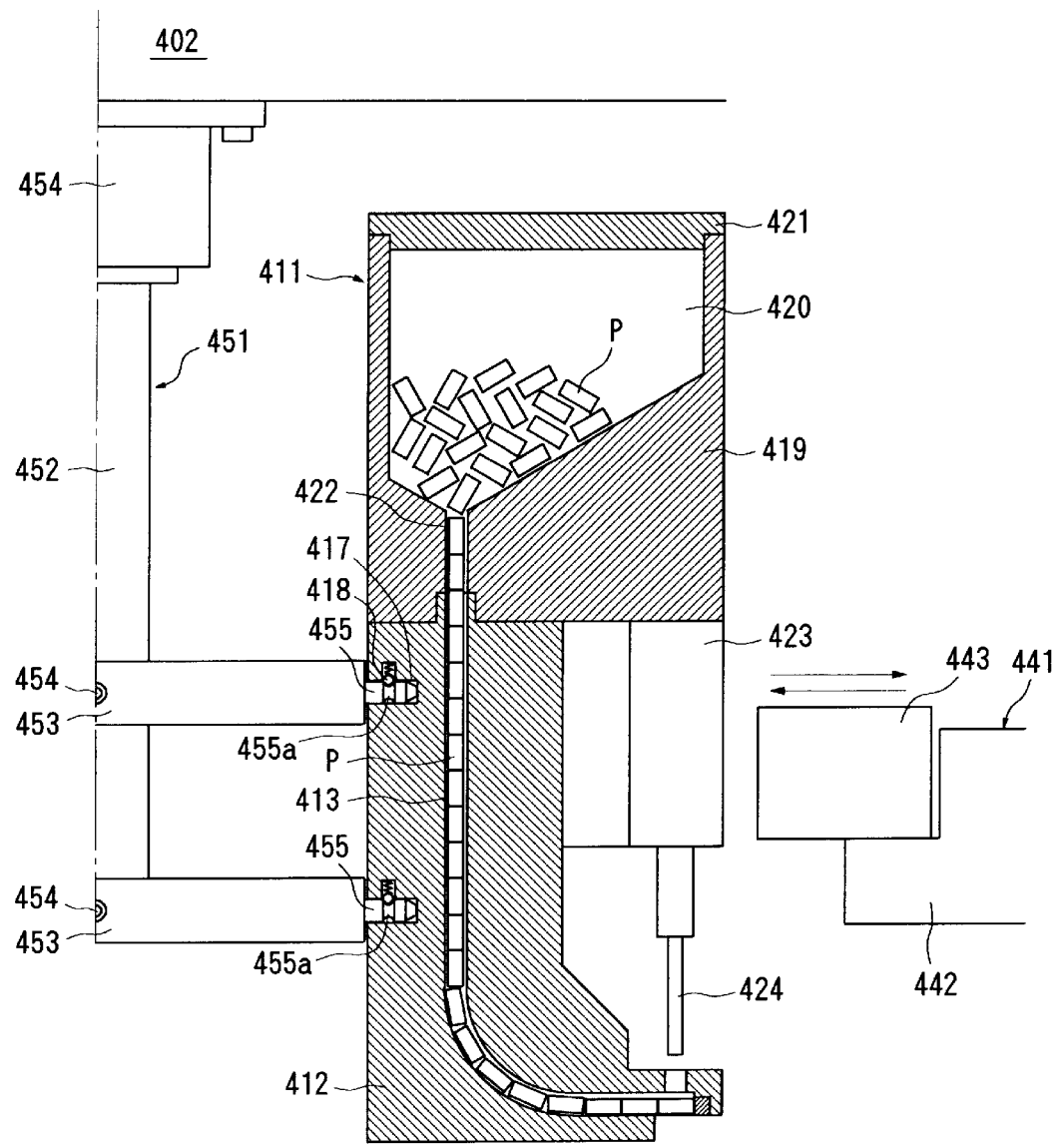
FIG. 33 is a side view showing an aspect in which the magazine is mounted to a head in the third embodiment.

The magazine mounting mechanism 441 is, as in the case of the first embodiment, arranged behind the foregoing rack 431 on the base. As shown in FIGS. 32 and 33, this magazine mounting mechanism 441 is provided with a rod 442 capable of advancing and retracting by an actuator (not shown) such as a cylinder and a motor, and a chuck 443 provided at the tip end of the rod 442. The chuck 443 is of a two-pawl type, and is open-close driven by an actuator 444 such as a cylinder and a motor. The shape of the chuck 443 is consistent with the back surface side (cylinder portion) of the magazine 411, and the back surface portion of the magazine 411 can be grasped by a close operation.

Figure 34:
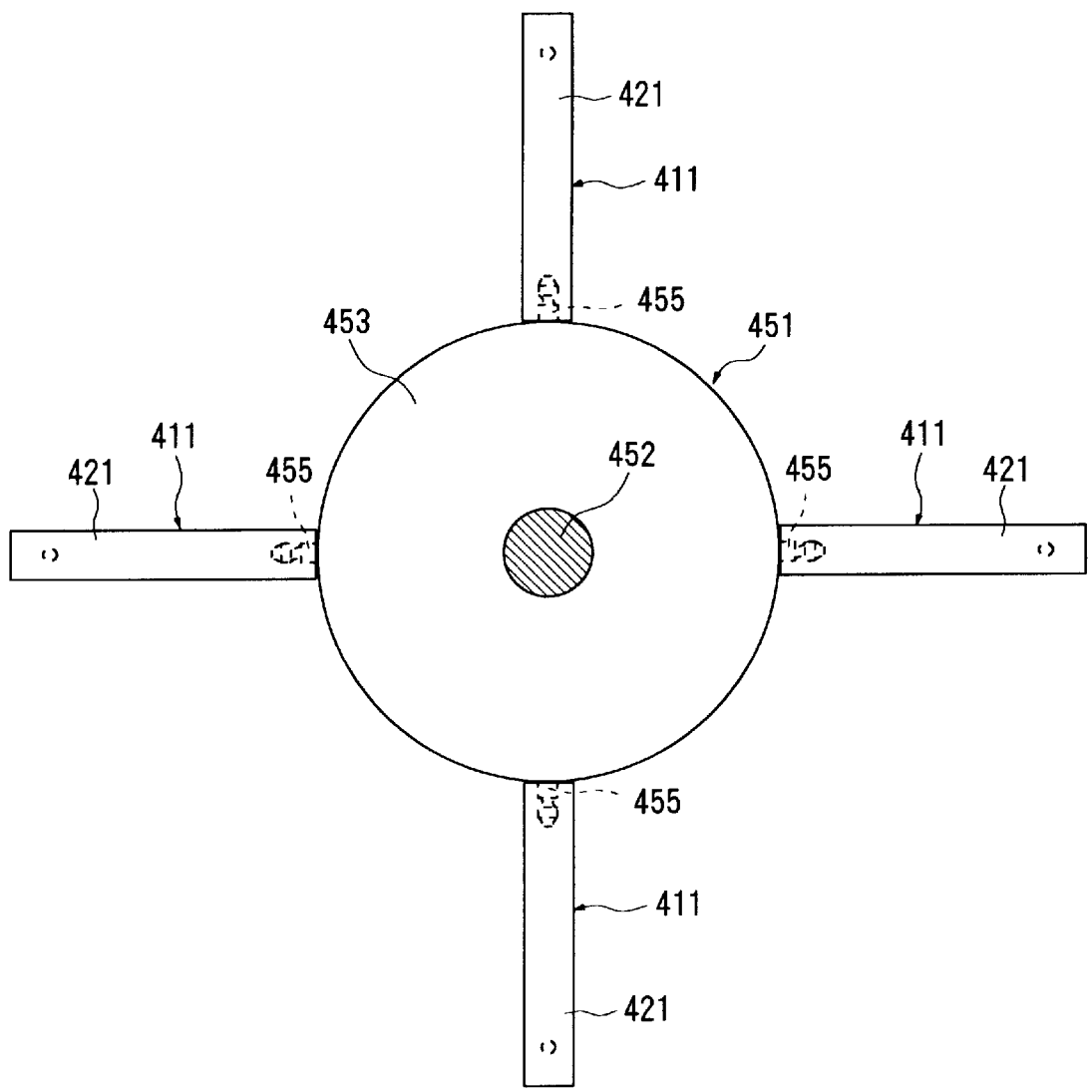
FIG. 34 is a plan view showing an aspect in which four magazines have been mounted to the head in the third embodiment.

The head 451 is arranged on the head supporting portion 402. As shown in FIGS. 33 and 34, this head 451 comprises a shaft 452; two disks 453 fixed to the shaft 452 at a spacing vertically; a motor 454 fixed to the head supporting portion 402, for rotationally driving the shaft 452 in a forward or reverse direction; and magazine mounting pins 455 provided at intervals of 90° on the peripheral surfaces of these two disks 453. Each mounting pin 455 has an acute shape, and has a ring-shaped concave portion 455a, with which a ball 418 provided for a mounting hole 417 in the magazine 411 engages. In this connection, the head supporting portion 202 for supporting the head 451 is fixed to a strut (not shown) vertically installed on the base.

Figure 35:
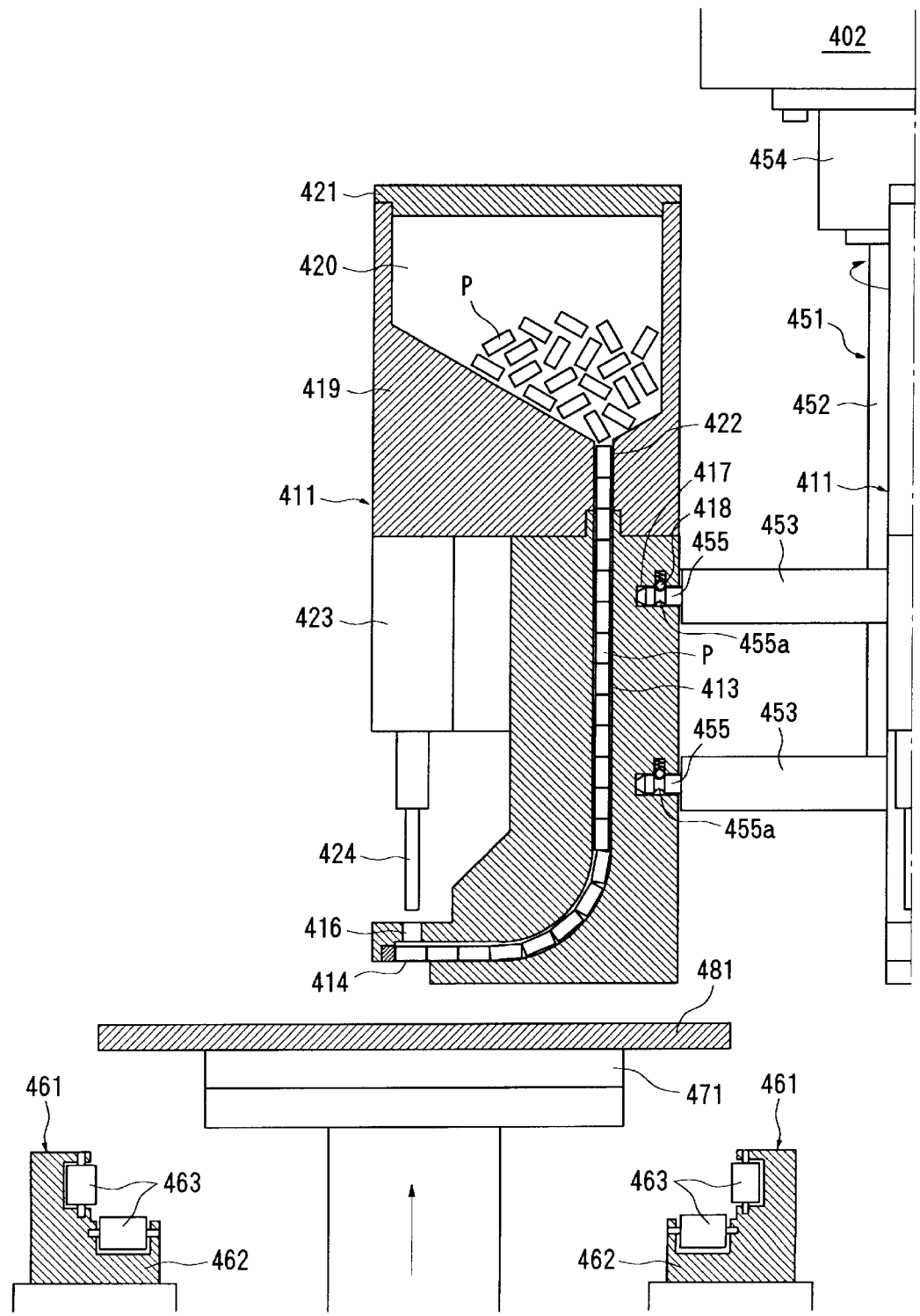
FIG. 35 is a side view showing an aspect in which the electronic component is loaded on the substrate in the third embodiment.

Conveying rails 461 are arranged at a position adjacent to the base. As shown in FIG. 35, the conveying rails 461 are in parallel to the moving direction of the rack 431, and convey a substrate 481 on which to be placed, in parallel to the direction in which the magazines are lined up. This conveying rail 461 comprises a L-shaped rail body 462, and a plurality of rollers 463 arranged at equal intervals along the length on the base and on the side of the inner side of the rail body 462. The plurality of rollers 463 provided along the rail body 462 can be rotated by a motor (not shown), and the substrate 481 placed on the rollers 463 is conveyed by this rotating force.

The table 471 is arranged in the vicinity of the foregoing head 451 between the foregoing conveying rails 461. As shown in FIG. 35, this table 481 is capable of moving up and down and moving in the XY direction (See FIG. 1). On the top surface of the table 471, there are provided a multiplicity of vacuum ports (not shown) so that the substrate 481 can be held by applying negative pressure to the vacuum ports using a vacuum pump or the like.

The operation of the apparatus of the foregoing third embodiment will be described.

In a state in which any magazine 411 is not mounted to the head 451, the rack 431 is first moved by a rack moving mechanism (not shown) to allow a magazine 411 to be first mounted to accurately face the chuck 443 of the magazine mounting mechanism 441. Then, as shown in FIG. 32, the rod 442 of the magazine mounting mechanism 441 is advanced toward the head 451, and when the chuck 443, which is in an open state, abuts upon the back surface of the magazine 411, the chuck 443 is closed to grasp the back surface side of the magazine 411. Further, the rod 442 is advanced to extract the magazine 411 from the magazine holder 432.

When the rod 442 of the magazine mounting mechanism 441 is further advanced after the magazine 411 is extracted from the magazine holder 432, two mounting pins 455 of the head 451 are fitted into two mounting holes 417 in the magazine 411 at the same time as shown in FIG. 33. The mounting of the magazine 411 into the head 451 is completed when a spring-biased ball 418 engages with a ring-shaped concave portion 455a of the mounting pin 455. After the completion of the mounting, the chuck 443 of the magazine mounting mechanism 441 is opened to retract the rod 442, and the chuck 443 is caused to return to the initial position.

After the first magazine 411 is mounted, the head 451 is rotated 90° in a clockwise direction or in a counter-clockwise direction as viewed from above by the motor 454. At the same time, the rack 431 is moved by the rack moving mechanism to allow a second magazine 411 to be mounted to accurately face the chuck 443 of the magazine mounting mechanism 441. Then, the rod 442 of the magazine mounting mechanism 441 is advanced to grasp the back surface side of the magazine 411 with the chuck 443. The rod 442 is further advanced to extract the magazine 411 from the magazine holder 432, and two mounting pins 455 of the head 451 are fitted into the two mounting holes 417 of the magazine 411 extracted for mounting. After the completion of the mounting, the chuck 443 of the magazine mounting mechanism 441 is opened to retract the rod 442, and the chuck 443 is caused to return to the initial position. By repeating the foregoing operation, the third and fourth magazines 411 will also be mounted to the head 451 in order (See FIG. 34).

In a process of mounting the magazine 411 to the head 451, the substrate 481 is conveyed to an operating position, where the component is loaded, by the conveying rails 461. When the substrate 481 is carried in at the operating position, the table 471 moves up by a predetermined stroke, and the substrate 481 on the conveying rails 461 is lifted upwardly by the table 471 to leave the conveying rails 461 as shown in FIG. 35. The substrate 481, which moves up together with the table 471, is held to the table 471 by negative pressure acting on the vacuum ports.

In a state in which four magazines 411 are mounted to the head 451, four types of electronic components P at maximum can be selectively loaded on the substrate 481. Of course, if five or more magazines 411 are radially mounted on the head 451, a wide variety of electronic components P can be selectively loaded on the substrate 481 extending the range of component selections.

When loading the electronic components P on the substrate 481, the head 451 is rotated so that a magazine 411 for housing an electronic component P to be loaded faces the substrate 481 as shown in FIG. 35. Subsequently, the table 471 is moved in the XY direction so that the discharge port 414 of this magazine 411 accurately faces a component loading point on the substrate 481.

Figure 36:
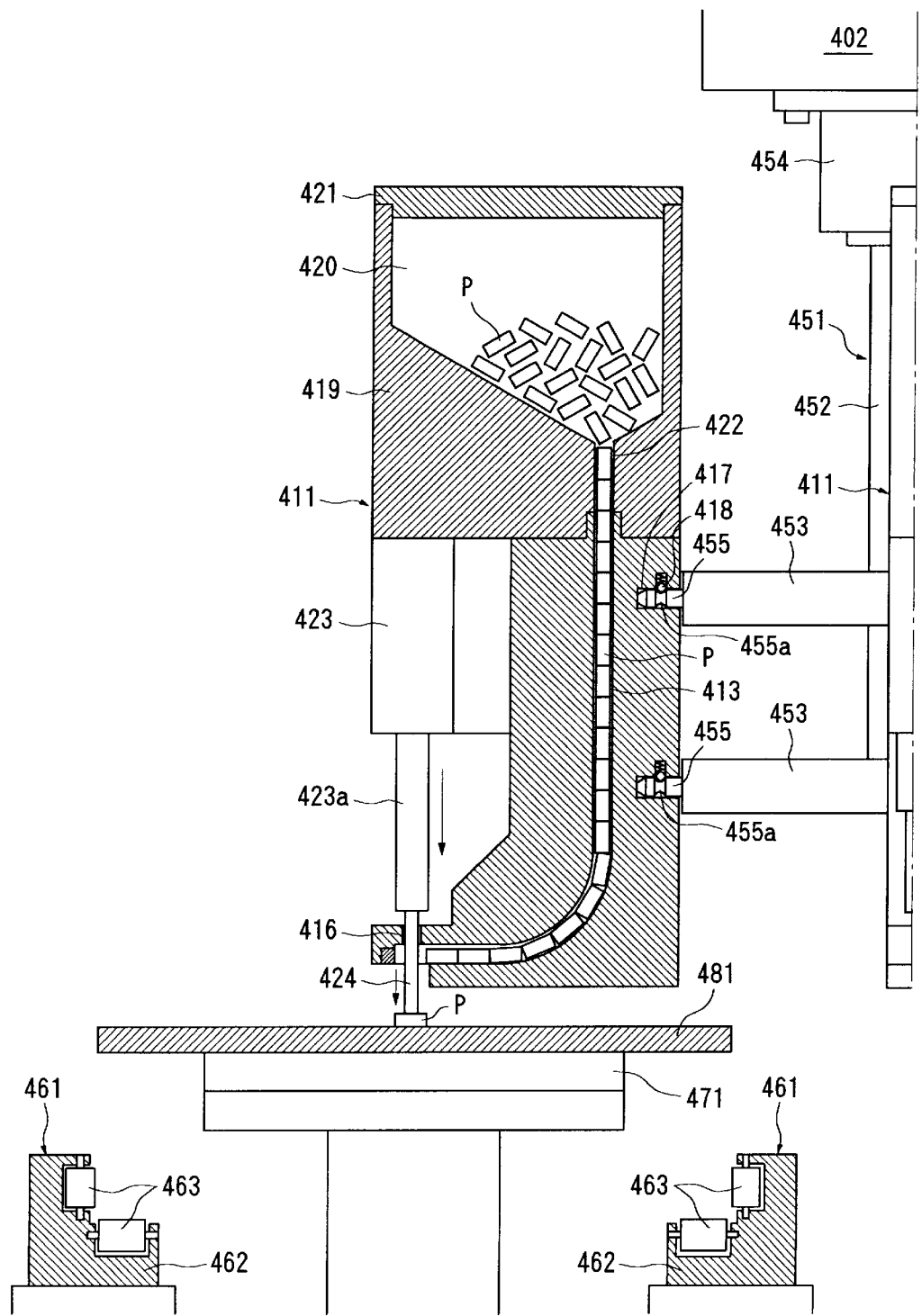
FIG. 36 is a side view showing an aspect in which the electronic component is loaded on the substrate in the third embodiment.

As shown in FIG. 36, the rod 423a is caused to lower by the cylinder 423, and the suction nozzle 424 is inserted into the insertion opening 416 in the magazine 411 while negative pressure is being applied to the suction nozzle 424.

Thus, the lead electronic component P attracted and held by the magnet 415 is sucked by the suction nozzle 424, moves downward together with the suction nozzle 424 in such a sucked state against the magnetic force of the magnet 415, and one electronic component P is pushed out from the discharge port 214 in a horizontally-oriented state. The electronic component P pushed out from the discharge port 414 of the magazine 411 further lowers together with the suction nozzle 424 still in the sucked state to the substrate 481.

Since the component loading point of the substrate 481, for example, the land and the like are coated with viscous cementing material such as cream solder in advance in conformity with the external electrode of the electronic component P, the electronic component P, which has reached the substrate 481, adheres to the substrate 481 through this viscous cementing material. The spacing between the suction nozzle 424 and the insertion opening 414 in the magazine 411 and the spacing between the discharge port 414 of the magazine 411 and the substrate 481 can be set in advance and therefore, if the downstroke of the suction nozzle 424 is determined in advance on the basis of these spacings, there is no possibility that the electronic component P loaded on the substrate 481 is pressed against the substrate 481 by pressure more than necessary.

Figure 37:
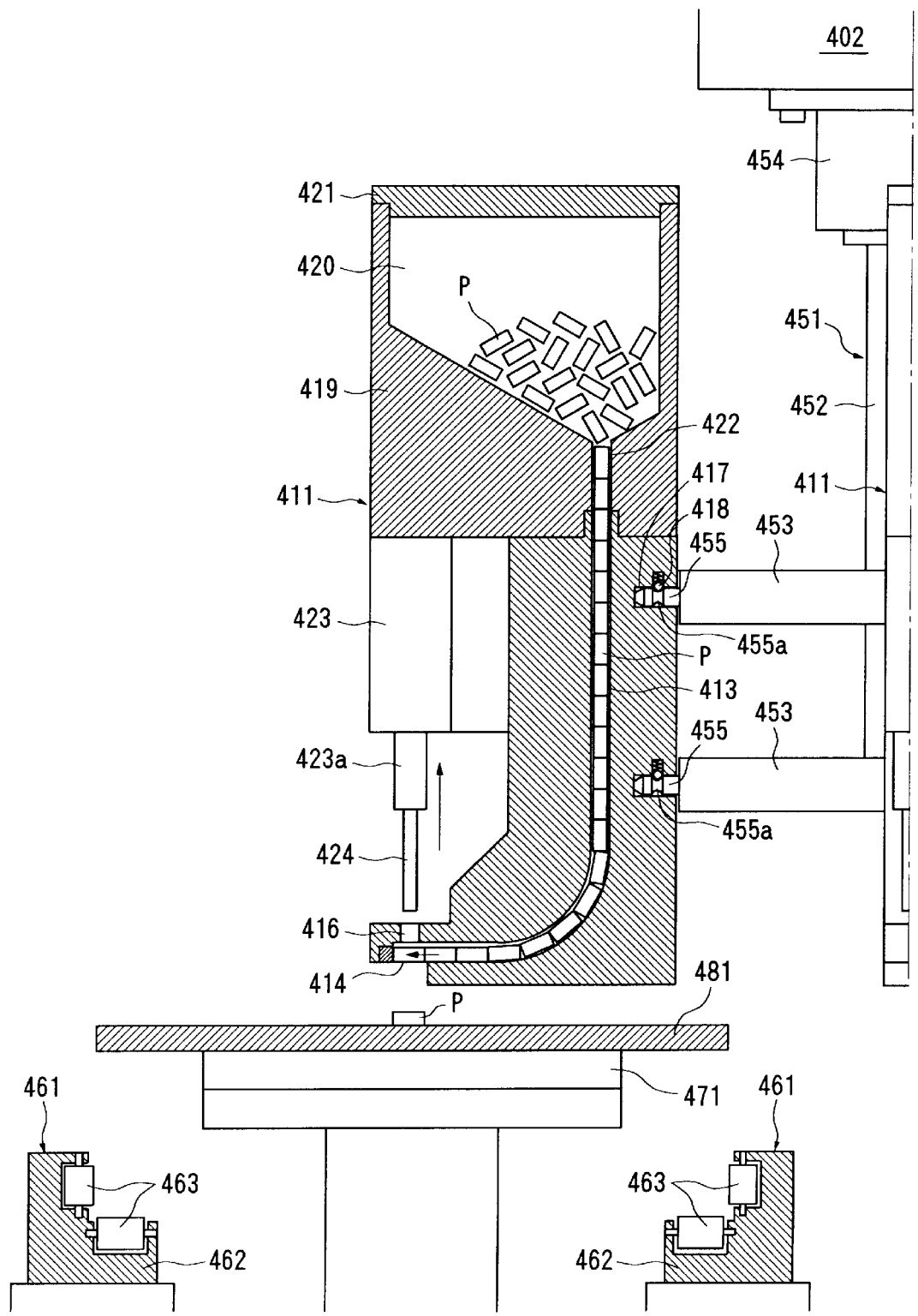
FIG. 37 is a side view showing an aspect in which the electronic component is loaded on the substrate in the third embodiment.

After the completion of the loading, as shown in FIG. 37, the negative pressure action of the suction nozzle 424 is released or is switched to a positive pressure action, and thereafter, the rod 423a is raised by the cylinder 423 to return the rod 423a and the suction nozzle 424 to the initial position. When the suction nozzle 424 is extracted from the insertion opening 416 in the magazine 411, the housed component P within the housing passage 413 moves downward by its own weight, and a next lead electronic component P is attracted and held by the magnet 415, and is in a standby state for being discharged again.

When loading an electronic component P housed in another magazine 411 other than the foregoing one on the substrate 481 successively, the head 451 is rotated, as in the case of the foregoing, so that the magazine 411 housing an electronic component P to be loaded faces the substrate 481 each other, and the table 481 is moved in the XY direction so that the discharge port 414 in the magazine 411 accurately faces the component loading point on the substrate 481. The rod 423a is caused to lower by the cylinder 423, and the suction nozzle 424 can be inserted into the insertion opening 416 in the magazine 411 while negative pressure is being applied to the suction nozzle 424 to push out the lead electronic component P from the discharge port 414.

A plurality of electronic components P are housed in each of the housing passages 413 for four magazines 411 mounted to the head 451, and the stored components P within the storage chamber 420 are replenished to each housing passage 413 at all times. Therefore, the same magazine 411 can be repeatedly used until the stored components P and the housed components P are exhausted to load the components on the substrate 481.

If such a need arises as to load an electronic component P, on the substrate 481, other than electronic components housed in four magazines 411 mounted to the head 451, the head 451 is rotated so that a magazine 411 to be replaced faces the rack 431, and at the same time, the rack 431 is moved by the rack moving mechanism so that this magazine 411 accurately faces the holding position thereof. After the magazine 411 of the head 451 accurately faces the holding position of the rack 431 corresponding to this magazine 411, the rod 442 of the magazine mounting mechanism 441 is advanced, and when the chuck 443, which is in an open state, abuts upon the back surface of the magazine 411, the chuck 443 is closed to grasp the back surface side of the magazine 411. Further, the rod 442 is advanced to extract the magazine 411 from the magazine holder 432.

Then, the rod 442 of the magazine mounting mechanism 441 is retracted to remove the magazine 441 to be replaced from the head 451, and the rod 442 is further retracted to insert the magazine 411 into the magazine holder 432 for holding. Thereafter, the chuck 443 of the magazine mounting mechanism 441 is opened to retract the rod 442, and the chuck 443 is caused to return to the initial position.

Next, the rack 431 is moved by the rack moving mechanism to cause a new magazine 411 to be mounted to accurately face the chuck 443 of the magazine mounting mechanism 441, and the rod 442 of the magazine mounting mechanism 441 is advanced to grasp the back surface side of the magazine 411 with the chuck 443. The rod 442 is further advanced to extract the magazine 411 from the magazine holder 432, and two mounting pins 455 of the head 451 are fitted into the two mounting holes 417 in the magazine 411 thus extracted for mounting. This magazine replacement can be performed even during component loading.

When predetermined numbers and types of electronic components P are loaded on the substrate 481 as described above, the table 481 lowers, the negative pressure action of the vacuum ports is released or is switched to a positive pressure action, the substrate 481 rides on the conveying rails 461, and the table 471 leaves the substrate 481. The substrate 481 with components loaded thereon is fed forward by the conveying rails 461, and the new substrate 481 is conveyed to an operating position, where the component is loaded, by the conveying rails 471. Thereafter, the same component loading as the foregoing is repeated.

As described above, according to an apparatus of the third embodiment, a plurality of magazines 411 are mounted to the head 451, and yet, a plurality of electronic components P are housed in each magazine 411. Therefore, by an operation of selectively inserting the suction nozzle 424 into insertion openings 416 in a plurality of magazines 411, it is possible to load a desired electronic component P on the substrate 481, and to repeatedly perform this component loading until the housed components P are exhausted.

It does not take much time to load one electronic component P on the substrate, and yet the magazine can be selected within a short time by the head rotation. Therefore, a period of time required to load a predetermined number and type of electronic components P on the substrate 481 can be greatly shortened, thus making it possible to improve the productivity by speeding up the operation.

In the drawings, the maximum number of the magazines 411 mountable to the head 451 is four, but a wide variety of electronic components P will be able to be selectively loaded on the substrate 481 if five or more magazines 411 are arranged so as to be able to be mounted to the head 451. In other words, even if a wide variety of electronic components P are loaded on the substrate 481, the components can be loaded on the substrate 481 at high speed using only the magazines 411 mounted to the head 451.

Also, since the storage chamber 420 for storing a multiplicity of electronic components P in bulk is integrally provided for the magazine 411, the electronic components P can be replenished from the storage chamber 420 to the housing passage 413 at all times, whereby the number of the electronic components P which can be loaded by one magazine 411 can be greatly increased.

Further, since the magazine 411 mounted to the head 451 can be arbitrarily replaced with another magazine 411 held by the rack 431, component loading on the substrate 481 can be exactly performed even when a wide variety of electronic components P are loaded on the substrate 481, and even if the type of the substrate 481 is changed.

Furthermore, the foregoing magazine replacement can be performed during component loading, and yet it is not necessary to suspend the component loading in order to replace the magazine, and therefore, the operation efficiency is not deteriorated by the magazine replacement.

Moreover, since a suction nozzle 424 and a cylinder 423 for vertically moving it are provided for each of the magazines 411, the structure of the head 451 itself can be simplified to reduce its weight.

Moreover, since the substrate 481 carried in at the operating position by the conveying rails 461 is supported by the table 471 and the electronic components P are arranged to be loaded on this substrate 481, component loading on each substrate 481 can be performed in order in a process of continuously conveying a plurality of substrates 481 by the conveying rails 461.

Moreover, since a table movable in the XY direction is used as a table 471 for supporting the substrate 481, the component loading position can be appropriately aligned by moving the table 471 in the two-dimensional direction.

Figure 38:
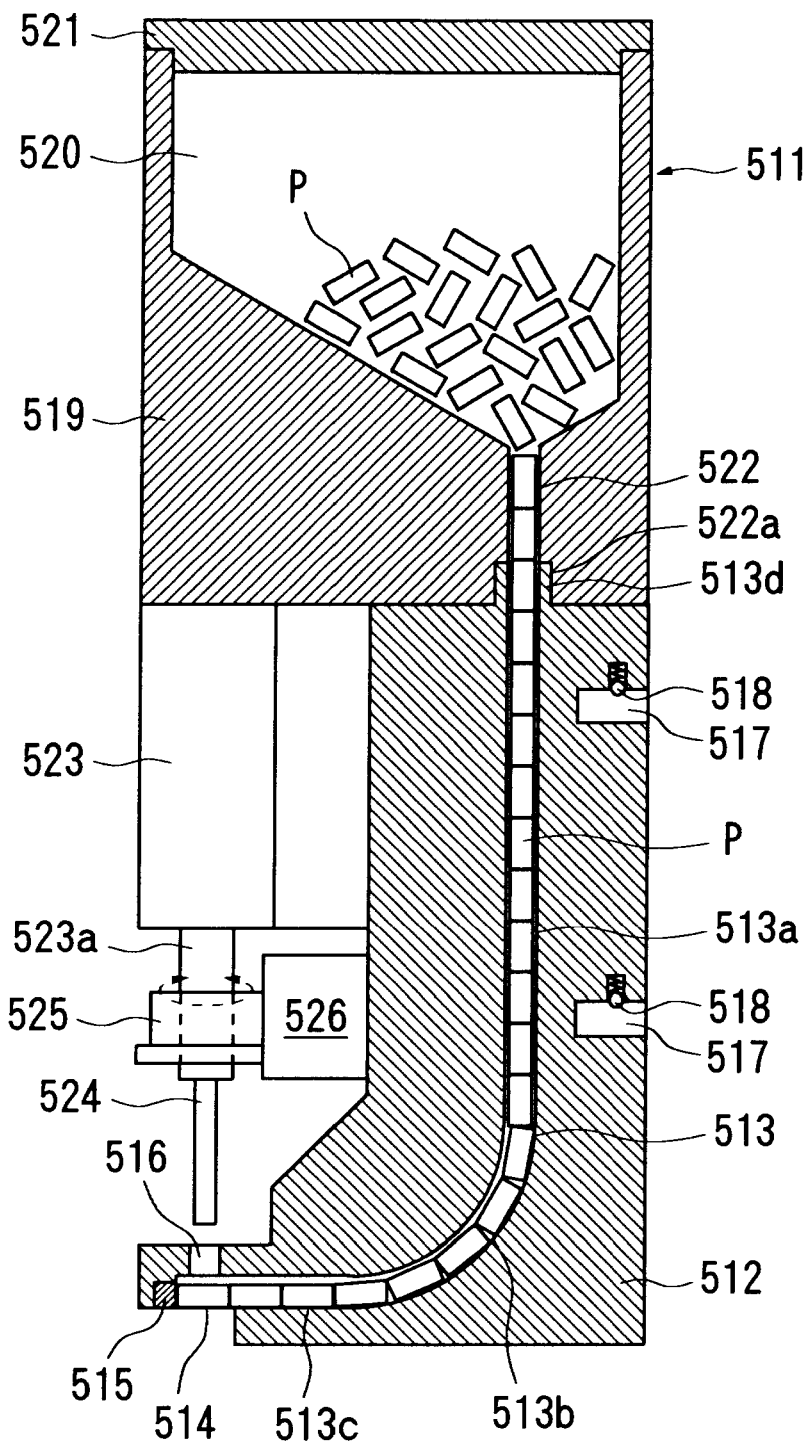
FIG. 38 is a longitudinal sectional view showing a modification of the magazine according to the third embodiment.
Figure 39:
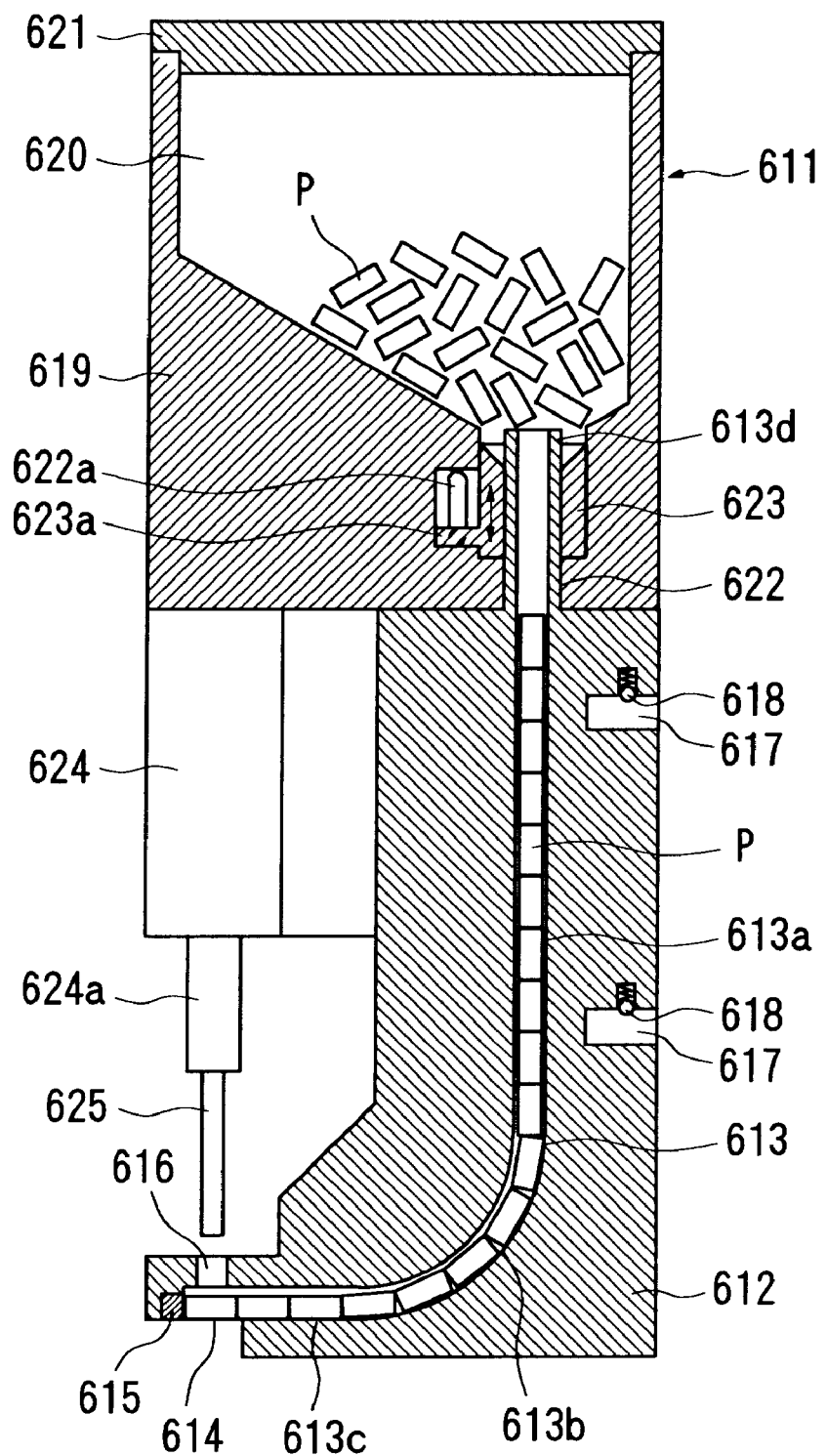
FIG. 39 is a longitudinal sectional view showing a modification of the magazine according to the third embodiment.

FIGS. 38 and 39 show partial modifications of the apparatus according to the third embodiment.

FIG. 38 shows a modification of the forgoing magazine 411, and this magazine 511 has, as in the case of the foregoing magazine 411, structure in which the storage section 519 is integrally provided on the magazine section 512.

Within the magazine section 512, there is formed a housing passage 513 of a shape, in which a vertical passage 513a, a curved passage 513b and a horizontal passage 513c have been made continuous. In this housing passage 513, a plurality of the same type of electronic components P having a shape of a square pillar are housed in a longitudinally lined-up state. The shape of the cross-section of the housing passage 513 is a rectangle slightly larger than the shape of the end face of the housed component P, and the housed component P is capable of moving downward longitudinally by its own weight in the housing passage 513. The top end of the housing passage 513 is opened on the top end of the magazine section 512, and at the opening, there is formed a cylindrical portion 513d which is fitted in a connected concave portion 522a in the storage section 519. Also, on the undersurface of the housing passage 513 at the tip end portion (tip end portion of the horizontal passage 513c), there is formed a discharge port 514, through which an electronic component P at the head within the housing passage 513 can be discharged in a horizontally-oriented state. Further, on the front wall of the housing passage 513 at the tip end portion, a magnet 515 consisting of rare earth permanent magnet is embedded so that either N-pole or S-pole is in contact with the end face of the lead component P. In other words, the lead electronic component P within the housing passage 513 is attracted by this magnet 515, and is prevented from naturally falling from the discharge port 514. By the way, the lead component P can be sucked and held in the same manner even if vacuum ports are provided in place of the magnet 515. Furthermore, on the top wall of the housing passage 513 at the tip end portion, an insertion opening 516, into which a suction nozzle 524 to be described later is inserted, is provided to face the center of the top face of the lead component P each other. On the back surface of the magazine section 512, there are provided two mounting holes 517 for mounting pins 455 at a spacing vertically, inside of each of which there is provided a spring-biased ball 518 which engages with a ring-shaped concave portion 455a of the mounting pin 455.

Within the storage section 519, there is formed a storage chamber 520 equipped with an inclined base, and the storage chamber 520 is covered with a lid 521 so that its top face aperture can be freely opened or closed. In this storage chamber 520, there are stored a multiplicity of the same type of electronic components P having a shape of a square pillar in bulk. Also, a through-hole 522 is formed on the base of the storage chamber 520, and at the lower portion of the through-hole 522, there is formed a connected concave portion 522a, in which the cylindrical portion 513d of the magazine section 512 is fitted. The shape of the cross-section of the through-hole 522 is a rectangle slightly larger than that of the end face of the stored component P, and coincides with the shape of the cross-section of the housing passage 513. The stored components P within the storage chamber 520 are subjected to vibration or the like when the rack 531 laterally moves, and are taken one piece at a time longitudinally into the top end aperture of the through-hole 522 to move downward by its own weight in the through-hole 522 and the housing passage 513.

On the front of the magazine 511, there is vertically provided a cylinder 523, and on the rod 523a of the cylinder 523, there is provided a suction nozzle 524 so that the center thereof and that of the insertion opening 516 coincide with each other as viewed from above. To the rod 523a of the cylinder 523, there is mounted a bearing member 525 which allows the rod 523a to vertically move, and which is rotatable together with the rod 523a. This bearing member 525 can be rotated in a forward or reverse direction by an actuator 526 such as a motor provided on the front of the magazine 511. More specifically, the rod 523a of the cylinder 523 moves up and down so that it passes through the bearing member 525, and the bearing member 526 is rotated by the actuator 526, whereby the rod 523a rotates together with the bearing member 525. Although not shown, to suction/exhaust ports for the cylinder 523 and the suction nozzle 524, piping from an air circuit equipped with a vacuum pump and the like is connected when the magazine 511 is mounted to the head 451. Also, to the input/output terminal for the actuator 526, a connector from the power supply circuit is connected when the magazine 511 is mounted to the head 451.

When it is necessary to change the orientation of the electronic component P on mounting it on the substrate 481, at a point of time whereat the electronic component P has been pushed out downward from the discharge port 514 by the suction nozzle 524, the bearing member 525 is rotated by a predetermined angle by the actuator 526, and thereafter the electronic component P can be loaded on the substrate 481. The mounting orientation of the electronic component P can be adjusted to any arbitrary angle by adjusting the rotation angle of the bearing member 525 using the actuator 526.

FIG. 39 is a modification of the foregoing magazine 411, and this magazine 611 has, as in the case of the foregoing magazine 411, structure in which the storage section 619 is integrally provided on the magazine section 612.

Within the magazine section 612, there is formed a housing passage 613 of a shape, in which a vertical passage 613a, a curved passage 613b and a horizontal passage 613c have been made continuous. In this housing passage 613, a plurality of the same type of electronic components P having a shape of a square pillar are housed in a longitudinally lined-up state. The shape of the cross-section of the housing passage 613 is a rectangle slightly larger than the shape of the end face of the housed component P, and the housed component P is capable of moving downward longitudinally by its own weight in the housing passage 613. The top end of the housing passage 613 is opened at the top end of the magazine section 612, and at the opening, there is formed a cylindrical portion 613d which is fitted in a connected concave portion 622a in the storage section 619. Also, on the undersurface of the housing passage 613 at the tip end portion (tip end portion of the horizontal passage 613c), there is formed a discharge port 614, through which an electronic component P at the head within the housing passage 613 can be discharged in a horizontally-oriented state. Further, on the front wall of the housing passage 613 at the tip end portion, a magnet 615 consisting of rare earth permanent magnet is embedded so that either N-pole or S-pole is in contact with the end face of the lead component P. In other words, the lead electronic component P within the housing passage 613 is attracted by this magnet 615, and is prevented from naturally falling from the discharge port 614. By the way, the lead component P can be sucked and held in the same manner even if vacuum ports are provided in place of the magnet 615. Furthermore, on the top wall of the housing passage 613 at the tip end portion, an insertion opening 616, into which a suction nozzle 624 to be described later is inserted, is provided to face the center of the top face of the lead component P each other. On the back surface of the magazine section 612, there are provided two mounting holes 617 for mounting pins 455 at a spacing vertically, inside of each of which there is provided a spring-biased ball 618 which engages with a ring-shaped concave portion 455a of the mounting pin 455.

Within the storage section 619, there is formed a storage chamber 620 equipped with an inclined base, and the storage chamber 620 is covered with a lid 621 so that its top face aperture can be freely opened or closed. In this storage chamber 620, there are stored a multiplicity of the same type of electronic components P having a shape of a square pillar in bulk. Also, on the base of the storage chamber 620, there is formed a through-hole 622 consisting of a large-diameter upper portion and a small-diameter lower portion, in which a cylindrical portion 613d of the foregoing magazine section 612 is fitted so that its top end substantially coincides with the base. Also, at the large-diameter portion of the through-hole 622, a movable pipe 623 of a predetermined length is vertically movably arranged so as to enclose the circumference of the cylindrical portion 613d. In order to smoothly take the stored components P into the movable pipe 623, the top end edge of the inside hole of the movable pipe 623 is chamfered and rounded. On the peripheral surface of this movable pipe 623, there is formed a projection 623a, which is connected to an actuator (not shown) such as a solenoid provided on the outer surface of the storage section 619 through a slot 622a provided on one side of the through-hole 622. In other words, this movable pipe 623 is driven by the actuator to vertically move so that the top end thereof passes through the top end of the cylindrical portion 613d.

On the front of the magazine 611, a cylinder 624 is vertically provided, and on the rod 624a of the cylinder 624, there is provided a suction nozzle 625 so that the center thereof coincides with that of the insertion opening 616 as viewed from above. Although not shown, to suction/exhaust ports for the cylinder 624 and the suction nozzle 624, piping from an air circuit equipped with a vacuum pump and the like is connected when the magazine 611 is mounted to the head 451. Also, to the input/output terminal for the actuator for the movable pipe, a connector from the power supply circuit is connected when the magazine 611 is mounted to the head 451.

According to this magazine 611, the stored component P can be agitated by vertically moving the movable pipe 623, and this agitation enables the operation of taking the electronic components P within the storage chamber 620 into the top end aperture in the cylindrical portion 613d to be furthered.

Figure 40:
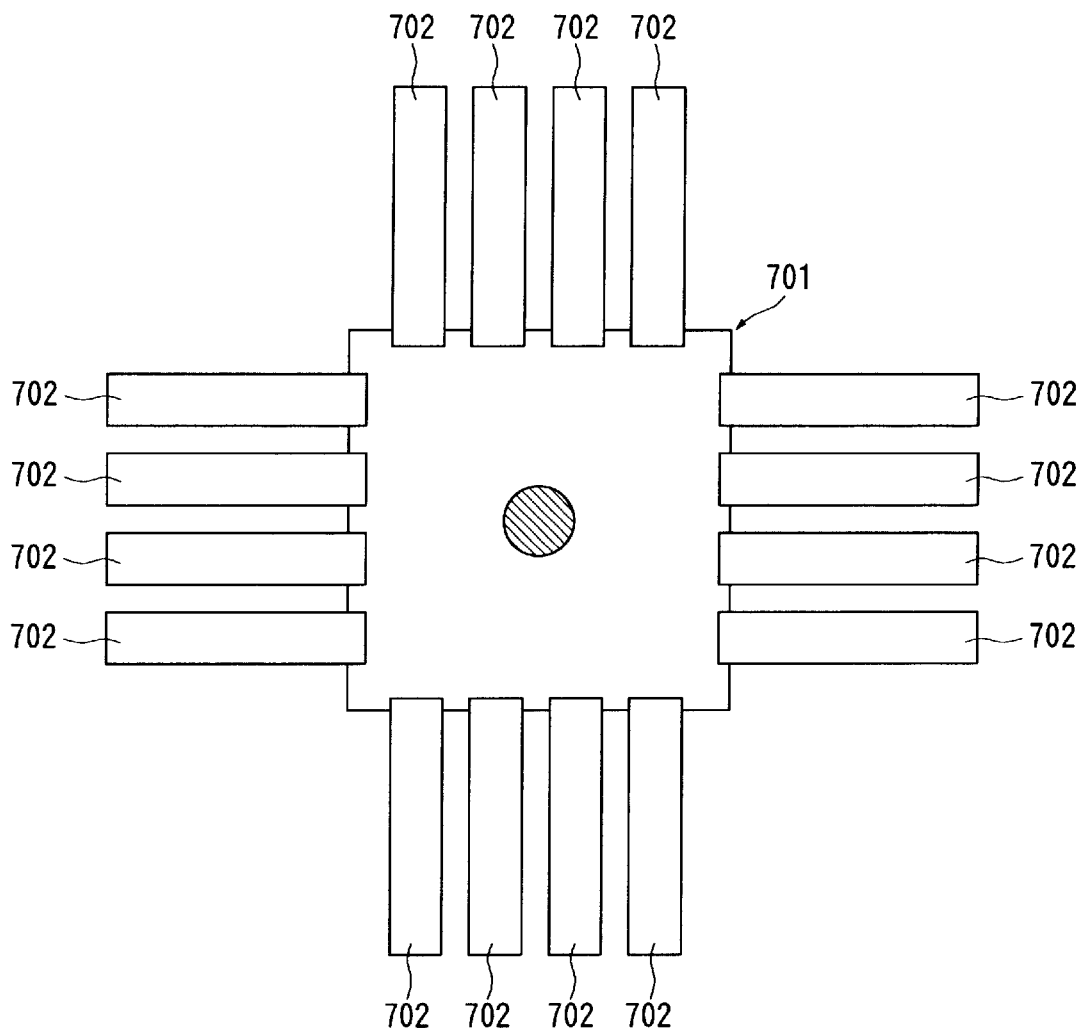
FIG. 40 is a plan view showing modifications of the head according to the first to third embodiments.

In the foregoing embodiments and modifications described with reference to FIGS. 1 to 39, apparatuses, in which a plurality of magazines are radially mounted on a circular rotating head as viewed from above, have been shown, but a plurality of magazines 702 may be mounted side by side on each side of a rectangular rotating head 701 as viewed from above as shown in FIG. 40. For the structure of the magazine and the mounting structure of the magazine, those shown in the foregoing embodiments and modifications are appropriately adopted.

Furthermore, in the embodiments and modifications described with reference to FIGS. 1 to 39, for the alignment when the magazine is extracted from the rack using the magazine mounting mechanism or when the magazine is returned to the rack for holding, or the alignment when the magazine is mounted to the head or when the magazine is removed from the head, or the alignment when the electronic component is discharged from the magazine mounted to the head to load it on the substrate, or another alignment, a known optical detecting apparatus, for example, an image processing apparatus using an optical switch or a camera, or the like can be appropriately used.

Figure 41:
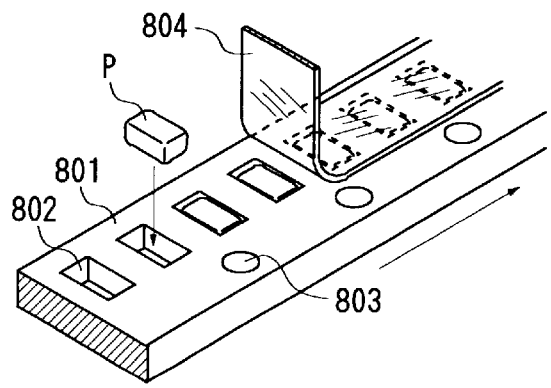
FIG. 41 is a perspective view for component packaging tape showing another example of a target object on which electronic components are arranged.

Moreover, in the embodiments and modifications described with reference to FIGS. 1 to 39, there have been shown apparatuses in which the electronic component pushed out from the discharge port in the magazine is loaded on the substrate, and an apparatus according to the present invention can be also utilized as an apparatus in which electronic components P are successively inserted into housing concave portions 802 in such component packaging tape 801 as shown in FIG. 41. By the way, this component packaging tape 801 is formed using resin, paper and the like as the material, and has housing concave portions 802 for electronic components at equal intervals along the length. In one side edge or both side edges of the component packaging tape 801, guide holes 803 capable of engaging with guide pins of sprocket (not shown) are formed at equal intervals along the length. Reference numeral 803 in FIG. 41 designates cover tape which covers the component packaging tape 801 after the components are inserted, and this cover tape 803 is fixed on the surface of the component packaging tape 801 using a technique such as heat welding.

When inserting the components into the component package tape 801 in the foregoing apparatuses, the component packaging tape 801 is intermittently moved by a motor-driven sprocket, while in a state in which one of the magazines mounted to the head has been moved onto the component packaging tape, the suction nozzle is inserted into the insertion opening in the magazine to push out the electronic components from the discharge port at every timing at which the component packaging tape, which intermittently moves, stops, the suction of the electronic component using the suction nozzle is released after the completion of the insertion, and the suction nozzle can be raised and returned to the initial position.

As in the case of loading the electronic components on the substrate, it does not take much time to insert one electronic component P into the component packaging tape 801, and therefore, a period of time required to insert the electronic component P in the housing concave portion 802 on the component packaging tape 801 can be greatly shortened, thus making it possible to improve the productivity by speeding up the operation. Also, since a plurality of magazines are mounted to the head and these magazines can be replaced as required, a desired electronic component P can be inserted into the housing concave portion 802 on the component packaging tape 801. Especially, if the apparatus according to the third embodiment is used, an operation of continuously inserting the same type of electronic components will be able to be continuously performed without performing both magazine selections and replacement. Of course, even with the apparatus according to the first or second embodiment, if the same type of electronic components are housed in all the magazines mounted to the head in advance, these magazines are successively used to insert the components and the magazine, in which the housed components are exhausted, is replaced with another magazine held by the rack in order, the foregoing components will be able to be continuously inserted.

Moreover, in the embodiments and modifications described with reference to FIGS. 1 to 39, apparatuses, in which the electronic component is pushed out from the discharge port in the magazine by the suction nozzle, have been shown, and the components can be discharged as in the foregoing case even if a very small electromagnet provided at the lower end of the pressing rod is used in place of the suction nozzle. Also, when the clearance between the discharge port in the magazine and the substrate is small, or when the clearance between the discharge port in the magazine and the housing concave portion on the component packaging tape is small, the same component loading and component insertion can be performed even if the suction nozzle is replaced with a simple pressing rod.

The preferred embodiments described in the present specification are shown for illustrative purposes and are not intended to limit the present invention. The scope of the invention is described in the appended claims, and all modifications which conform to those claims are contained in the present invention.

What is claimed is:

1. An electronic component placing apparatus, comprising:

plural magazines each having a housing passage for housing a plurality of electronic components in a lined-up state so as to be able to move by their own weight, a discharge port for discharging a lead electronic component within the housing passage, and an insertion opening into which a discharging tool for discharging the lead electronic component is inserted;

a rotatable head for simultaneously carrying a plurality of the magazines, the head being arranged so the magazines carried thereby are detachably mounted thereon;

a first actuator for rotating the head;

plural discharging tools for insertion into each of the insertion openings of the magazines mounted on the head; and plural second actuators for moving each of the discharging tools;

the discharging tools being selectively insertable into the insertion openings of the magazines mounted on the head to thereby push out at least one electronic component from the discharge ports of the magazines and placing at least one electronic component on an object.

2. The apparatus according to claim 1, wherein:

the discharging tool and the second actuator for moving the discharging tool are provided for each of the magazines.

3. The apparatus according to claim 1, wherein:

the discharging tool is a suction nozzle capable of sucking the electronic component.

4. The apparatus according to claim 3, further comprising:

an actuator for rotating the suction nozzle in order to change the orientation of the electronic component sucked by the suction nozzle.

5. The apparatus according to claim 1, wherein:

the head has a circular shape, and the magazines are radially mounted on the head having the circular shape.

6. The apparatus according to claim 1, wherein:

the head has a rectangular shape, and the magazines are mounted side by side on each side of the head having the circular shape.

7. The apparatus according to claim 1, further comprising:

a rack for detachably holding the magazines; and a magazine mounting mechanism for mounting the magazine from the rack to the head and returning the magazine from the head to the rack.

8. The apparatus according to claim 7, wherein:

the rack includes a plurality of storage units for replenishing electronic components to the housing passage for each of the magazines held by the rack;

each of the storage units including a storage chamber for storing a multiplicity of electronic components in a bulk state, and a chute tube for taking in electronic components within the storage chamber in a predetermined orientation and for causing the components to move toward the insertion opening by their own weight; and the top end of the housing passage being connected to the lower end of the chute tube in a state in which the magazine is held by the rack.

9. The apparatus according to claim 8, further comprising:

a movable member for agitating electronic components within the storage chamber; and an actuator for moving the movable member.

10. The apparatus according to claim 1, wherein:

the magazine is integrally provided with a storage chamber for storing a multiplicity of electronic components in a bulk state, and the housing passage is conductively connected to the bottom of the storage chamber.

11. The apparatus according to claim 10, further comprising:

a movable member for agitating electronic components within the storage chamber, and;

an actuator for moving the movable member.

12. The apparatus according to claim 1, wherein:

the object, on which the electronic components are placed, is a substrate on which the electronic components are loaded, and further including conveying rails for carrying the substrate to an operating position where the components are loaded, and a table for supporting the substrate at the operating position, the table being arranged for two-dimensional movement at the operating position.

13. The apparatus according to claim 1, wherein:

the object, on which the electronic components are placed, is component packaging tape, and the component packaging tape includes housing concave portions for inserting the electronic components; and further including a motor-driven sprocket for moving the component packaging tape to an operating position where the component is inserted.

* * * * *